United States Patent
Endo et al.

(10) Patent No.: US 9,634,407 B2
(45) Date of Patent: Apr. 25, 2017

(54) TERMINAL MODULE

(71) Applicant: DAI-ICHI SEIKO CO., LTD., Kyoto (JP)

(72) Inventors: Takayoshi Endo, Shizuoka (JP); Sakai Yagi, Shizuoka (JP); Katsunori Kakese, Tokyo (JP); Takuya Takeda, Shizuoka (JP); Hiroyuki Kurita, Shizuoka (JP)

(73) Assignee: DAI-ICHI SEIKO CO., LTD. (JP)

( * ) Notice: Subject to any disclaimer, the term of this patent is extended or adjusted under 35 U.S.C. 154(b) by 0 days.

(21) Appl. No.: 14/955,780

(22) Filed: Dec. 1, 2015

(65) Prior Publication Data
US 2016/0164202 A1 Jun. 9, 2016

(30) Foreign Application Priority Data
Dec. 5, 2014 (JP) .................................. 2014-247175

(51) Int. Cl.
*H01R 12/91* (2011.01)
*H01R 12/58* (2011.01)
(Continued)

(52) U.S. Cl.
CPC ....... *H01R 12/585* (2013.01); *H01R 12/7082* (2013.01); *H01R 12/52* (2013.01); *H05K 3/308* (2013.01)

(58) Field of Classification Search
CPC ....... H01R 12/523; H01R 12/91; H01R 12/52
(Continued)

(56) References Cited

U.S. PATENT DOCUMENTS 3,864,000 A * 2/1975 Coller .................. H01R 12/716
              439/246
4,446,505 A * 5/1984 Long .................... H01R 12/585
              361/784
(Continued)

FOREIGN PATENT DOCUMENTS

CN 103311708 9/2013 ............. H01R 12/58
JP H0645721 2/1994 ............. H01L 25/07
(Continued)

OTHER PUBLICATIONS

Japanese Official Action issued in counterpart Japanese Patent Application Serial No. 2014-247175, issued Jul. 23, 2015 and English Translation (8 pages).
(Continued)

*Primary Examiner* — Gary Paumen
(74) *Attorney, Agent, or Firm* — Hayes Soloway.com

(57) ABSTRACT

A terminal module is used for electrically connecting an electric element mounted on a first board to a second board opposing to the first board. A through-hole is opened in the second board. The terminal module includes: an electrically conductive terminal including at each of opposite ends thereof; a connection part through which the terminal module is electrically connected to the electric element; and a contact part to be inserted into the through-hole; and an electrically insulative base holding a part of the electrically conductive terminal to keep the electrically conductive terminal in a constant posture. The terminal module is mounted onto the first board keeping fixed thereto.

8 Claims, 67 Drawing Sheets

(51) Int. Cl.
*H01R 12/70* (2011.01)
*H01R 12/52* (2011.01)
*H05K 3/30* (2006.01)

(58) Field of Classification Search
USPC .................................................. 439/75, 246
See application file for complete search history.

(56) References Cited

U.S. PATENT DOCUMENTS

| | | | | |
|---|---|---|---|---|
| 5,106,310 | A * | 4/1992 | Krajewski | H05K 3/368 |
| | | | | 439/75 |
| 5,565,654 | A * | 10/1996 | Zell | H01R 12/523 |
| | | | | 174/262 |
| 6,305,949 | B1 | 10/2001 | Okuyama | H01R 12/585 |
| | | | | 439/75 |
| 6,428,329 | B2 * | 8/2002 | Orui | H01R 43/205 |
| | | | | 439/65 |
| 6,997,727 | B1 * | 2/2006 | Legrady | H01R 12/57 |
| | | | | 439/246 |
| 7,575,443 | B2 * | 8/2009 | Decker | H05K 1/144 |
| | | | | 439/75 |
| 7,704,088 | B2 * | 4/2010 | Sakamoto | H01R 12/57 |
| | | | | 439/246 |
| 8,545,237 | B2 * | 10/2013 | Johnson | H01R 12/523 |
| | | | | 439/75 |
| 2003/0092296 | A1 * | 5/2003 | Oldenburg | H01R 12/52 |
| | | | | 439/75 |
| 2003/0168432 | A1 | 9/2003 | Onizuka et al. | 218/7 |
| 2013/0244512 | A1 | 9/2013 | Endo et al. | 439/889 |
| 2014/0357135 | A1 | 12/2014 | Endo et al. | 439/743 |

FOREIGN PATENT DOCUMENTS

| | | | |
|---|---|---|---|
| JP | 2003-218563 | 7/2003 | |
| JP | 2012-170179 | 9/2012 | |
| JP | 2013-65543 | 4/2013 | |
| JP | 2013211499 | 10/2013 | H01L 23/04 |
| WO | WO 0108267 | 2/2001 | H01R 12/58 |

OTHER PUBLICATIONS

Korean Office Action issued in application No. 10-2015-0170467, dated Jan. 17, 2017 (7 pgs).

* cited by examiner

TERMINAL MODULE

BACKGROUND OF THE INVENTION

Field of the Invention

The present invention relates to a terminal module for electrically connecting electric elements mounted on a heat radiation board to an electrical circuit board in a power module to be equipped in an automobile, such as an engine control unit (ECU) and a power control unit (PCU).

Description of the Related Art

FIG. 68 is a perspective broken view of a conventional part unit.

As illustrated in FIG. 68, a power module to be equipped in an automobile, such as an ECU and a PCU, is generally designed to include a part unit 900 including a heat radiation board 902 on which a plurality of electric elements 901 is mounted, a frame 904 on which a plurality of electrically conductive terminal 903 is mounted in a comb-like manner, and a circuit board 906 formed with a plurality of through-holes 905 and having electrical circuits (not illustrated) thereon. In the part unit 900, the electrically conductive terminals 903 electrically connecting the electric elements 901 mounted on the heat radiation board 901 to the through-holes 905 formed at the circuit board 906 are compressively inserted into the frame 904 sandwiched between the heat radiation board 902 and the circuit board 906, or assembled into the frame 904 by insertion process while the frame 904 is being made. Thus, the electrically conductive terminals 903 are integral with the frame 904.

Japanese Patent Application Laid-open on No. 2013-211499 discloses a power module, a terminal to be used in the power module, and a method of fabricating the power module.

The part unit 900 illustrated in FIG. 68 is accompanied with a problem in that if the frame 904 is designed to be large in size, the frame 904 would be likely to be curved and/or deformed with the result of deterioration in accuracy of flatness thereof, causing a defect in bonding between the electrically conductive terminals 903 mounted on the frame 904 and the electric elements 901 mounted on the heat radiation board 902. Furthermore, shrinkage of a synthetic resin of which the frame 904 is made causes deterioration in accuracy in positioning of the electrically conductive terminals 903.

When the frame 904 with which the electrically conductive terminals 903 are integrally assembled is fabricated by an insertion molding process, a mold used for an insertion molding process is usually amended by a plurality of times in order to enhance a pitch and/or accuracy of flatness in the electrically conductive terminals 903. However, since the electrically conductive terminals 903 are individually mounted on the frame 904, it is quite difficult or almost impossible to amend a mold, resulting in that the mold might not be amended in a desired manner.

It is known that the frame 904 made of a resin thermally shrank in a small degree or a resin providing preferable performance as a filler is able to enhance a pitch and/or accuracy of flatness in the electrically conductive terminals 903. However, such a resin brings cost-up in the fabrication of the frame 904, and accordingly, it is not actually allowed to use such a resin for fabrication of the frame 904.

The process of fabricating a power module disclosed in the above-identified Japanese Patent Application is considered to be accompanied with the problems as mentioned above.

SUMMARY OF THE INVENTION

In view of the above-mentioned problems in the conventional terminal modules, an object of the present invention is to provide a terminal module capable of preventing deterioration in accuracy of a position of the electrically conductive terminals relative to the heat radiation board, caused by curvature, deformation and/or shrinkage of the frame, further preventing a defect in bonding between the electrically conductive terminals and the electric elements mounted on the heat radiation board, and having preferable usability.

A first aspect of the present invention provides a terminal module for electrically connecting an electric element mounted on a first board to a second board opposing to the first board, a through-hole being opened in the second board, the terminal module, comprising: an electrically conductive terminal including at each of opposite ends thereof: a connection part through which the terminal module is electrically connected to the electric element; and a contact part to be inserted into the through-hole; and an electrically insulative base holding a part of the electrically conductive terminal to keep the electrically conductive terminal in a constant posture, wherein the terminal module is mounted onto the first board keeping fixed thereto.

In the terminal module according to the present invention, the electrically conductive terminal being held by the electrically insulative base is mounted directly on the first board or indirectly on the first board. For instance, in the latter case, the electrically conductive terminal is mounted on the first board through a frame integral with the electrically conductive base. Thus, accuracy in a position of the electrically conductive terminal relative to the first board, caused by curvature, deformation and/or shrinkage of the frame, can be avoided from being deteriorated. Furthermore, the enhancement in the above-mentioned accuracy prevents a defect in bonding between the electrically conductive terminal and the electric element mounted on the first board. In addition, it is possible to fabricate terminal modules including the electrically conductive terminals by different numbers from each other, without amending a mold used in an injection molding process. That is, a mold is applicable to terminal modules having different specifications from each other, ensuring that the terminal module according to the present invention has superior usability.

A second aspect of the present invention provides, in addition to the first aspect, wherein the terminal module is mounted directly onto the first board.

A third aspect of the present invention provides, in addition to the first aspect, further comprising a frame formed integrally with the first board, wherein the terminal module is mounted onto the first board via the frame.

A fourth aspect of the present invention provides, in addition to the first aspect, wherein at least a part of the contact part is constituted of a press-fit terminal elastically expanding/contracting in a radial direction of the through-hole.

A fifth aspect of the present invention provides, in addition to the first aspect, wherein the press-fit terminal is further constituted of a plurality of contact pieces being elastically expanding/contracting in a radial direction of the through-hole.

A sixth aspect of the present invention provides, in addition to the first aspect, wherein: the contact part includes: a first piece bending such that the first piece outwardly protrudes in a first direction; and a second piece bending such that the second piece outwardly protrudes in a second direction opposite to the first direction; and the first and second pieces are elastic and connected at opposite ends thereof to each other.

A seventh aspect of the present invention provides, in addition to the first aspect, wherein: the electrically conductive terminal further includes a flexible part located adjacent to the contact part; and the flexible part is more elastically deformable than other portions of the electrically conductive terminal.

An eighth aspect of the present invention provides, in addition to the first aspect, wherein: the flexible part includes: a first flexible piece extending in a length-wise direction of the electrically conductive terminal; and a second flexible piece spaced away from the first flexible piece through a through-hole; the second flexible piece extends in parallel with the first flexible piece; and the first and second flexible pieces are equal in length to each other.

A ninth aspect of the present invention provides, in addition to the first aspect, wherein the electrically conductive terminal is fixed onto the base.

The advantages obtained by the aforementioned present invention will now be described hereinbelow.

The terminal module according to the present invention is able to prevent accuracy in a position of the electrically conductive terminal relative to the first board, caused by curvature, deformation and/or shrinkage of the frame, from being deteriorated. Furthermore, the enhancement in the above-mentioned accuracy prevents a defect in bonding between the electrically conductive terminal and the electric element mounted on the first board. In addition, it is possible to fabricate terminal modules including the electrically conductive terminals by different numbers from each other, without amending a mold used in an injection molding process. That is, a mold is applicable to terminal modules having different specifications from each other, ensuring that the terminal module in accordance with the present invention has superior usability.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

A terminal module 100 according to the first embodiment of the present invention is explained hereinbelow with reference to FIGS. 1 to 15. In the specification, a direction indicated with an arrow Q illustrated in FIG. 1 indicates an up-down direction, a direction indicated with an arrow R illustrated in FIG. 1 indicates a front-rear direction, and a direction indicated with an arrow S illustrated in FIG. 1 indicates a left-right direction.

Figure 1:
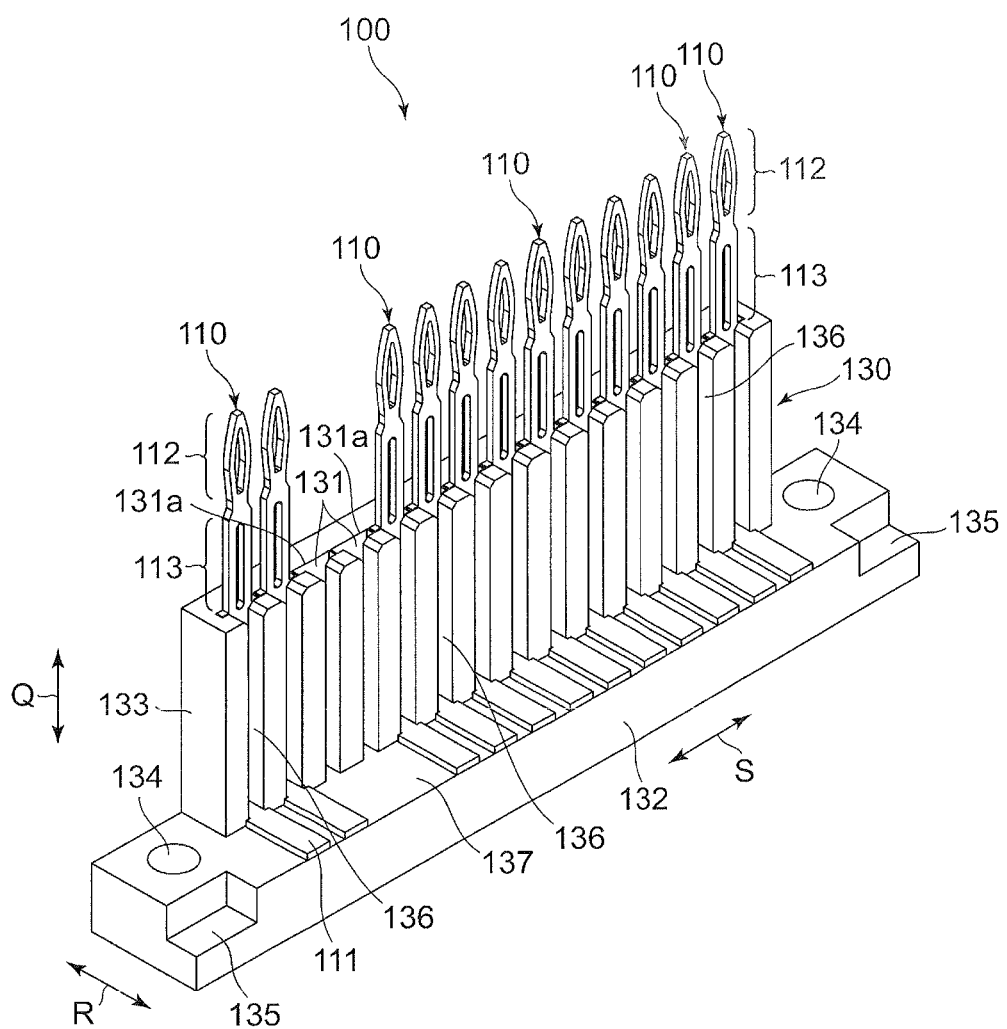
FIG. 1 is a perspective view of the terminal module according to the first embodiment of the present invention, viewed from a front and a left-side thereof.
Figure 6:
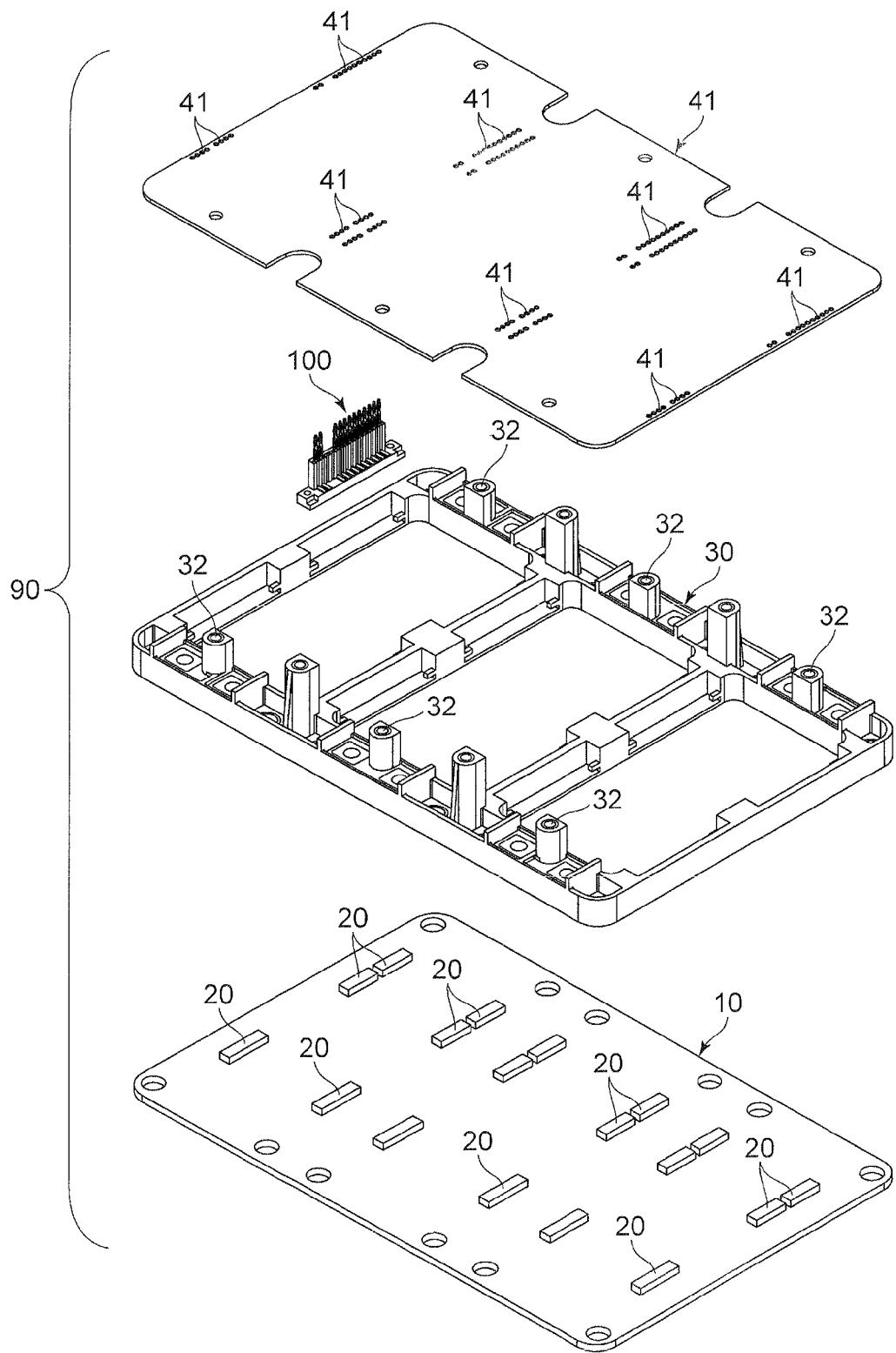
FIG. 6 is a perspective view of a circuit board, the terminal module, a frame, and a heat radiation board.

As illustrated in FIG. 6, the terminal module 100 is mounted onto a heat radiation board 10 through a frame 30 for electrically connecting a plurality of electric elements 20 fixed on the heat radiation board 10, to a circuit board 40 situated in facing relation with the heat radiation board 10 and formed with a plurality of through-holes 41. As illustrated in FIG. 1, the terminal module 100 includes at least one electrically conductive terminal 110 and electrically insulative base 130. The electrically conductive terminal 110 includes, at opposite ends thereof, a connection part 111 through which the terminal module 100 is electrically connected to the electric element 20, and a contact part 112 to be inserted into the through-hole 41 of the circuit board 40. The base 130 holds a part of the electrically conductive terminal 110 to keep the electrically conductive terminal 110 in a constant posture.

Figure 2:
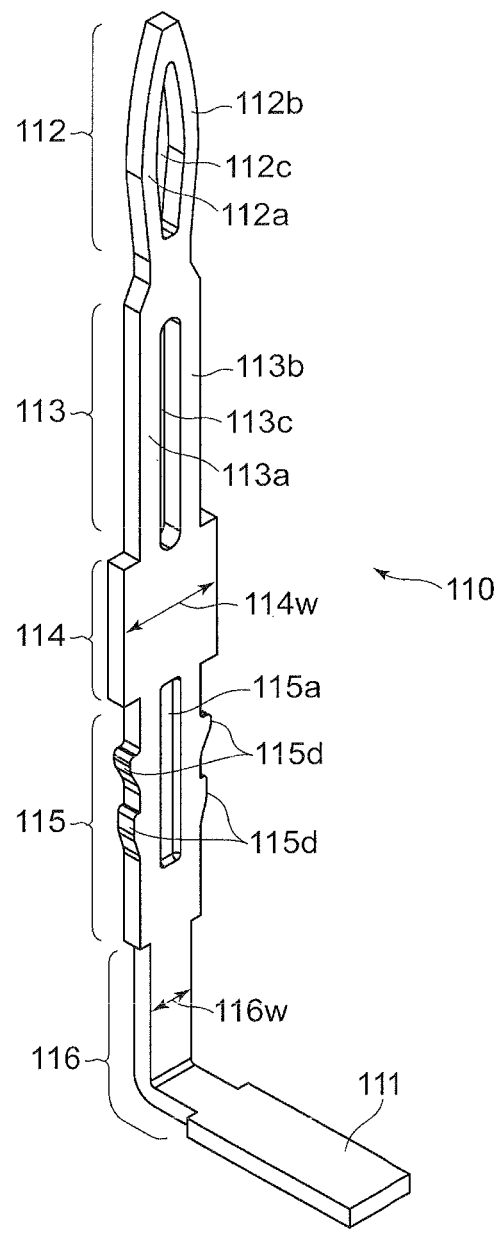
FIG. 2 is a perspective view of the electrically conductive terminal as a part of the terminal module illustrated in FIG. 1.

As illustrated in FIG. 2, the electrically conductive terminal 110 can be fabricated of an electrically conductive and elastic metal sheet through pressing and bending processes. The electrically conductive terminal 110 is shaped substantially in an L-shape at its entirety. The electrically conductive terminal 110 has the contact part 112 at an upper end of a vertical portion of the L-shape, and the connection part 111 at a distal end of a horizontal portion of the L-shape. The electrically conductive terminal 110 includes a flexible part 113, a holding part 114, an engagement part 115, and an elbow part 116 in this order from the contact part 112 to the connection part 111. The elbow portion 116 located between the engagement portion 115 and the connection part 111 is designed to have a width 116w smaller than the same of the rest of the electrically conductive terminal 110.

The contact part 112 is bell-shaped at an outer periphery thereof. The contact part 112 includes a first piece 112a bending such that the first piece 112a outwardly protrudes, and a second piece 112b bending such that the second piece 112b outwardly protrudes in a direction opposite to a direction in which the first piece 112s protrudes. The first and second pieces 112a and 112b are connected at opposite ends thereof to each other. The first and second pieces 112a and 112b are designed to be elastic. For instance, the contact part 112 can be formed by punching a bell-shaped metal sheet to thereby form a bell-shaped through-hole 112c at a center of the metal sheet. The first and second pieces 112a and 112b is elastically deformable in directions in which the first and second pieces 112a and 112b come close to each other and go away from each other. Thus, the contact part 112 defines a press-fit terminal elastically expandable and shrinkable in a radial direction of the through-hole 41 formed through the circuit board 40.

The flexible part 113 located adjacent to the contact part 11s includes a first flexible piece 113a extending in a length-wise direction of the electrically conductive terminal 110, and a second flexible piece 113b spaced away from the first flexible piece 113a through a through-hole 113c, and extending in parallel with the first flexible piece 113a. The first and second flexible pieces 113a and 113b are equal in length to each other. For instance, the flexible part 113 can be fabricated by punching an elongate through-hole 113c centrally into a rectangular metal sheet portion. The first and second flexible pieces 113b are designed to be elastically more deformable than the rest of the electrically conductive terminal 110, and accordingly, the flexible part 113 defines a later-mentioned floating system. The holding part 114 and the engagement part 115 are designed to have a width and a thickness insert-able into a later-mentioned path 131 of the base 130.

Figure 3:
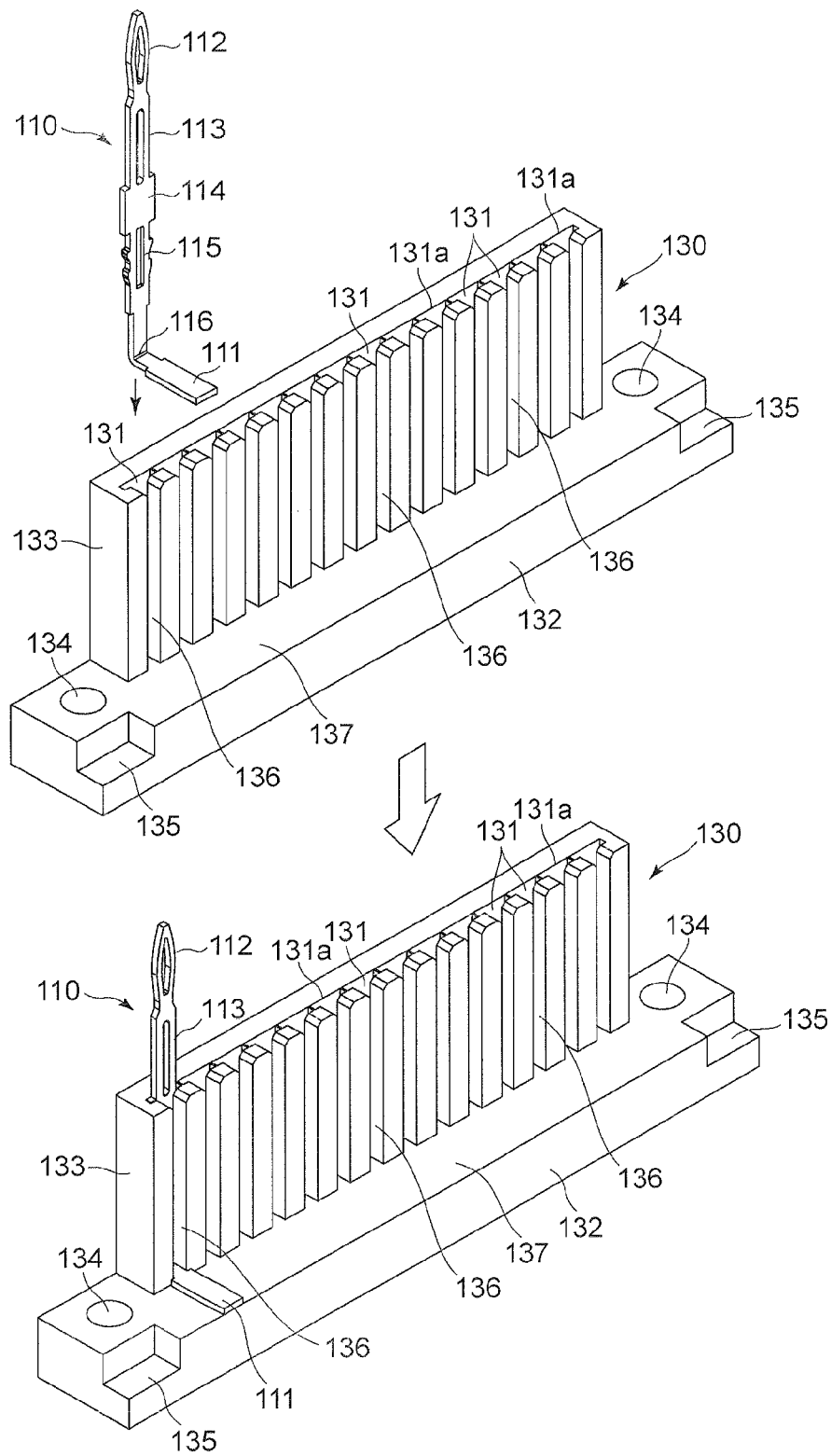
FIG. 3 shows steps of assembling the terminal module illustrated in FIG. 1.
Figure 4:
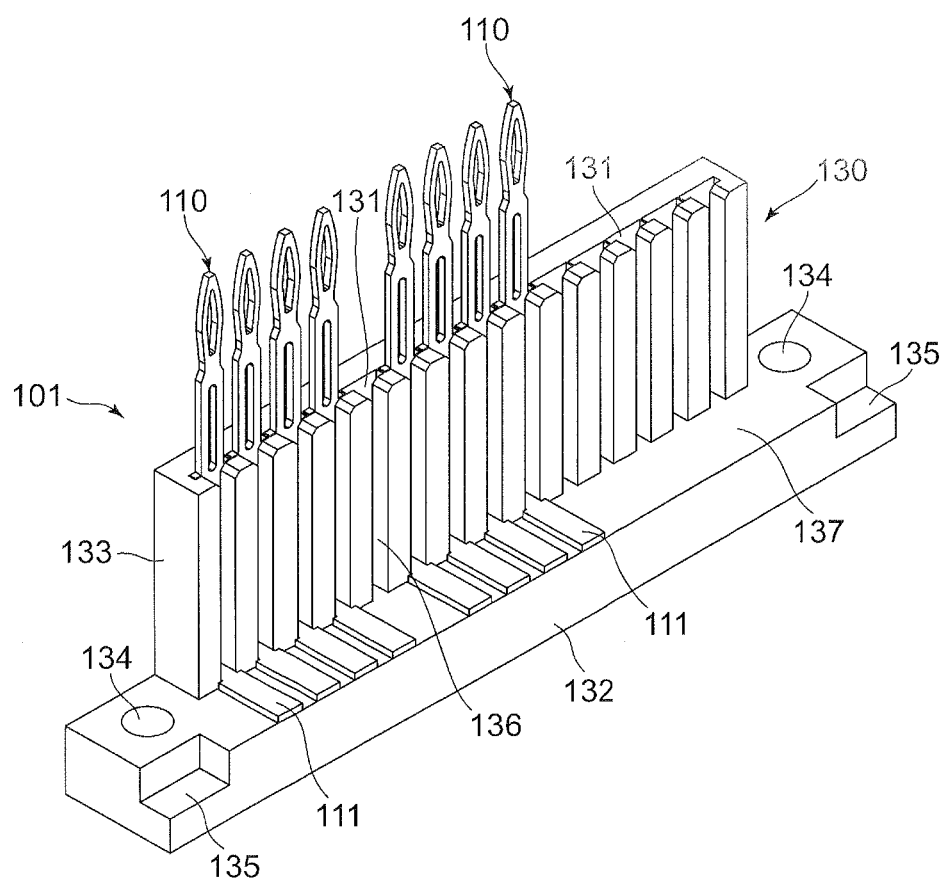
FIG. 4 is a perspective view of a terminal module including electrically conductive modules arranged in a different manner from that of the terminal module illustrated in FIG. 1.
Figure 5:
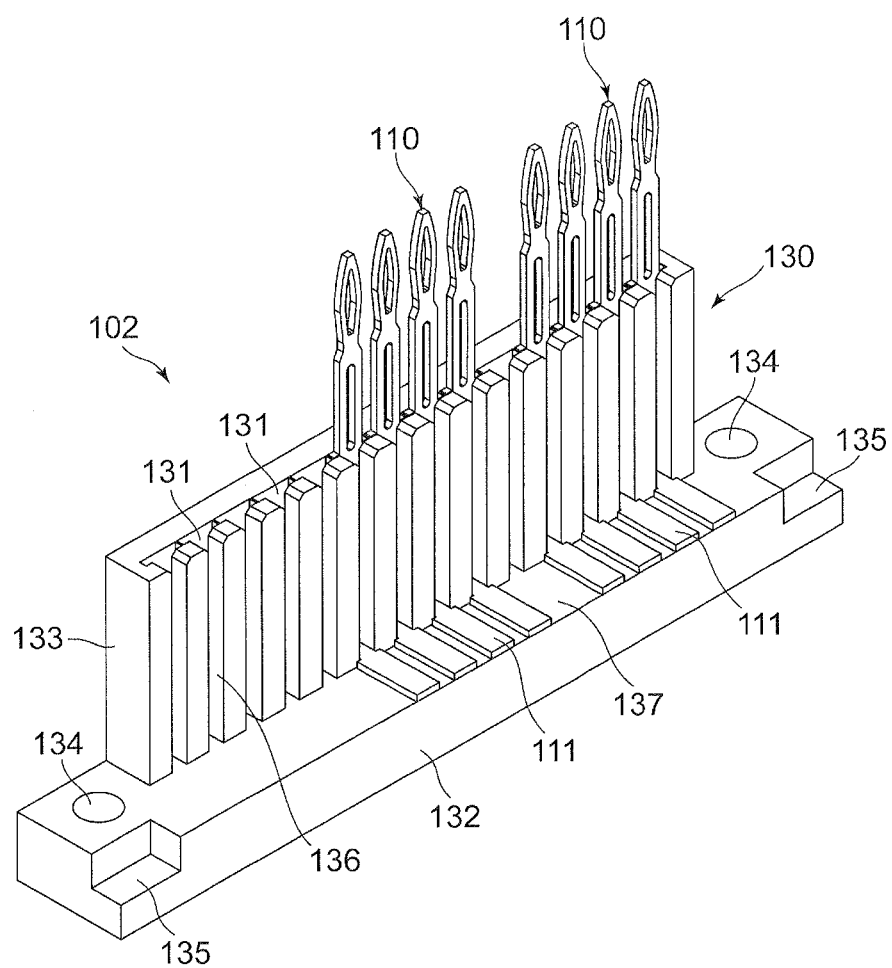
FIG. 5 is a perspective view of a terminal module including electrically conductive modules arranged in a different manner from that of the terminal module illustrated in FIG. 1.

As illustrated in FIGS. 1 and 3, the base 130 includes a basement portion 132 to be fixed integrally to a frame 30 (see FIG. 6) through a secondary molding process, and a holder portion 133 standing on the basement portion 132 at a rear of the basement portion 132. The basement portion 132 has a flat portion 137 in front of the holder portion 133. The connection part 111 of the electrically conductive terminal 110 lies on the flat portion 137. The basement portion 132 is formed at opposite ends thereof in the direction S (see FIG. 1) with the through-holes 134 and cut-outs 135 having a shape like a step.

The holder portion 133 is formed with a plurality of paths 131 into each of which the electrically conductive terminal 110 is inserted in a standing condition, and a plurality of front openings 136 each leading to each of the paths 131. Each of the front openings 136 has a vertical length equal to the same of the path 131. Each of the front openings 136 has a width smaller than a width 144w of the holding part 114 of the electrically conductive terminal 110, and equal to or slightly greater than the width 116w of the elbow part 116.

As illustrated in FIG. 3, the terminal module 110 is completed by inserting the electrically conductive terminals 110 into the paths 131 formed vertically through the holder portion 133 of the base 130. Each of the electrically conductive terminals 110 is inserted into each of the paths 131 through an upper open end 131a of the path 131 towards the basement portion 132 with the connection part 111 being kept to face the basement portion 132 of the base 130. The electrically conductive terminal 110 is inserted into the path 131 with the elbow part 116 passing the front opening 136 until the connection part 111 abuts at a lower surface thereof with the basement portion 132.

When the electrically conductive terminal 110 has been inserted fully into the path 131, the contact part 112 and the flexible part 113 upwardly protrude through the upper open end 131a of the path 131, and the connection part 111 contacts at a lower surface thereof with the flat portion 137.

As illustrated in FIG. 3, after the electrically conductive terminal 110 has been inserted fully into the path 131 of the base 130, the holding part 114 having a flat shape is fit in the path 131 without gaps therebetween to thereby carry out a function of keeping the electrically conductive terminal 110 in a constant posture such that the electrically conductive terminal 110 is held stable.

The engagement part 115 is formed centrally with a vertically elongate recess 115a, and further formed at right and left sides thereof with a plurality of protrusions 115d protruding in a width-wise direction of the engagement part 115.

Though not illustrated, the engagement part 115 is formed at a rear thereof with a projection (see a projection 115b in FIG. 47) analogous to the recess 115a.

After the electrically conductive terminal 110 has been inserted fully into the path 131 of the base 130, the protrusions 115d of the engagement part 115 make compressive engagement with an inner surface of the path 131 to thereby prevent the electrically conductive terminal 110 from slipping out of the path 131.

A number and a position of the electrically conductive terminals 110 to be inserted into the paths 131 can be determined in dependence on a structure and/or arrangement of the electric elements 20 (see FIG. 6). Accordingly, there may be fabricated a terminal module 101 illustrated in FIG. 4 or a terminal module 102 illustrated in FIG. 5, apart from the terminal module 100 illustrated in FIG. 1, by changing a number of the electrically conductive terminals 110 and/or a position at which each of the electrically conductive terminals 110 is inserted into the holder portion 133, in dependence on a design specification of a terminal module. That is, it is possible to fabricate a plurality of terminal modules having the electrically conductive terminals 110 in different arrangements, through a single die assembly, by arranging the electrically conductive terminals 110 in various manners like the terminal modules 100, 101 and 102.

The part unit 90 including the terminal module 100, 101 or 102 is explained hereinbelow with reference to FIGS. 6 to 15.

As illustrated in FIG. 6, the terminal module 100 is mounted onto the heat radiation board 10 through the frame 30 for electrically connecting a plurality of the electric elements 20 fixed on the heat radiation board 10, to the circuit board 40 situated in facing relation with the heat radiation board 10 and formed with a plurality of the through-holes 41.

Figure 7:
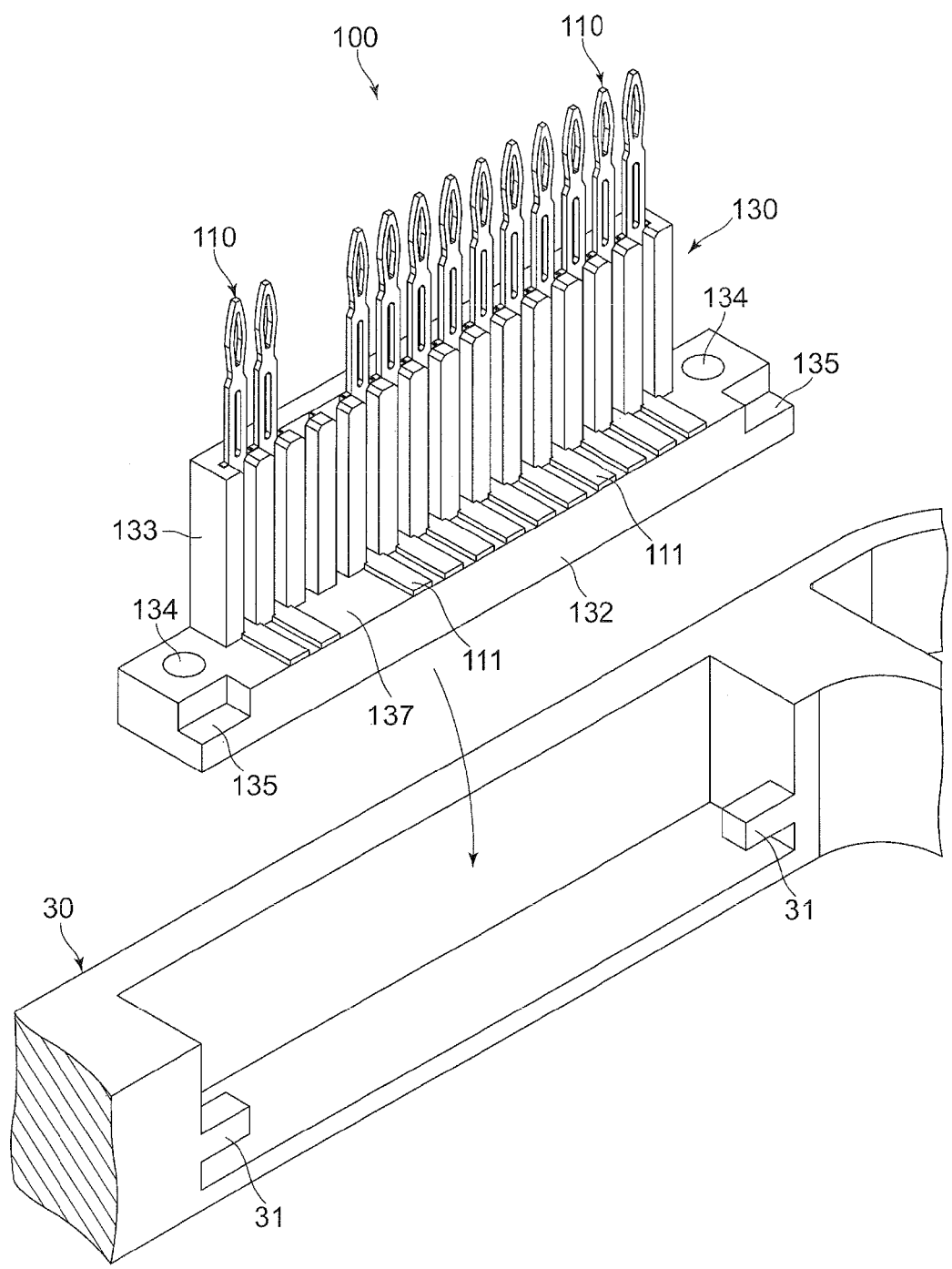
FIG. 7 is a perspective view illustrating the terminal module illustrated in FIG. 1 to be assembled into a partially illustrated frame.

Though the frame 30 and the terminal module 100 are illustrated in FIGS. 6 and 7 as separate parts from each other, the frame 30 is formed integral with a plurality of the terminal modules 100 by setting the terminal modules 100 in a die assembly (not illustrated) used for molding the frame 30, and carrying out secondary molding.

In a process of the secondary molding, as illustrated in FIGS. 6 and 7, the frame 30 is formed such that the frame 30 closely contacts with a rear, left and right sides, and a bottom of the basement portion 132, and surrounds those therewith. Furthermore, in the secondary molding, the through-holes 134 of the basement portion 132 is filled with a synthetic resin of which the frame 30 is made, and a pair of protrusions 31 made of the synthetic resin is formed so as to fill the cut-outs 132 of the basement portion 132 therewith, and accordingly, the terminal module 100 is firmly fixed to the frame 30.

Figure 8:
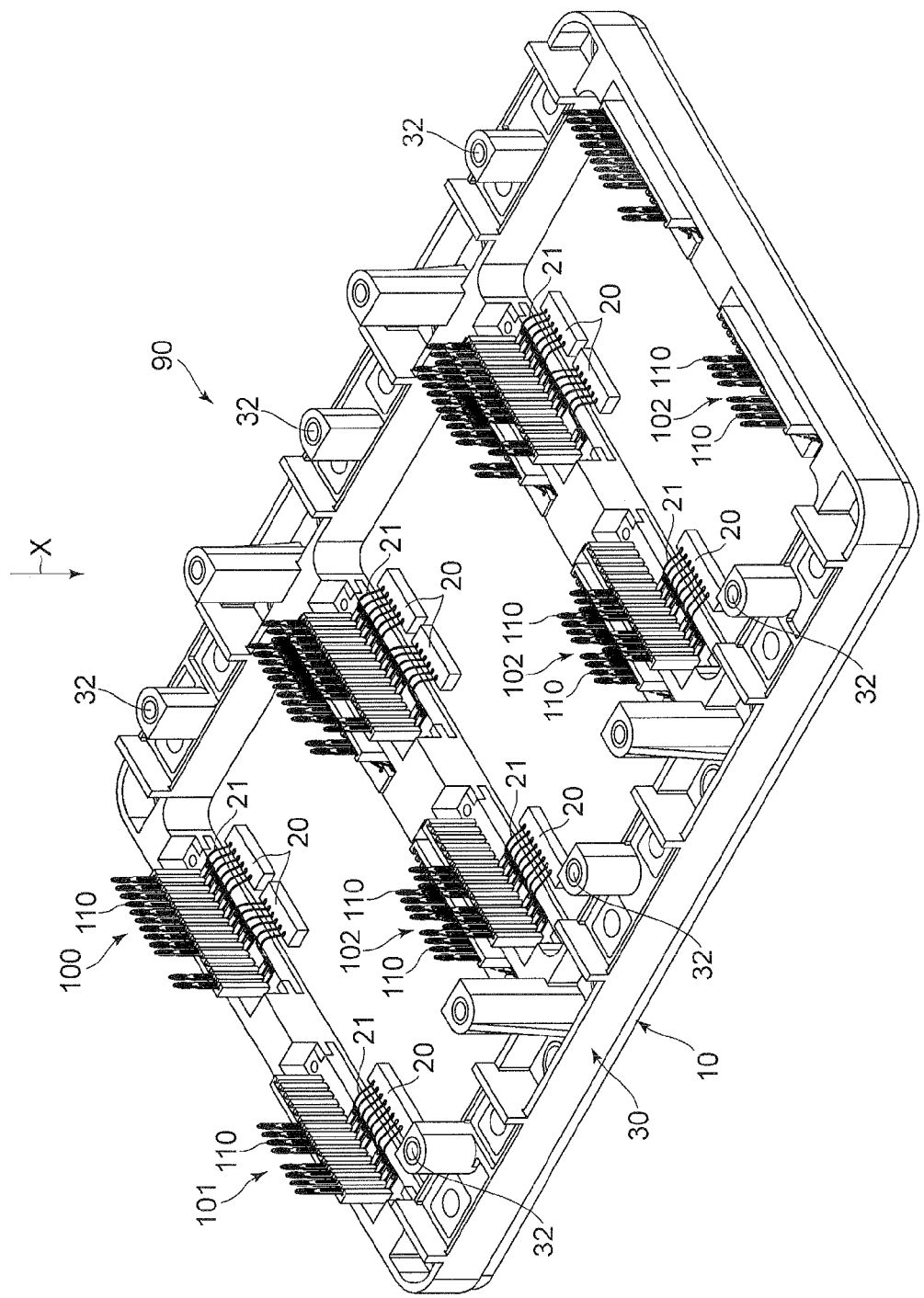
FIG. 8 is a perspective view of a part unit including a heat radiation board into which electric elements, a frame, and the terminal modules are assembled.
Figure 9:
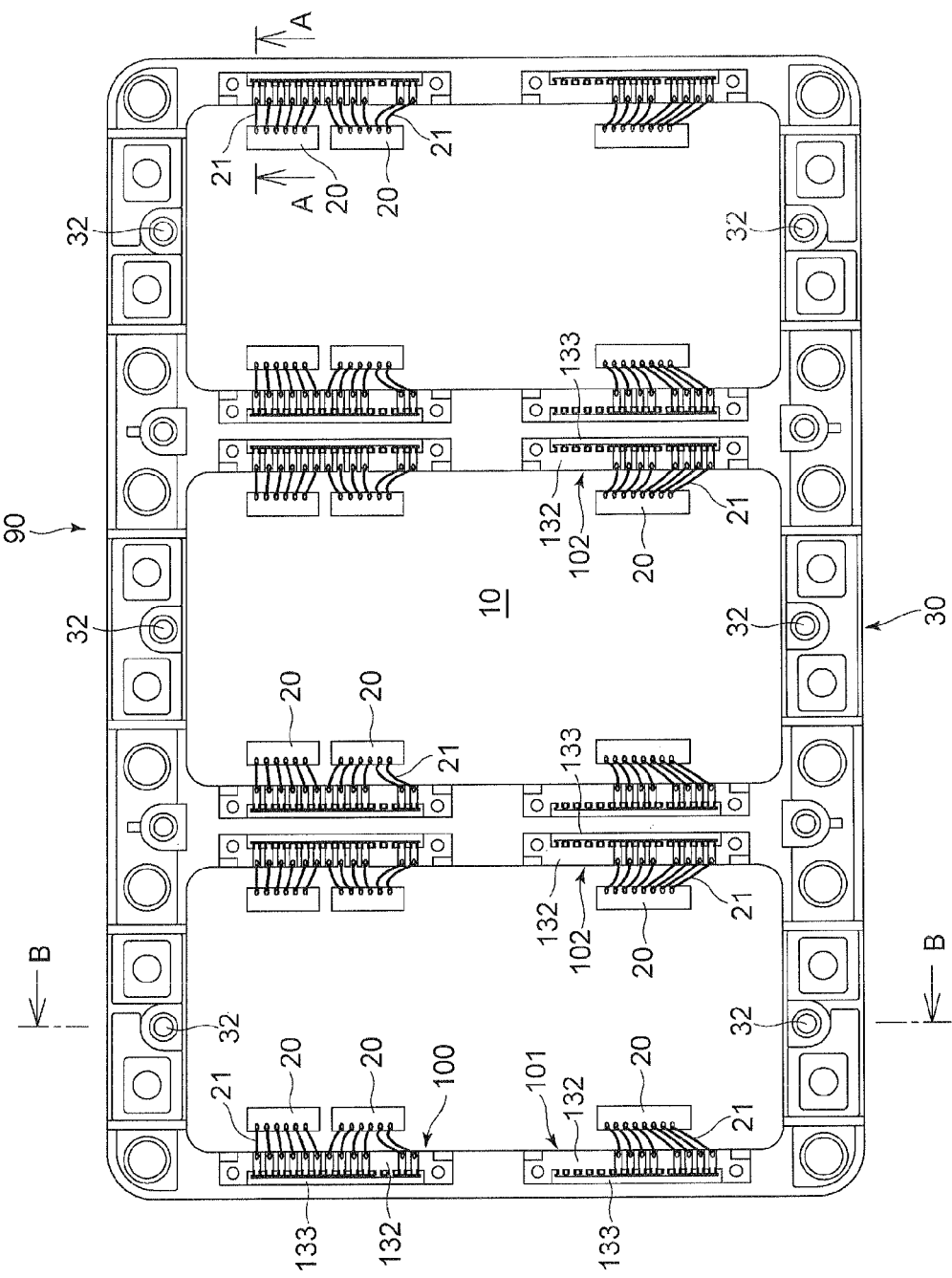
FIG. 9 is a plan view as seen in a direction X indicated in FIG. 8.
Figure 10:
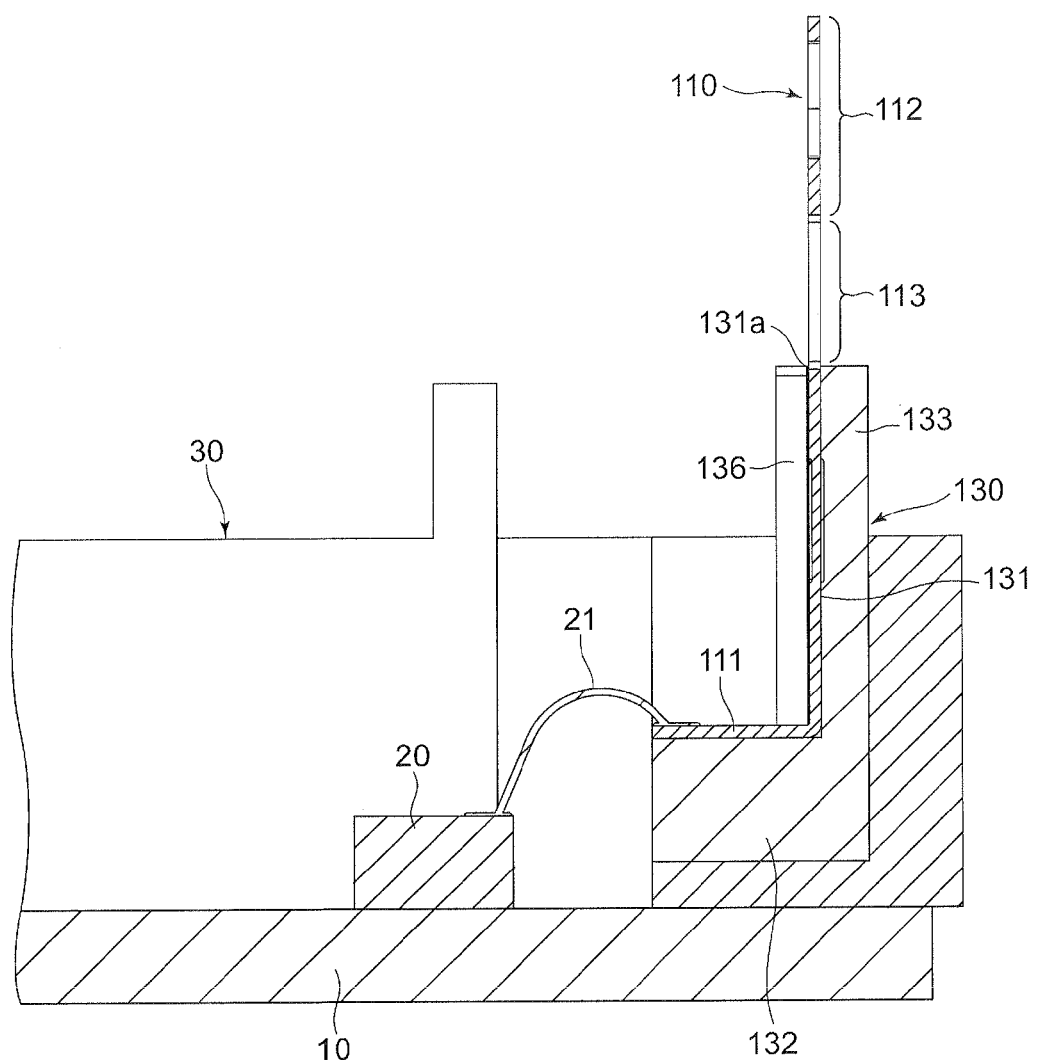
FIG. 10 is a cross-sectional view taken along the line A-A shown in FIG. 9.
Figure 11:
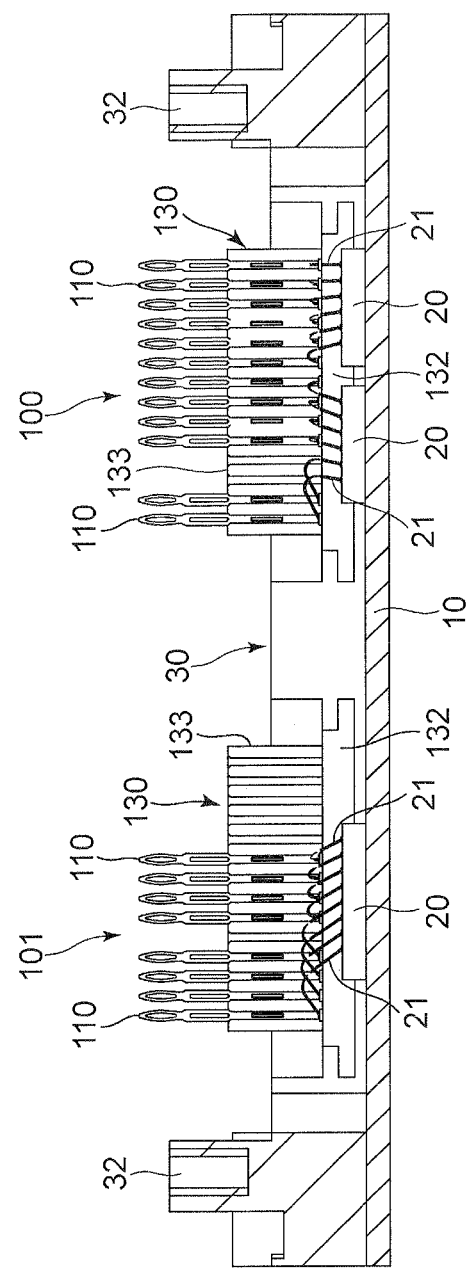
FIG. 11 is a cross-sectional view taken along the line B-B shown in FIG. 9.

After the frame 30 formed integral with a predetermined number of the terminal modules 100, 101 or 102 was fixed by means of an adhesive onto the heat radiation board 10 (see FIG. 6) on which the electric elements 20 are mounted, the connection parts 111 of the electrically conductive terminals 110 in the terminal modules 100, 101 or 102 are electrically connected to the electric elements 20 through bonding wires 21 (see FIG. 10). Thus, there is completed the part unit 90 as illustrated in FIGS. 8 and 9.

As explained above, since the electrically conductive terminals 110 are mounted, with being fixed to the base 130, onto the heat radiation board 10 through the frame 30 formed integral with the base 130 of the terminal module 100, 101 or 102, it is possible to prevent deterioration in positional accuracy of the electrically conductive terminals 110 relative to the heat radiation board 10, caused by curvature, deformation and/or shrinkage of the frame 30. Furthermore, since positional accuracy of the electrically conductive terminals 110 relative to the heat radiation board 10 can be enhanced, defection in bonding between the electrically conductive terminals 110 and the electric elements 20 mounted on the heat radiation board 10 hardly occurs. In addition, the terminal module 100 is applicable to other products having different specifications by remaking only the frame 30, and accordingly, it is possible to make products having various specifications through the use of the common terminal module 100, ensuring cost down.

Hereinbelow is additionally explained the reason why positional accuracy of the electrically conductive terminals 110 relative to the heat radiation board 10 can be enhanced.

Figure 68:
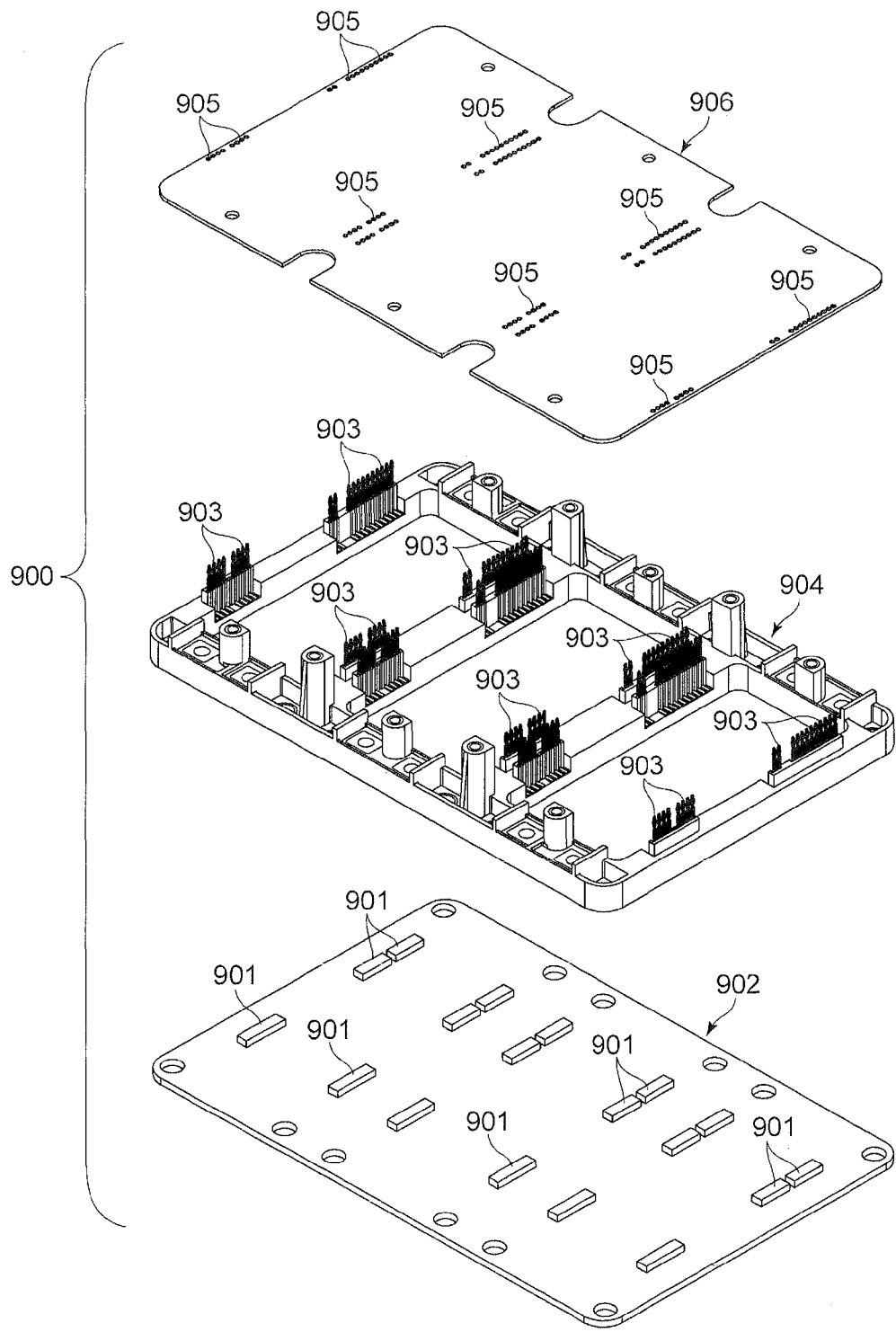
FIG. 68 is a perspective broken view of a conventional part unit.

As mentioned above, in the case that the conventional frame 904 on which a plurality of the electrically conductive terminals 903 is mounted, illustrated in FIG. 68, is fabricated, a die assembly used for insertion is generally amended at a plurality of times in order to enhance a pitch of the electrically conductive terminals 903 and accuracy of flatness. However, since the electrically conductive terminals 903 are mounted onto the frame 904 one by one, it is quite difficult to accurately amend a die assembly, and thus, it is actually impossible to finally amend a die assembly to a desired degree.

In contrast, the frame 30 (see FIG. 8) formed integral with a predetermined number of the terminal modules 100, 101 or 102 has an advantage that an insertion die assembly can be readily amended, because the insertion die assembly is amended through the use of the base 130 having a shape of a block. This advantage brings enhancement in positional accuracy of the electrically conductive terminals 110 and the base 130.

The another advantage of designing the electrically conductive terminals 110 and the base 130 into a module, such as the terminal module 100, 101 or 102, is that it is possible to select a resin of which the base 130 is made, regardless of a resin of which the frame 30 is made, and hence, it is possible to fabricate the base 130 being subject to less thermal shrinkage and have higher accuracy, by selecting a suitable resin. Furthermore, even if the base 130 is to be fabricated by means of a die assembly having a small space, it is possible to fabricate the base 130 having an accurate shape without a portion not being filled with a resin, by selecting a resin providing superior performance as a filler.

In addition, it is possible to fabricate terminal modules including a different number of the electrically conductive terminals 110 from each other, through the use of a common die assembly. If the electrically conductive terminals 110 are designed to be equally spaced away from one another, the die assembly is applicable to other terminal modules having different specifications from one another, ensuring high usability. Furthermore, it is possible to select a resin of which the base 130 is made, regardless of a resin of which the frame 30 is made.

Figure 12:
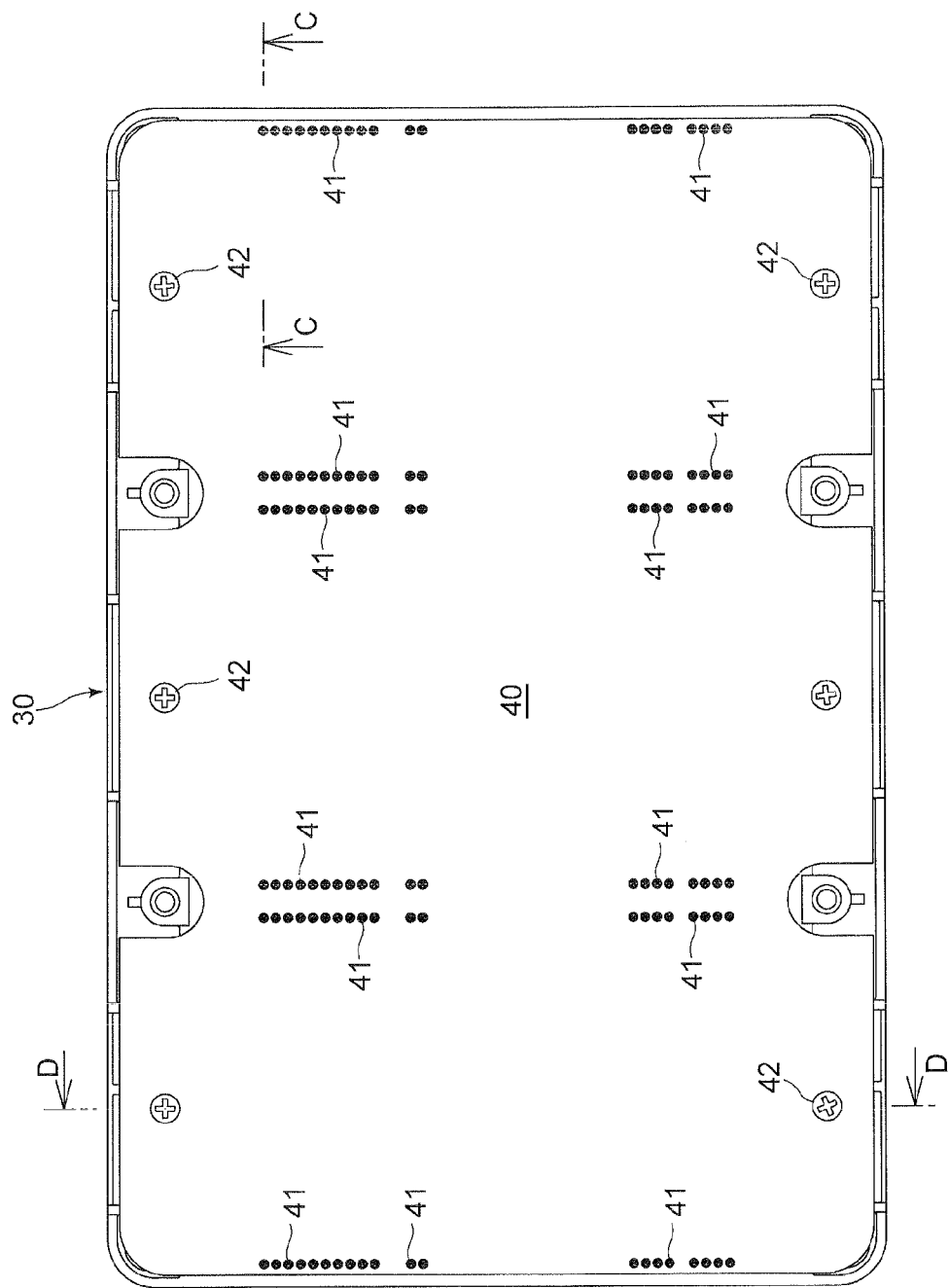
FIG. 12 is a plan view of a circuit board to which the part unit illustrated in FIG. 9 is connected.
Figure 13:
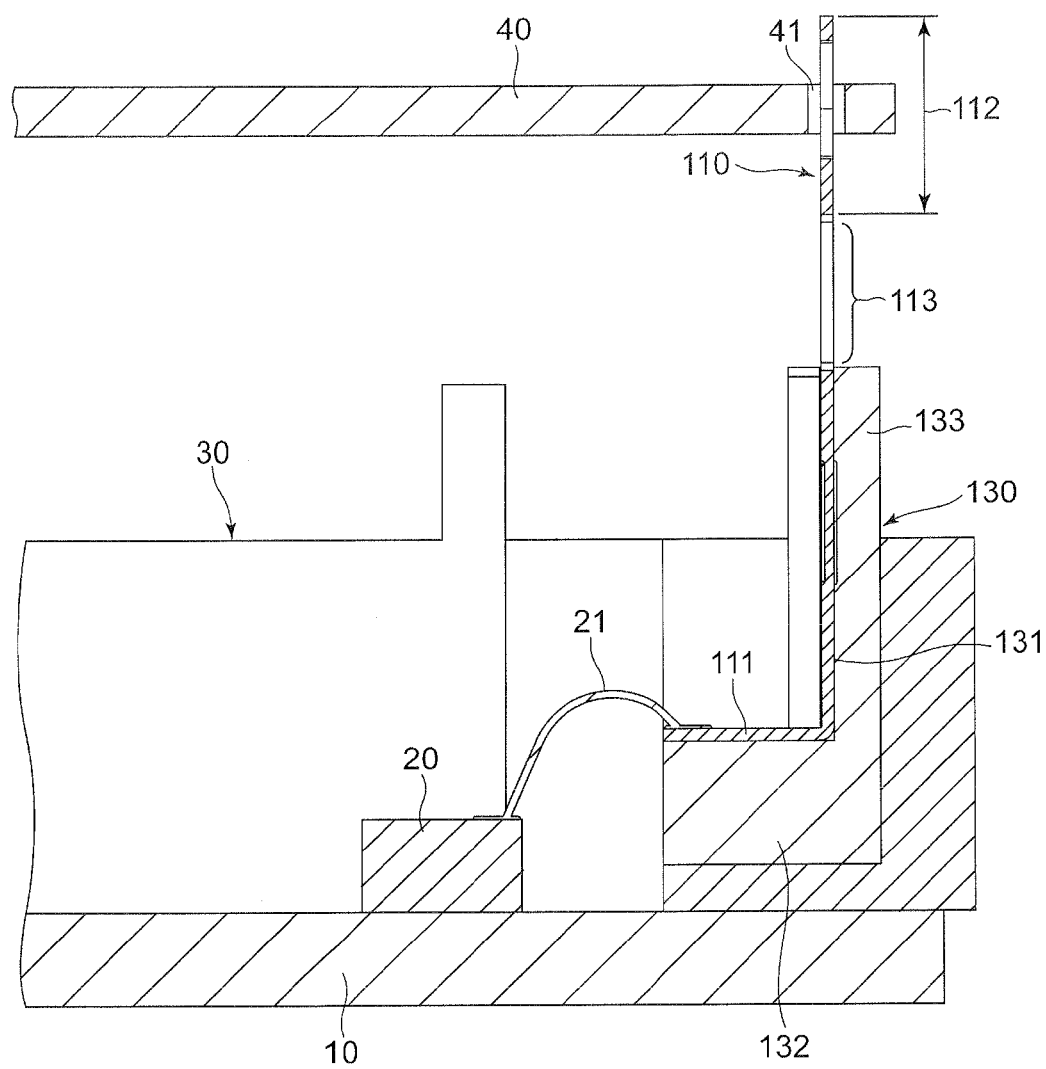
FIG. 13 is a cross-sectional view taken along the line C-C shown in FIG. 12.
Figure 14:
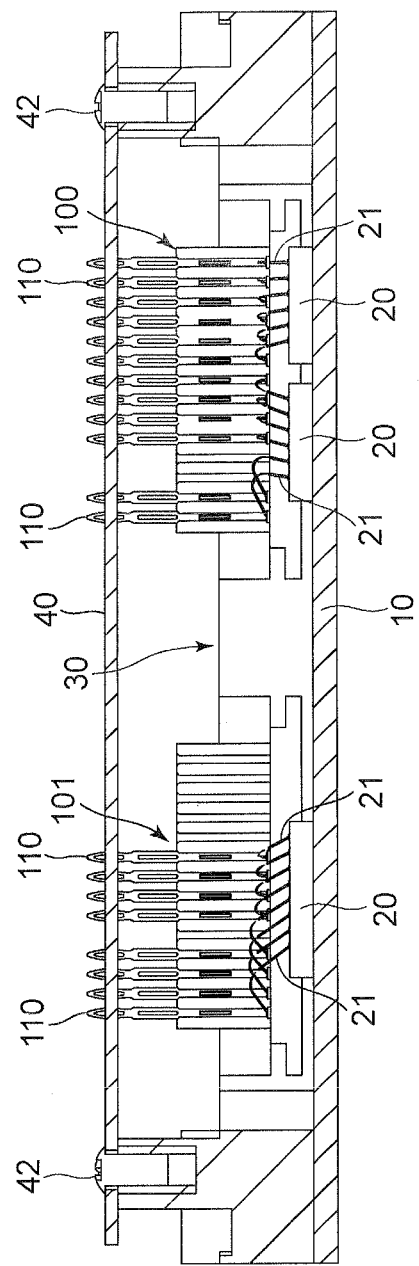
FIG. 14 is a cross-sectional view taken along the line D-D shown in FIG. 12.

As illustrated in FIGS. 12 and 13, the circuit board 40 is fixed to the frame 30 by positioning the circuit board 40 illustrated in FIG. 6 above the part unit 90 illustrated in FIGS. 8 and 9, inserting the contact parts 112 of the electrically conductive terminals 110 into the through-holes 41 formed through the circuit board 40, and screwing screws 42 to female threaded portions 32 of the frame 30.

Figure 15:
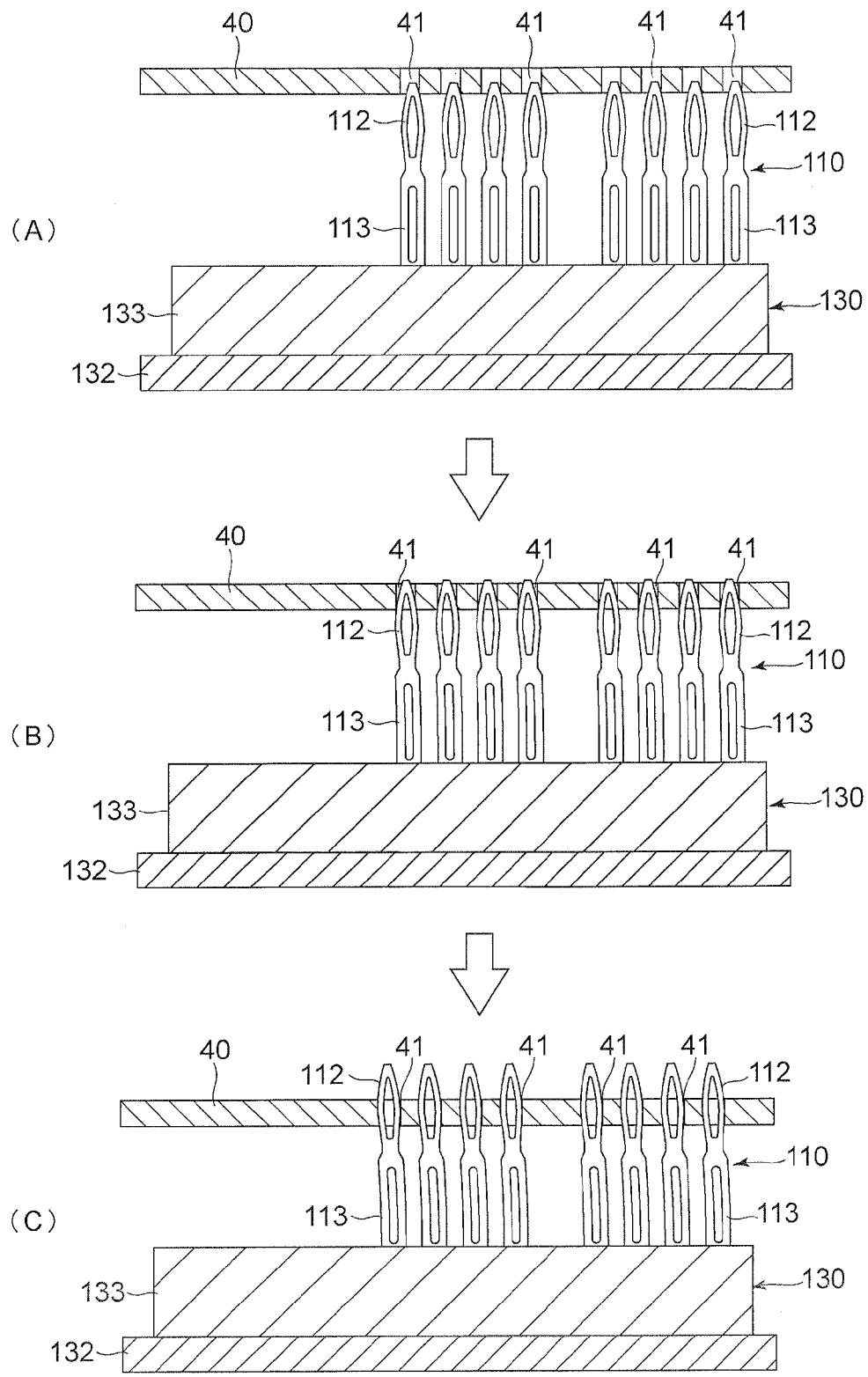
FIG. 15 shows steps of connecting the circuit board to the part unit illustrated in FIG. 9.

FIG. 15 illustrates steps of inserting the electrically conductive terminals 110 into the through-hole 41 formed through the circuit board 40 in the case that the electrically conductive terminals 110 axially slightly deviate from with the through-holes 41.

As illustrated in FIG. 15(A), the contact parts 112 of the electrically conductive terminals 110 forward at upper ends thereof into the through-holes 41 in such a condition that axes of the electrically conductive terminals 110 deviate from centers of the through-holes 41, because the electrically conductive terminals 110 axially slightly deviate from with the through-holes 41.

Since each of the contact parts 112 of the electrically conductive terminals 110 is bell-shaped, and each of the electrically conductive terminals 110 includes the flexible part 113 located just below the contact part 112 and acting as a floating system, as illustrated in FIG. 15(B), the flexible part 113 is deformed to cause the contact part 112 to be directed to a center of the through-hole 41 while the contact part 112 is being inserted into the through-hole 41.

Finally, as illustrated in FIG. 15(C), the contact parts 112 are fully fit into the through-holes 41 with the flexible parts 113 being kept deformed.

As mentioned above, since each of the electrically conductive terminals 110 is designed to include the flexible part 113 acting as a floating system, even if the electrically conductive terminals 110 and the through-holes 41 axially slightly deviate from each other, the flexible part 113 absorbs the axial deviation, that is, is deformed to thereby make it possible for the electrically conductive terminal 110 to be fully fit into the through-hole 41.

Second Embodiment

A terminal module 200 or 201 according to the second embodiment of the present invention is explained hereinbelow with reference to FIGS. 16 to 18.

Parts or elements in the terminal module 200 or 201 that correspond to those of the terminal module 100 illustrated in FIGS. 1 to 15 have been provided with the same reference numerals, operate in the same manner as corresponding parts or elements in the terminal module 200 or 201, unless explicitly explained hereinbelow, and are not explained hereinbelow.

Figure 16:
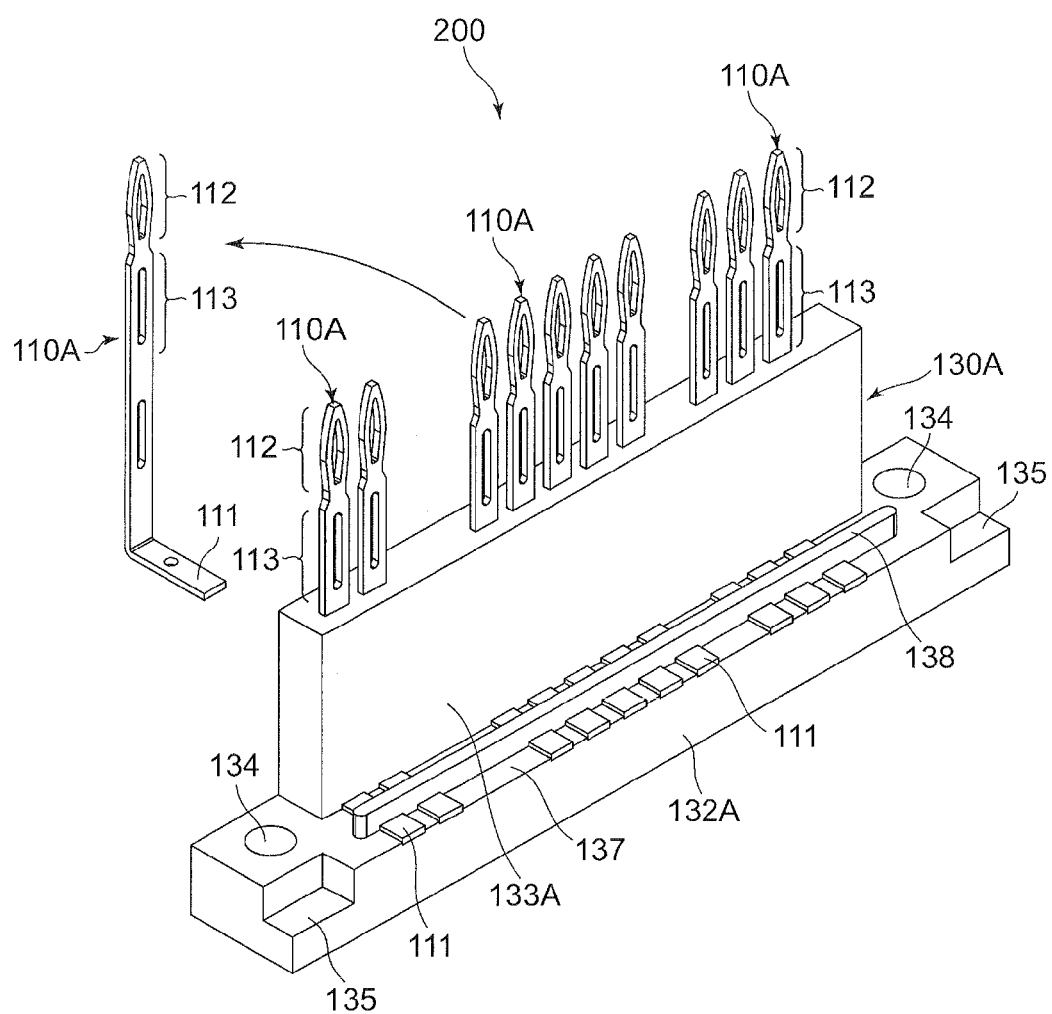
FIG. 16 is a perspective view of the terminal module according to the second embodiment of the present invention.
Figure 17:
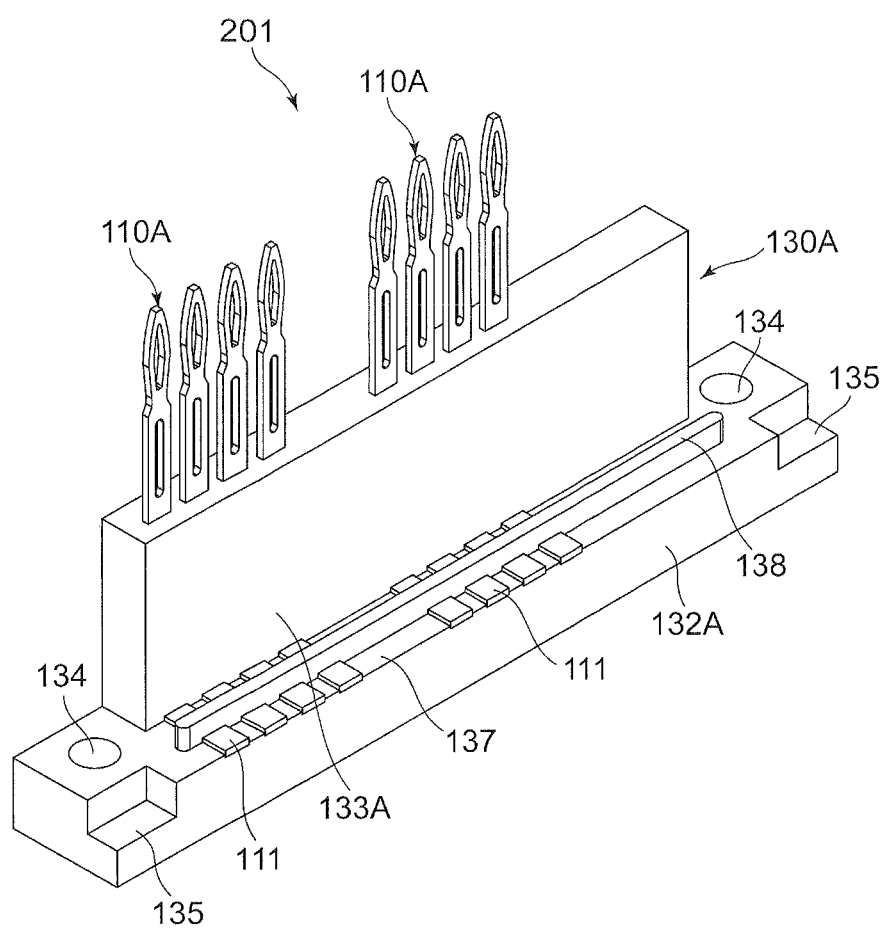
FIG. 17 is a perspective view of a terminal module including electrically conductive modules arranged in a different manner from that of the terminal module illustrated in FIG. 16.

As illustrated in FIG. 16, the terminal module 200 includes a plurality of electrically conductive terminals 11A, and a base 130A to which the electrically conductive terminals 11A are integrally fixed by an insertion molding process. The base 130A is formed integrally with a rib 138 extending in the direction S (see FIG. 1) to overlap a part of the connection part 111 of each of the electrically conductive terminals 11A.

Figure 18:
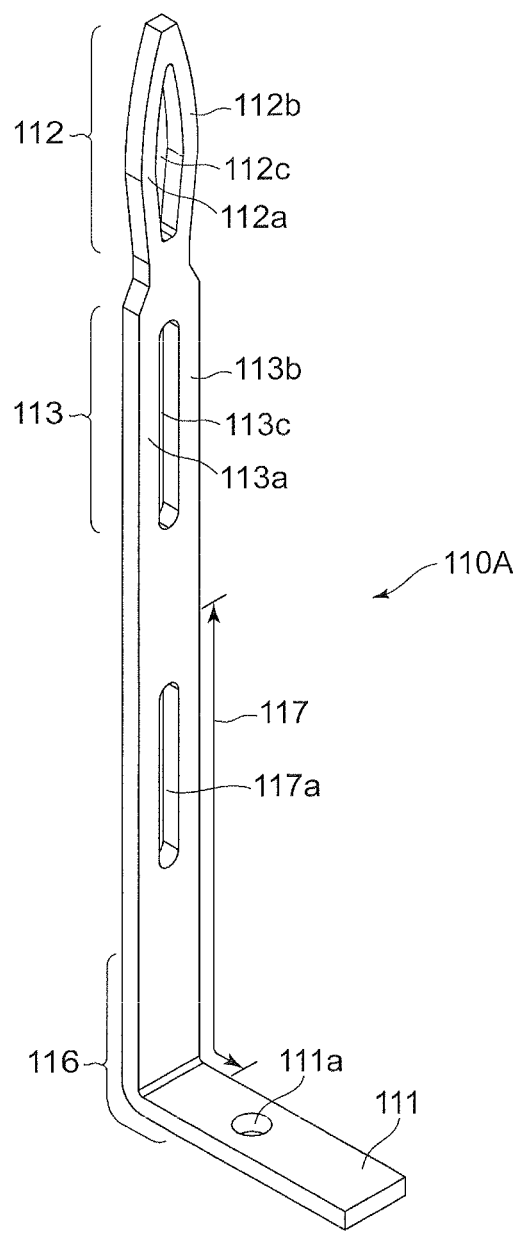
FIG. 18 is a perspective view of the electrically conductive terminal as a part of the terminal module illustrated in FIG. 16.

As illustrated in FIG. 18, each of the electrically conductive terminals 110A includes, similarly to the electrically conductive terminal 110 illustrated in FIG. 2, a contact part 112, a flexible part 113, an elbow part 116, and a connection part 111. The flexible part 113, the elbow part 116, and the connection part 111 have a constant width. An area 117 situated between the flexible part 113 and the connection part 111 is embedded in a holder portion 133A of the base 130A. The area 117 is formed with an elongate through-hole 117a. The connection part 111 is formed with a circular through-hole 111a.

In the terminal module 200 or 201, the through-hole 117a of each of the electrically conductive terminals 110A is filled with a synthetic resin of which the holder portion 133A is made, and the through-hole 111a is filled with a synthetic resin of which a basement portion 132A and the rib 138 are made.

A number and an arrangement of the electrically conductive terminals 110A may be determined in dependence on a specification of the terminal module 200 or 201. Thus, apart from the terminal module 200 illustrated in FIG. 16, there can be fabricated a terminal module 201 illustrated in FIG. 17 or a terminal module having another specification, for instance. Similarly to the terminal module 100 illustrated in FIG. 1, the terminal module 200 or 201 is fabricated and used integrally with the frame 30 (see FIG. 6) by secondary molding.

Though a plurality of the electrically conductive terminals 110A is fixed integrally to the base 130A by an insertion molding process in the terminal module 200 or 201, it is possible to fabricate terminal modules including a different number of the electrically conductive terminals 110A from each other, through the use of a common die assembly, similarly to the above-mentioned terminal module 100 illustrated in FIG. 1. If the electrically conductive terminals 110A are designed to be equally spaced away from one another, the die assembly is applicable to other terminal modules having different specifications from one another, ensuring high usability. Furthermore, it is possible to select a resin of which the base 130A is made, independently of a resin of which the frame 30 is made.

Third Embodiment

A terminal module 300 according to the third embodiment of the present invention is explained hereinbelow with reference to FIGS. 19 to 30.

Figure 19:
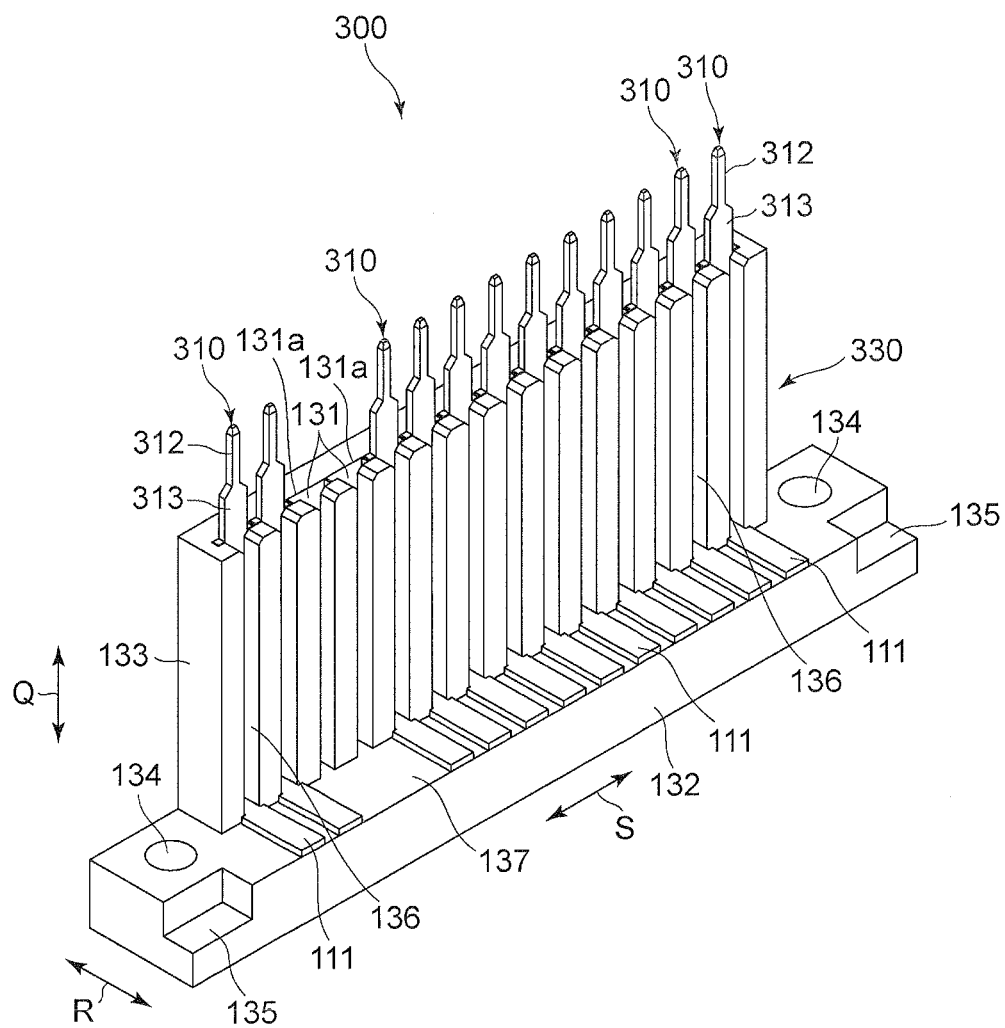
FIG. 19 is a perspective view of the terminal module according to the third embodiment of the present invention.
Figure 24:
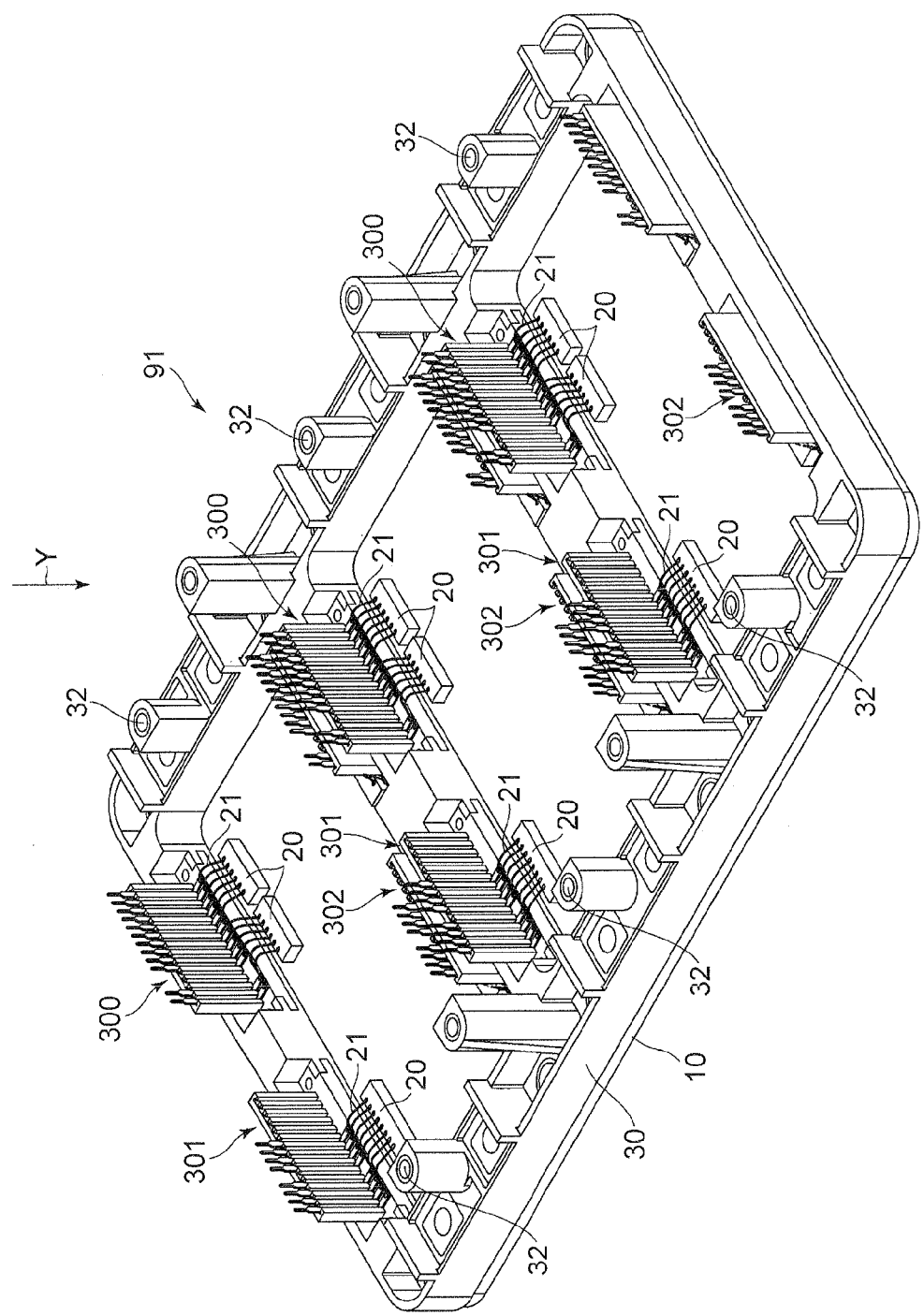
FIG. 24 is a perspective view of a part unit including a heat radiation board into which electric elements, a frame, and the terminal modules are assembled.
Figure 25:
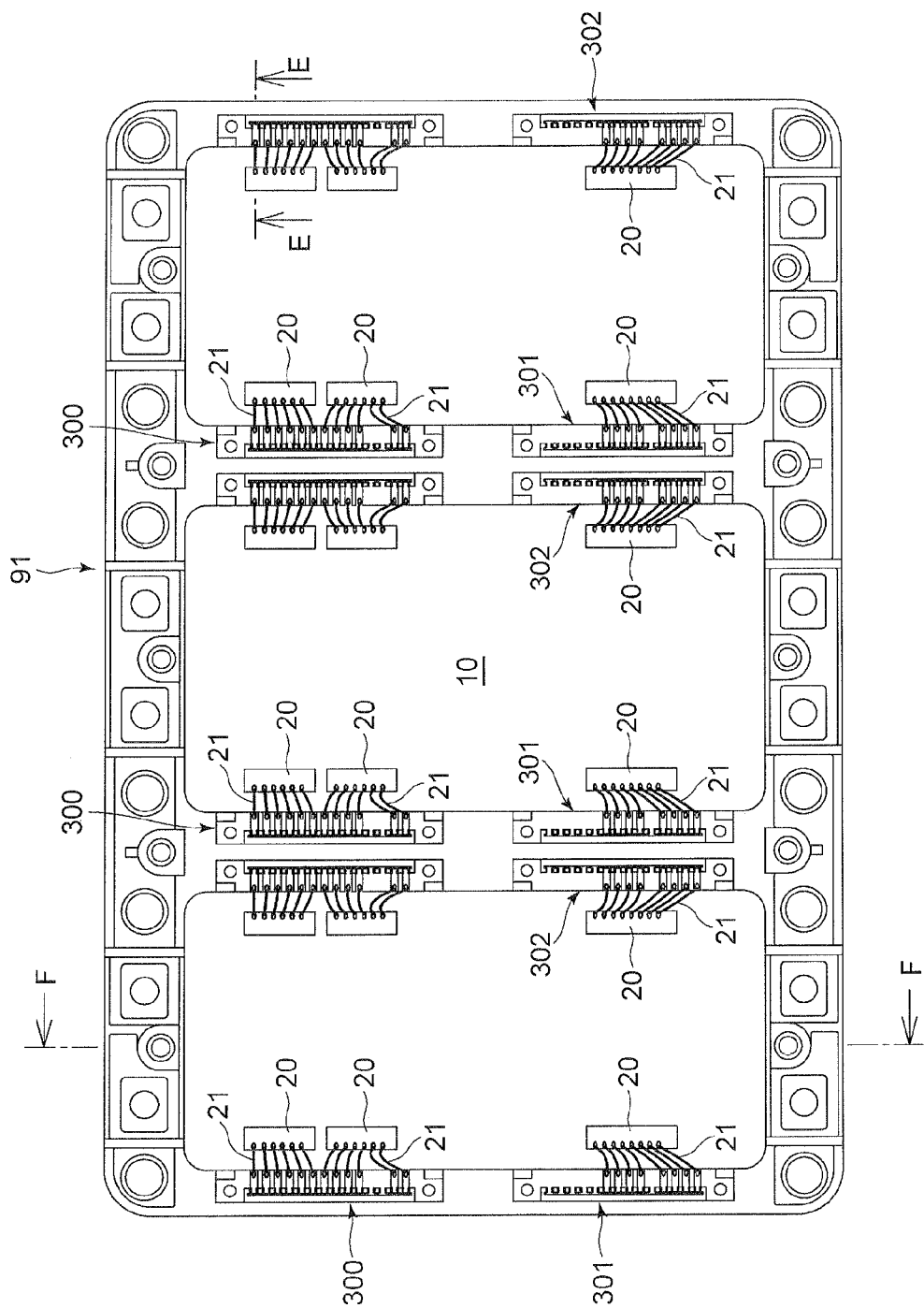
FIG. 25 is a plan view as seen in a direction Y indicated in FIG. 24.
Figure 26:
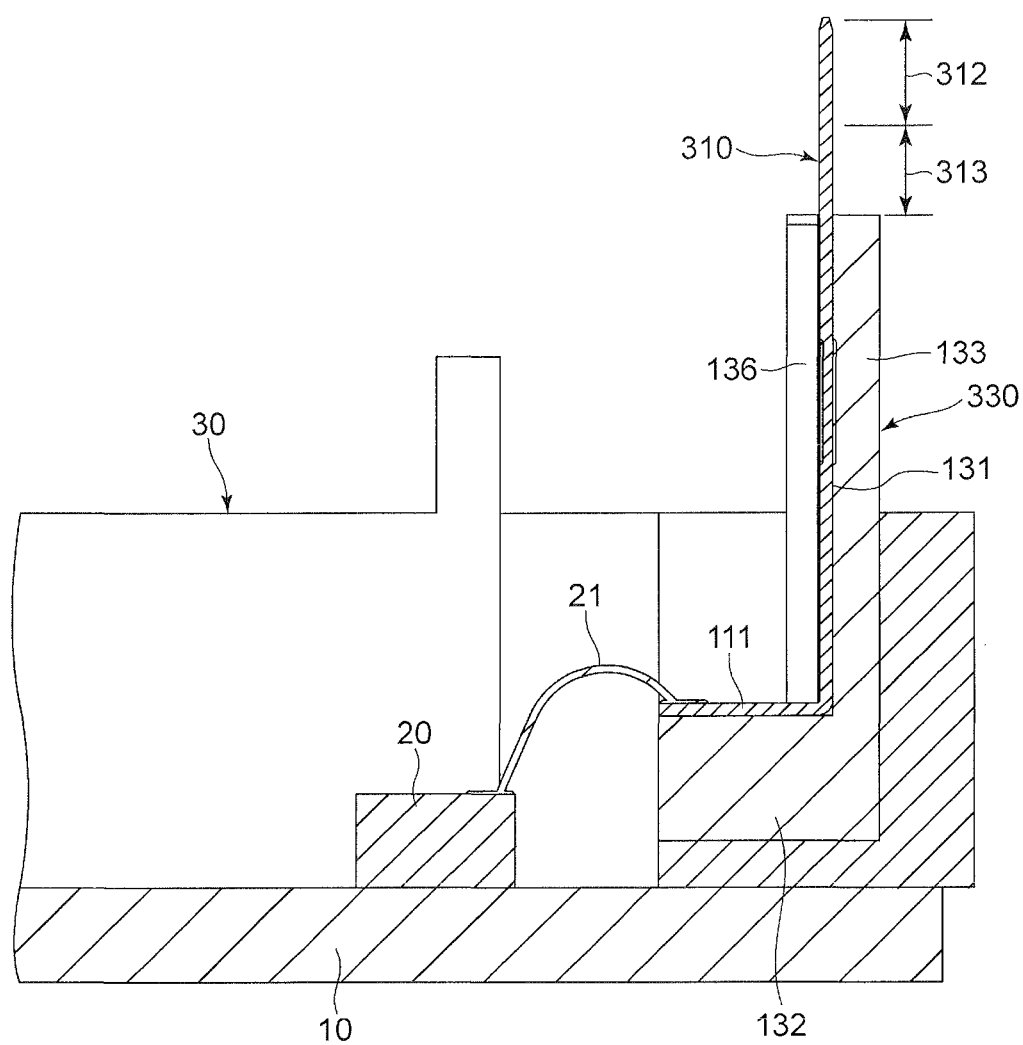
FIG. 26 is a cross-sectional view taken along the line E-E shown in FIG. 25.
Figure 27:
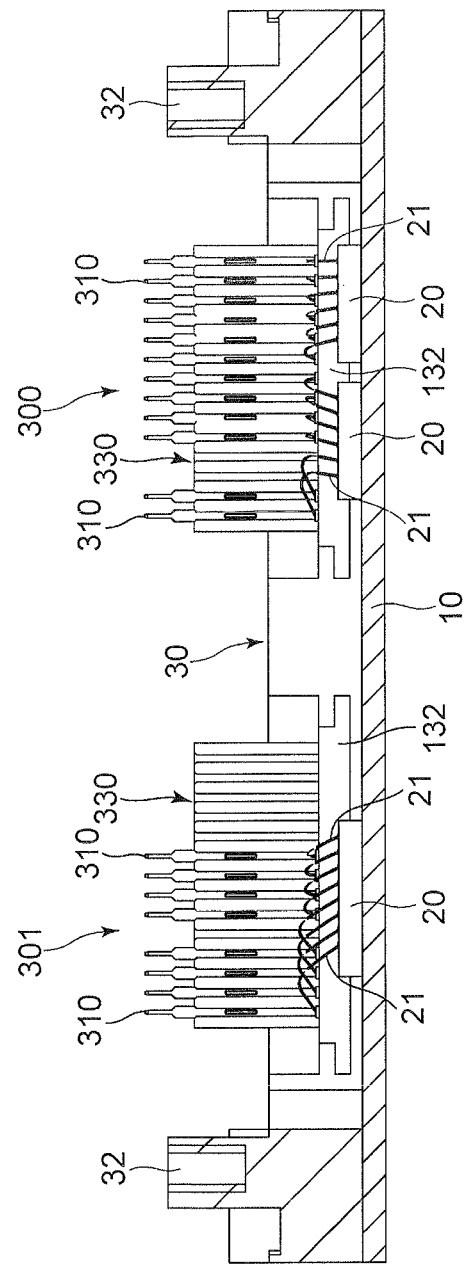
FIG. 27 is a cross-sectional view taken along the line F-F shown in FIG. 25.
Figure 28:
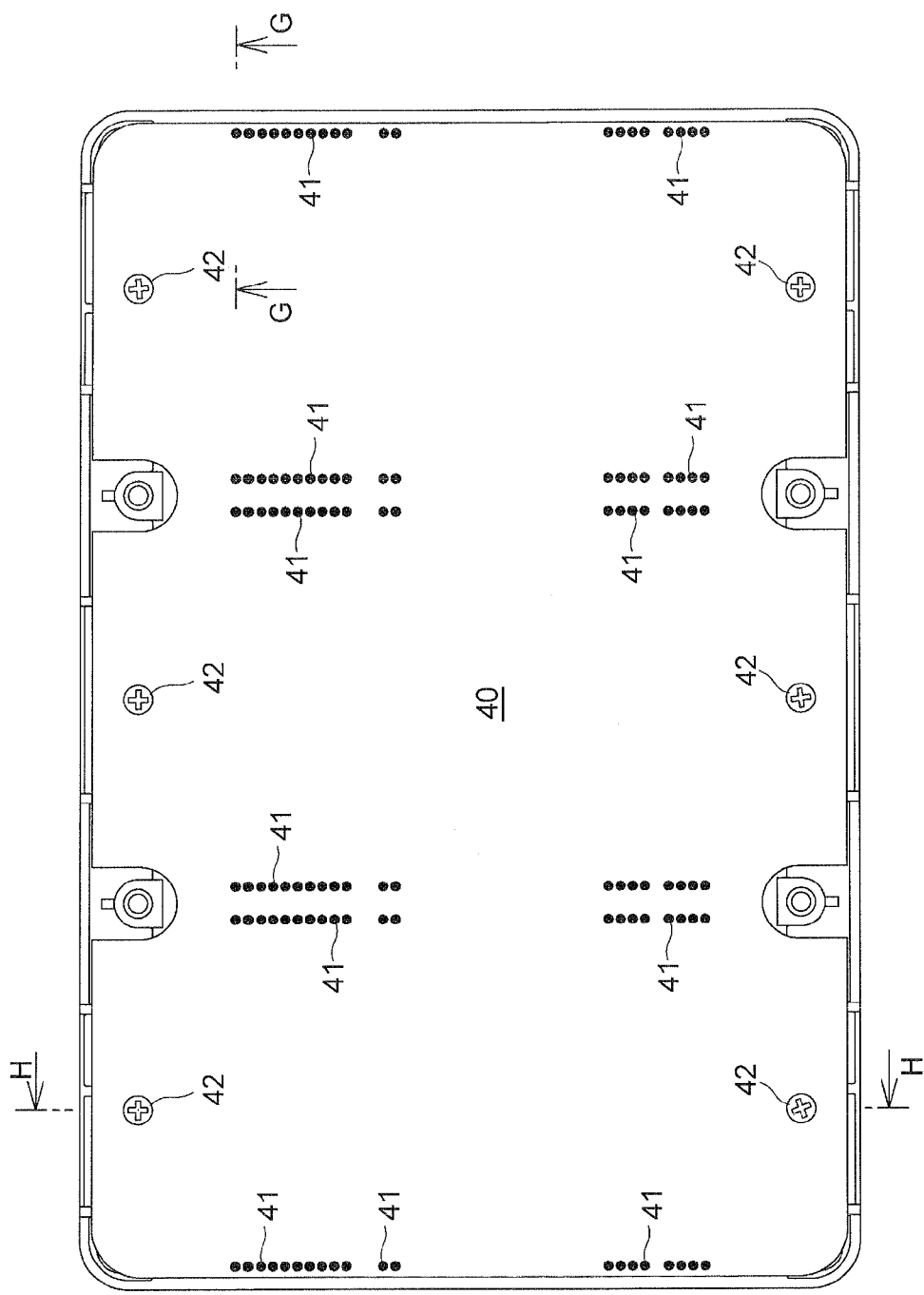
FIG. 28 is a plan view of a circuit board to which the part unit illustrated in FIG. 25 is connected.

As illustrated in FIGS. 19, 24 and 28, the terminal module 300 includes a plurality of electrically conductive terminals 310, and an electrically insulative base 330. Each of the electrically conductive terminals 310 includes a connection part 111 through which the electrically conductive terminal 310 is electrically connected to the electric element 20, and a contact part 312 to be inserted into the through-hole 41 of the circuit board 40. The base 330 holds a part of the electrically conductive terminals 310 to keep the electrically conductive terminals 310 in a constant posture.

Figure 20:
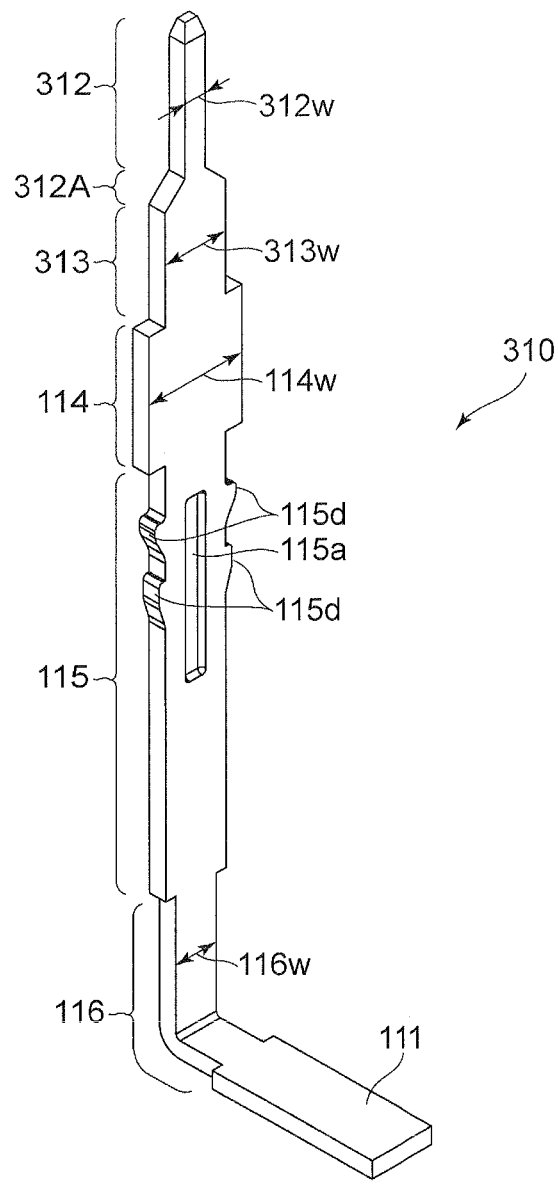
FIG. 20 is a perspective view of the electrically conductive terminal as a part of the terminal module illustrated in FIG. 19.

As illustrated in FIG. 20, each of the electrically conductive terminals 310 can be fabricated of an electrically conductive and elastic metal sheet through pressing and bending processes. Each of the electrically conductive terminals 310 is shaped substantially in an L-shape at its entirety. Each of the electrically conductive terminals 310 has a contact part 312 at an upper end of a vertical portion of the L-shape, and a connection part 111 at a distal end of a horizontal portion of the L-shape. Each of the electrically conductive terminals 310 includes a shoulder part 313, a holding part 114, an engagement part 115, and an elbow part 116 in this order from the contact part 312 to the connection part 111. The holding part 114, the engagement part 115, the elbow part 116, and the connection part 111 are identical in both a shape and a function with those of the electrically conductive terminal 110 illustrated in FIG. 2, and accordingly, have been provided with the same reference numerals as those in FIG. 2 and will not be explained.

As illustrated in FIG. 20, the contact part 312 has a shape of a square pole. The electrically conductive terminal 310 includes a trapezoidal portion 312A continuous to and located below the contact part 312. The shoulder portion 313 having a shape of a flat plate is continuous to and located below the trapezoidal portion 312A. The shoulder portion 313 has a width 313w greater than a width 312w of the contact part 312, but smaller than a width 114w of the holding part 114.

As illustrated in FIG. 19, the base 130 includes a basement portion 132 to be fixed integrally to a frame 30 (see FIG. 24) through a secondary molding process, and a holder portion 133 standing on the basement portion 132 at a rear of the basement portion 132. The base 330 is identical in structure with the base 130 illustrated in FIG. 1 except a vertical size of the holder portions 133 and 333, and hence, the elements of the base 330 except the holding portion 333 have been provided with the same reference numerals as the corresponding elements of the base 130 illustrated in FIG. 1, and will not be explained.

Figure 21:
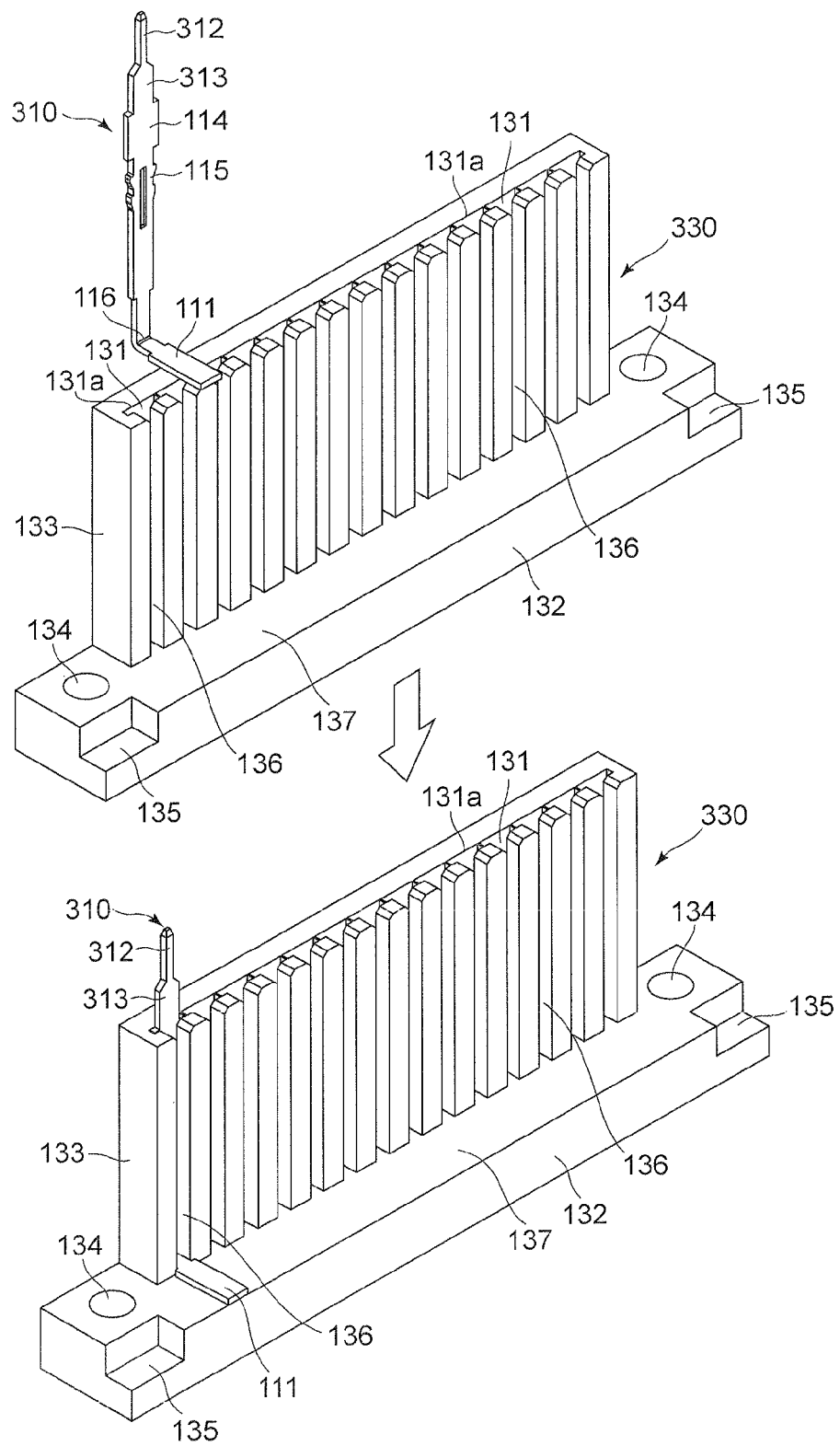
FIG. 21 shows steps of assembling the terminal module illustrated in FIG. 19.
Figure 22:
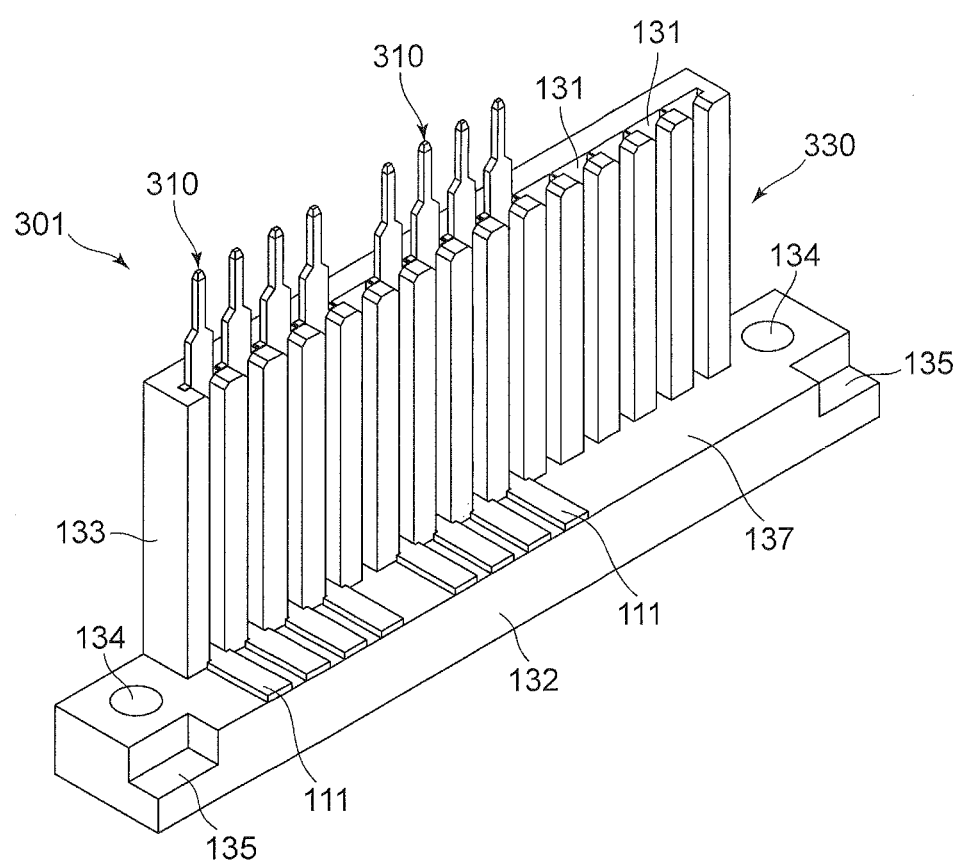
FIG. 22 is a perspective view of a terminal module including electrically conductive modules arranged in a different manner from that of the terminal module illustrated in FIG. 19.
Figure 23:
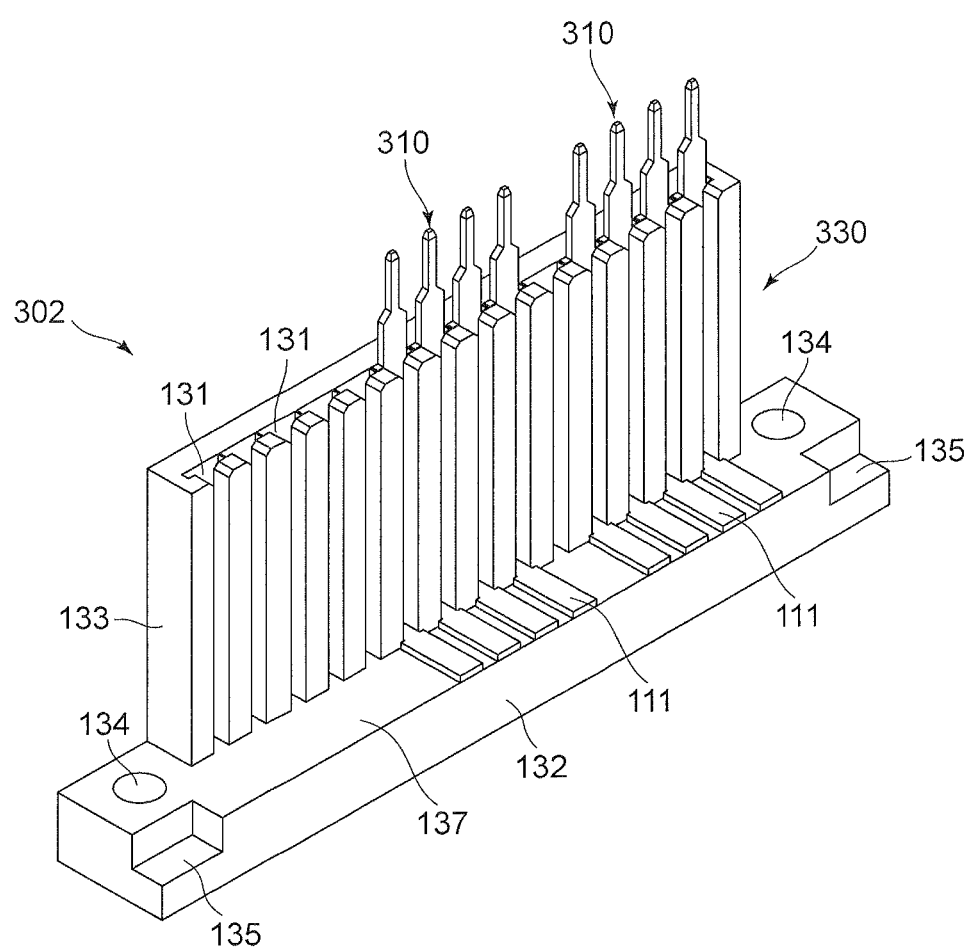
FIG. 23 is a perspective view of a terminal module including electrically conductive modules arranged in a different manner from that of the terminal module illustrated in FIG. 19.

As illustrated in FIG. 21, the terminal module 300 is fabricated by inserting the electrically conductive terminals 310 into the paths 131 vertically extending through the holder portion 133 of the base 330. Each of the electrically conductive terminals 310 is inserted into each of the paths 131 through an upper open end 131a of the path 131 towards the basement portion 132 of the base 330 with the connection part 111 being kept to face the basement portion 132 of the base 130. The electrically conductive terminal 310 is inserted into the path 131 with the elbow part 116 passing the front opening 136 until the connection part 111 abuts at a lower surface thereof with the basement portion 132.

After the electrically conductive terminal 310 has been inserted fully into the path 131, the contact part 312 and the shoulder portion 313 upwardly protrude through the upper open end 131a of the path 131, and the connection part 111 contacts at a lower surface thereof with the flat portion 137 of the basement portion 132.

A number and a position of the electrically conductive terminal(s) 310 to be inserted into the paths 131 of the base 330 can be determined in dependence on a structure and/or arrangement of the electric elements 20 (see FIG. 6). Accordingly, there may be fabricated a terminal module 301 illustrated in FIG. 22 or a terminal module 302 illustrated in FIG. 23, apart from the terminal module 300 illustrated in FIG. 19, by changing a number of the electrically conductive terminals 310 and/or a position at which each of the electrically conductive terminals 310 is inserted into the holder portion 133, in dependence on a design specification of a terminal module.

A part unit 91 including the terminal module 300, 301 or 302 is explained hereinbelow with reference to FIGS. 24 to 30.

As illustrated in FIG. 24, the terminal module 300, 301 or 302 is mounted onto the heat radiation board 10 through the frame 30 for electrically connecting a plurality of the electric elements 20 fixed on the heat radiation board 10, to the circuit board 40 situated in facing relation with the heat radiation board 10 and formed with a plurality of the through-holes 41.

Specifically, after the terminal module 300, 301 or 302 was set in a die assembly (not illustrated) used for fabrication of the frame 30, a secondary molding is carried out to thereby fabricate the frame 30 with which the terminal module 300, 301 or 302 is integrally fixed.

As illustrated in FIGS. 24 to 27, after the frame 30 formed integral with a predetermined number of the terminal modules 300, 301 or 302 was fixed by means of an adhesive onto the heat radiation board 10 on which the electric elements 20 are mounted, the connection parts 111 of the electrically conductive terminals 310 in the terminal modules 300, 301 or 302 are electrically connected to the electric elements 20 through bonding wires 21. Thus, there is completed the part unit 91.

As explained above, since the electrically conductive terminals 310 are mounted, with being fixed to the base 330, onto the heat radiation board 10 through the frame 30 formed integral with the base 330 of the terminal module 300, 301 or 302, it is possible to prevent deterioration in positional accuracy of the electrically conductive terminals 310 relative to the heat radiation board 10, caused by curvature, deformation and/or shrinkage of the frame 30. Furthermore, since positional accuracy of the electrically conductive terminals 310 relative to the heat radiation board 10 can be enhanced, defection in bonding between the electrically conductive terminals 310 and the electric elements 20 mounted on the heat radiation board 10 hardly occurs.

Figure 29:
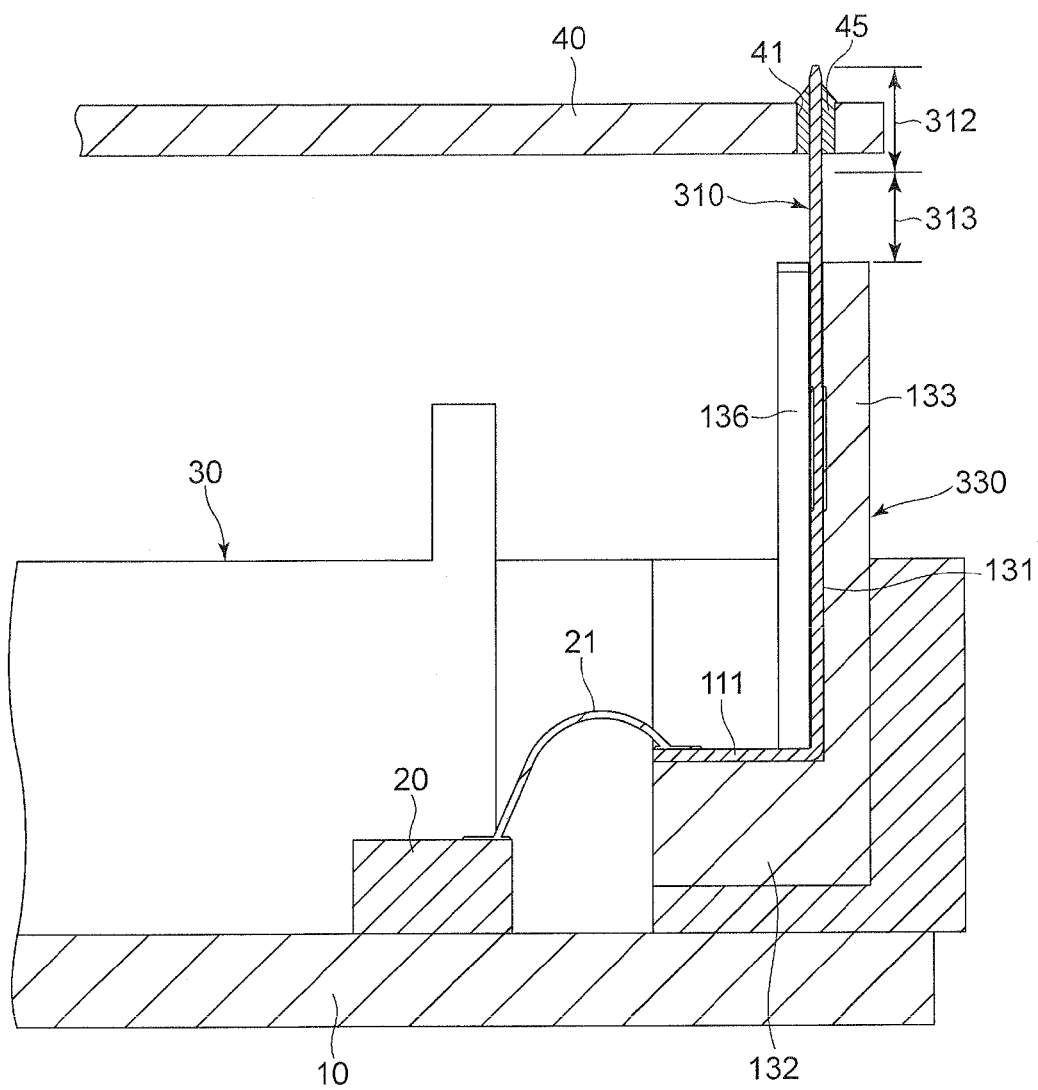
FIG. 29 is a cross-sectional view taken along the line G-G shown in FIG. 28.
Figure 30:
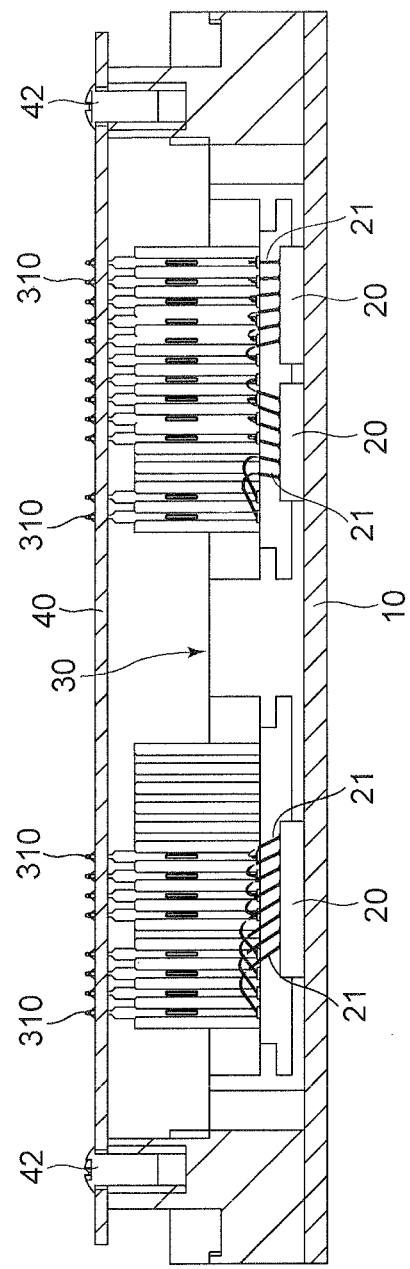
FIG. 30 is a cross-sectional view taken along the line H-H shown in FIG. 28.

As illustrated in FIGS. 28 to 30, the circuit board 40 is fixed to the frame 30 by positioning the circuit board 40 illustrated in FIG. 6 above the part unit 91 illustrated in FIG. 24, inserting the contact parts 112 of the electrically conductive terminals 310 into the through-holes 41 formed through the circuit board 40, and screwing screws 42 into female threaded portions 32 of the frame 30.

Fourth Embodiment

A terminal module 400 or 401 according to the fourth embodiment of the present invention is explained hereinbelow with reference to FIGS. 31 to 33.

Parts or elements in the terminal module 400 or 401 that correspond to those of the terminal module 300 illustrated in FIGS. 19 to 30 have been provided with the same reference numerals, operate in the same manner as corresponding parts or elements in the terminal module 300, unless explicitly explained hereinbelow, and are not explained hereinbelow.

Figure 31:
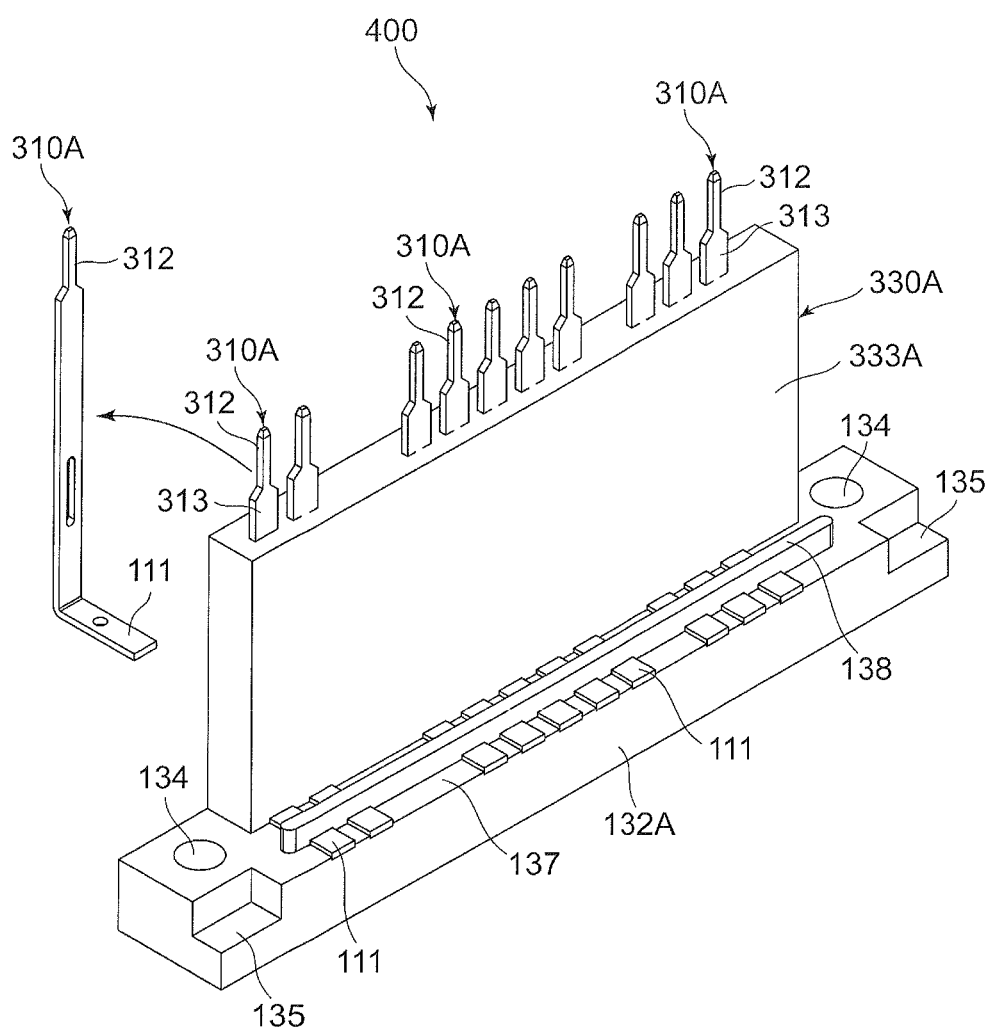
FIG. 31 is a perspective view of the terminal module according to the fourth embodiment of the present invention.
Figure 32:
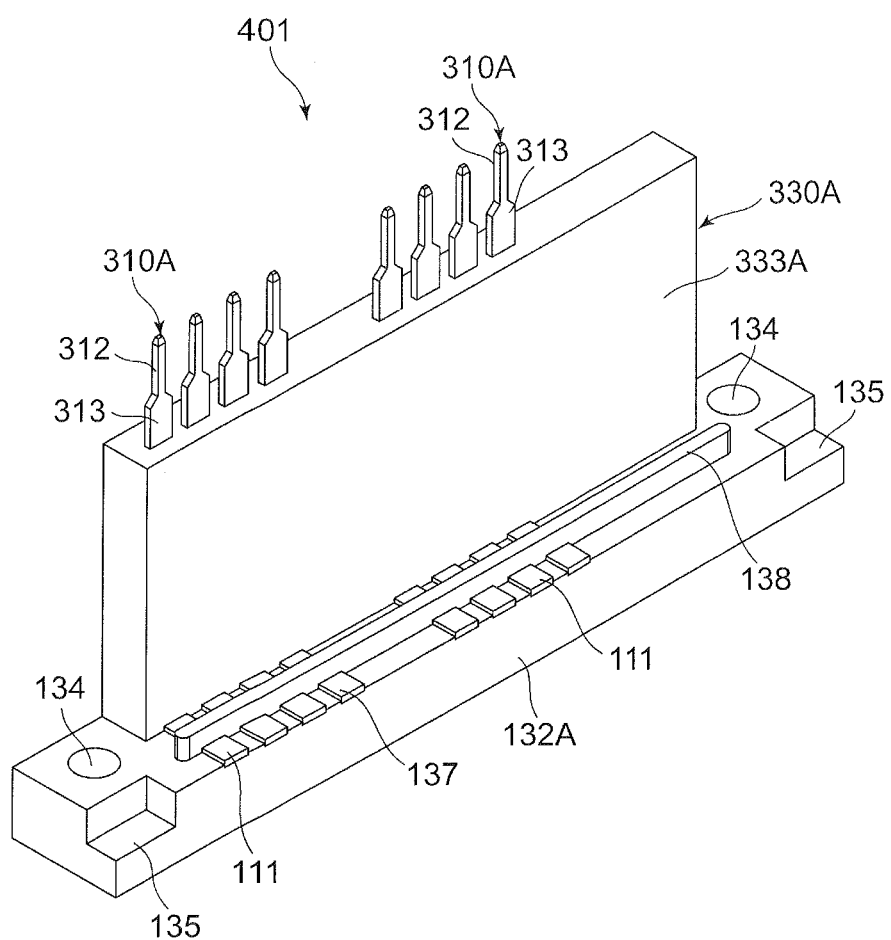
FIG. 32 is a perspective view of a terminal module including electrically conductive modules arranged in a different manner from that of the terminal module illustrated in FIG. 31.

As illustrated in FIG. 31, a plurality of electrically conductive terminals 310A is integrally fixed to a base 330A by an insertion molding process in the terminal module 400. The electrically conductive terminals 310A are fixed to the base 330A such that the contact parts 312 and the shoulder parts 313 of the electrically conductive terminals 310A upwardly protrude beyond an upper end of a holder portion 333A of the base 330A. The base 330A is formed integrally with a rib 138 extending in the direction S (see FIG. 1) to overlap a part of the connection part 111 of each of the electrically conductive terminals 310A.

Figure 33:
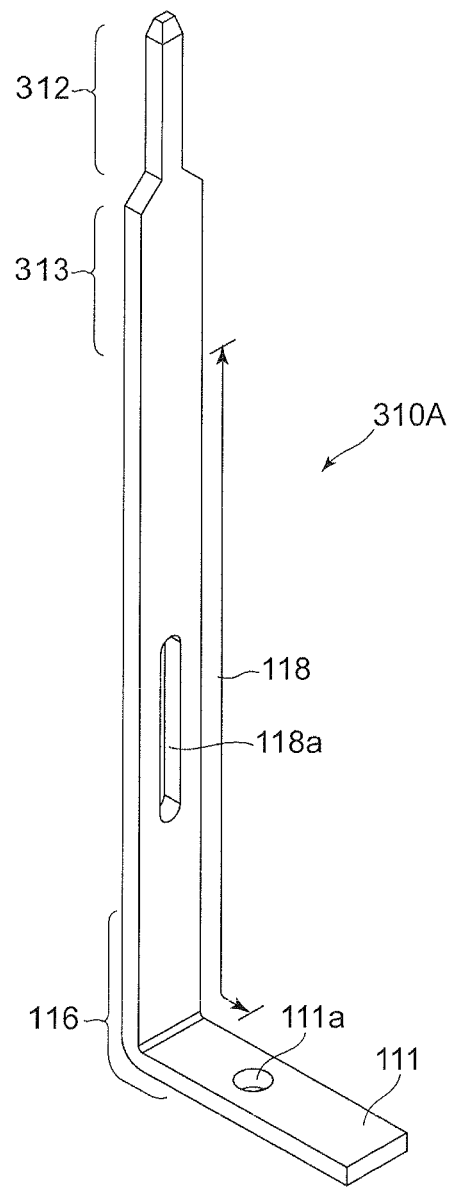
FIG. 33 is a perspective view of the electrically conductive terminal as a part of the terminal module illustrated in FIG. 31.

As illustrated in FIG. 33, each of the electrically conductive terminals 310A includes, similarly to the electrically conductive terminal 310 illustrated in FIG. 20, a contact part 312, a shoulder part 313, an elbow part 116, and a connection part 111. The shoulder part 313, the elbow part 116, and the connection part 111 have a constant width. An area 118 situated between the shoulder part 313 and the connection part 111 is embedded in a holder portion 333A of the base 330A. The area 118 is formed with an elongate through-hole 118a. The connection part 111 is formed with a circular through-hole 111a.

In the terminal module 400 or 401, the through-hole 11a of each of the electrically conductive terminals 310A is filled with a synthetic resin of which the holder portion 333A is made, and the through-hole 111a is filled with a synthetic resin of which the basement portion 132A and the rib 138 are made.

A number and an arrangement of the electrically conductive terminals 310A may be determined in dependence on a specification of the terminal module 400 or 401. Thus, apart from the terminal module 400 illustrated in FIG. 31, there can be fabricated a terminal module 401 illustrated in FIG. 32 or a terminal module having another specification, for instance. Similarly to the terminal module 100 illustrated in FIG. 1, the terminal module 400 or 401 is fabricated and used integrally with the frame 30 (see FIG. 6) by a secondary molding process.

In the electrically conductive terminal 310 of the terminal module 300 illustrated in FIG. 19 and the electrically conductive terminal 310A of the terminal module 400 illustrated in FIG. 31, the contact part 312 has a size (an outer diameter) much smaller than an inner diameter of the through-hole 41 of the circuit board 40, and accordingly, the contact part 312 can be inserted into the through-hole 41 without a flexible part such as the flexible part 113 (see FIG. 2) adjacent to the contact part 312. As illustrated in FIG. 29, after the insertion of the contact part 312 into the through-hole 41, the contact part 312 and the through-hole 41 are bonded to each other through a solder 45. Similarly to the other electrically conductive terminals, the shoulder part 313 can be formed as a flexible part by forming a through-hole through the shoulder part 313.

Fifth Embodiment

A terminal module 500 according to the fifth embodiment of the present invention is explained hereinbelow with reference to FIGS. 34 to 41.

Parts or elements in the terminal module 500 that correspond to those of the terminal module 100 illustrated in FIGS. 1 to 15 have been provided with the same reference numerals, operate in the same manner as corresponding parts or elements in the terminal module 100, unless explicitly explained hereinbelow, and are not explained hereinbelow.

Figure 34:
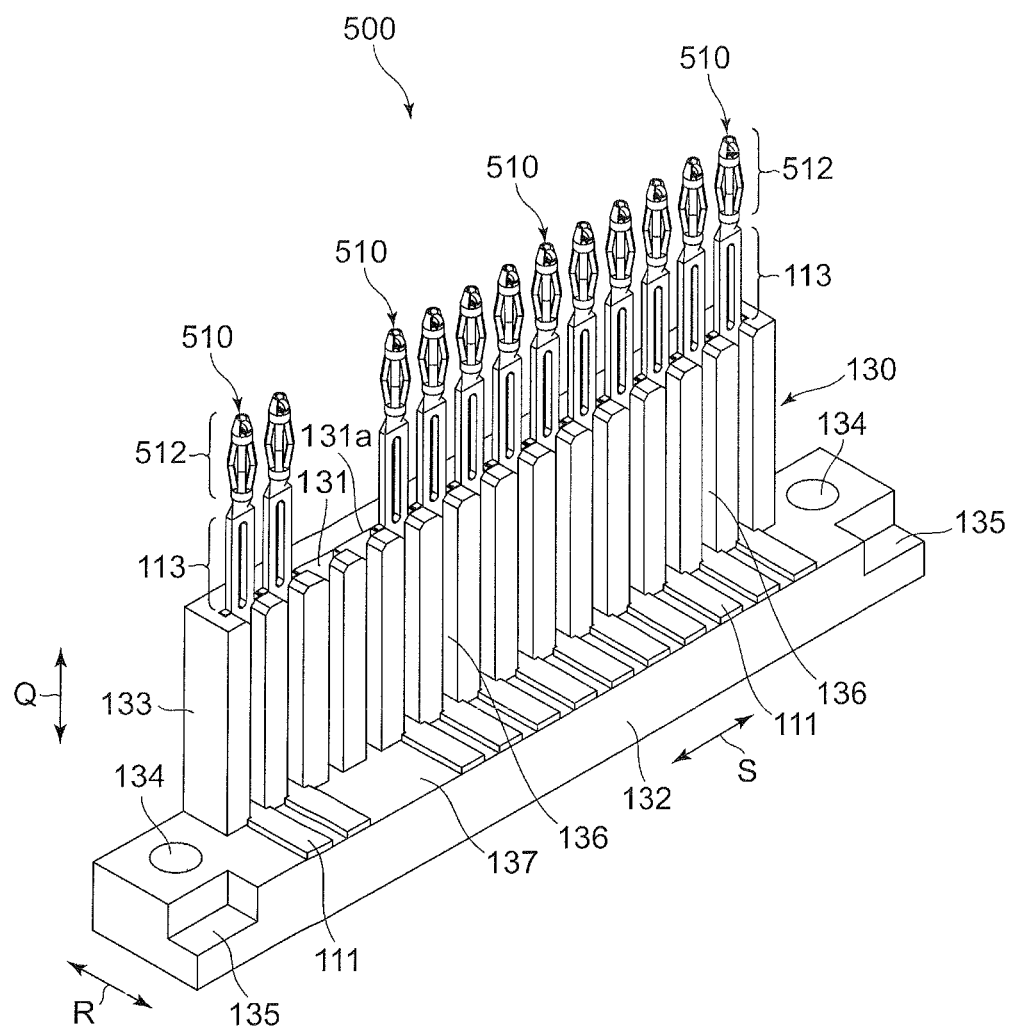
FIG. 34 is a perspective view of the terminal module according to the fifth embodiment of the present invention.
Figure 35:
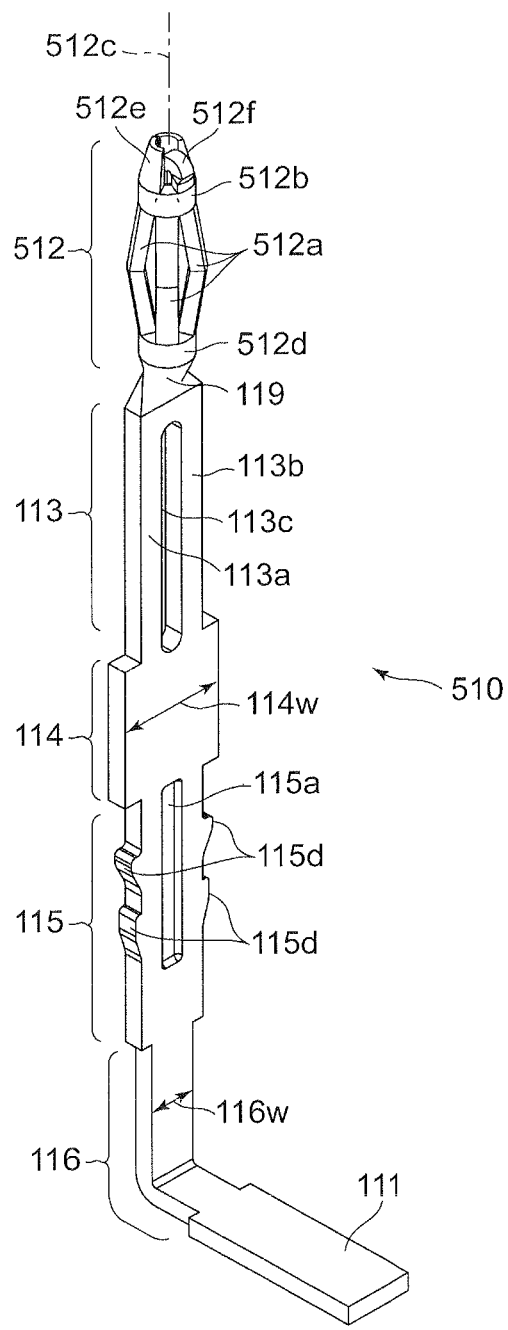
FIG. 35 is a perspective view of the electrically conductive terminal as a part of the terminal module illustrated in FIG. 34.

As illustrated in FIGS. 34 and 35, the terminal module 500 includes a plurality of electrically conductive terminals 510, and an electrically insulative base 130. Each of the electrically conductive terminals 510 includes a connection part 111 through which the electrically conductive terminal 510 is electrically connected to the electric element 20, and a contact part 512 to be inserted into the through-hole 41 of the circuit board 40. The base 130 holds a part of each of the electrically conductive terminals 510 to keep the electrically conductive terminals 510 in a constant posture.

As illustrated in FIG. 35, the electrically conductive terminal 510 can be fabricated of an electrically conductive and elastic metal sheet through pressing and bending processes. The electrically conductive terminal 510 is shaped substantially in an L-shape at its entirety. The electrically conductive terminal 510 has the contact part 512 at an upper end of a vertical portion of the L-shape, and the connection part 111 at a distal end of a horizontal portion of the L-shape.

The electrically conductive terminal 510 includes a flexible part 113, a holding part 114, an engagement part 115, and an elbow part 116 in this order from the contact part 512 to the connection part 111. The flexible part 113, the holding part 114, the engagement part 115, the elbow part 116, and the connection part 111 have the same shape and function as those of the electrically conductive part 110 illustrated in FIG. 2.

The contact part 512 comprises a plurality of contact pieces 512a bending such that a center in a length-wise direction thereof protrudes outwardly around an imaginary axis 512c. The contact pieces 512a are arranged to be circumferentially spaced away from one another. The contact part 512 is substantially in a shape of a barrel. The contact pieces 12a are bound at upper and lower ends thereof with C-shaped binders 512b and 512d. A distal end portion 512e located above the upper binder 512b is tapered towards a summit. The lower binder 512d is continuous to the flexible part 113 through a twisted portion 119.

Figure 41:
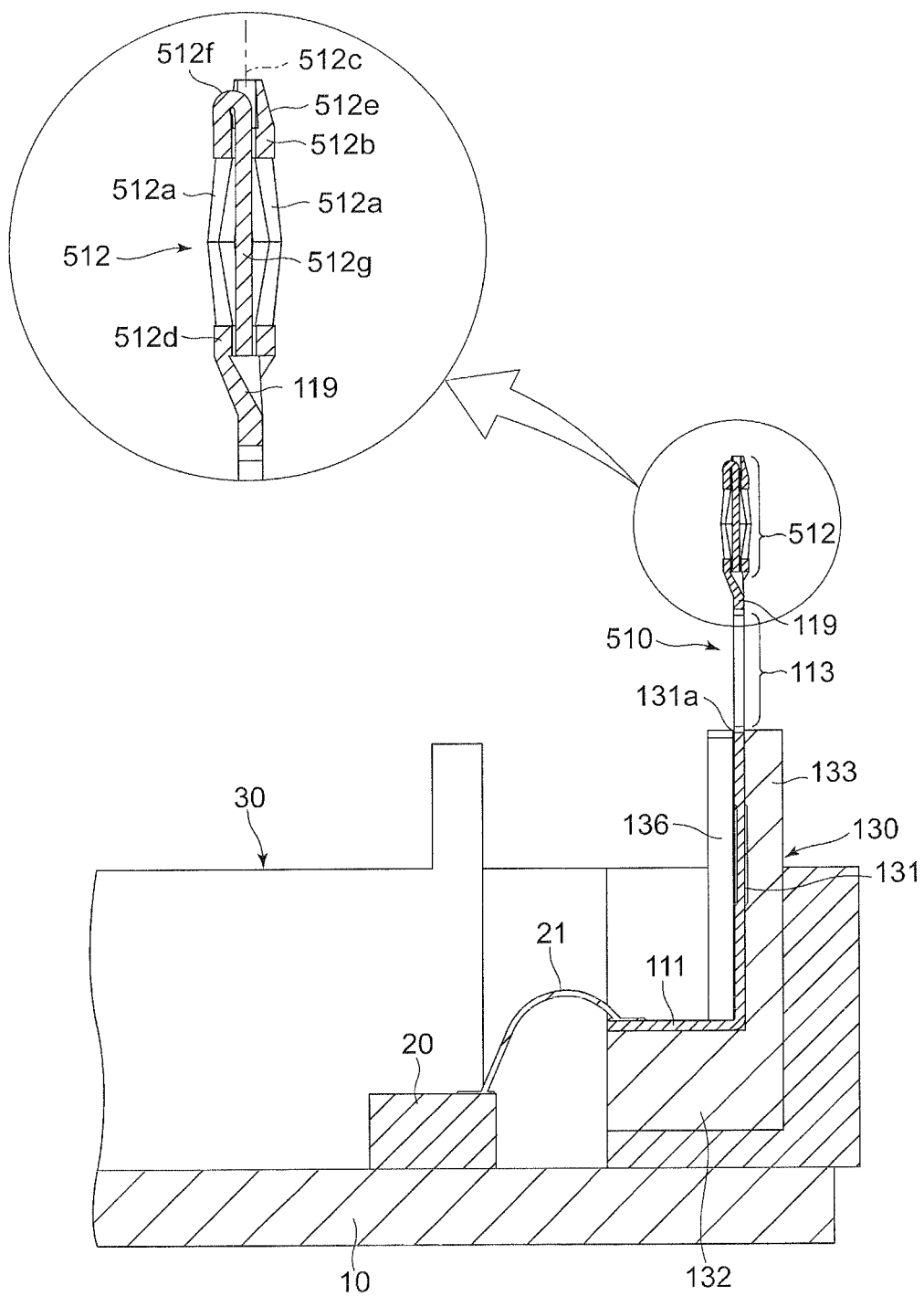
FIG. 41 is a cross-sectional view taken along the line J-J shown in FIG. 40.

A shaft portion 512g is located at the imaginary axis 512c surrounded by the contact pieces 512a by bending the shaft portion 512g extending from the upper binder 512b, by 180 degrees, as illustrated in FIG. 41. That is, the shaft portion 512g is bent into a reverse-J shape with a bending portion 512f thereof being exposed outside of a cut-out formed at the distal end portion 512e.

Each of the contact pieces 512a is made of a metal having elasticity, and accordingly, each of the contact pieces 512a is deformable towards and away from the imaginary axis 512c thereof. Thus, the contact part 512 constituted of the contact pieces 512a defines a press-fit terminal elastically expandable and shrinkable radially in the through-hole 41 formed through the circuit board 40.

Figure 36:
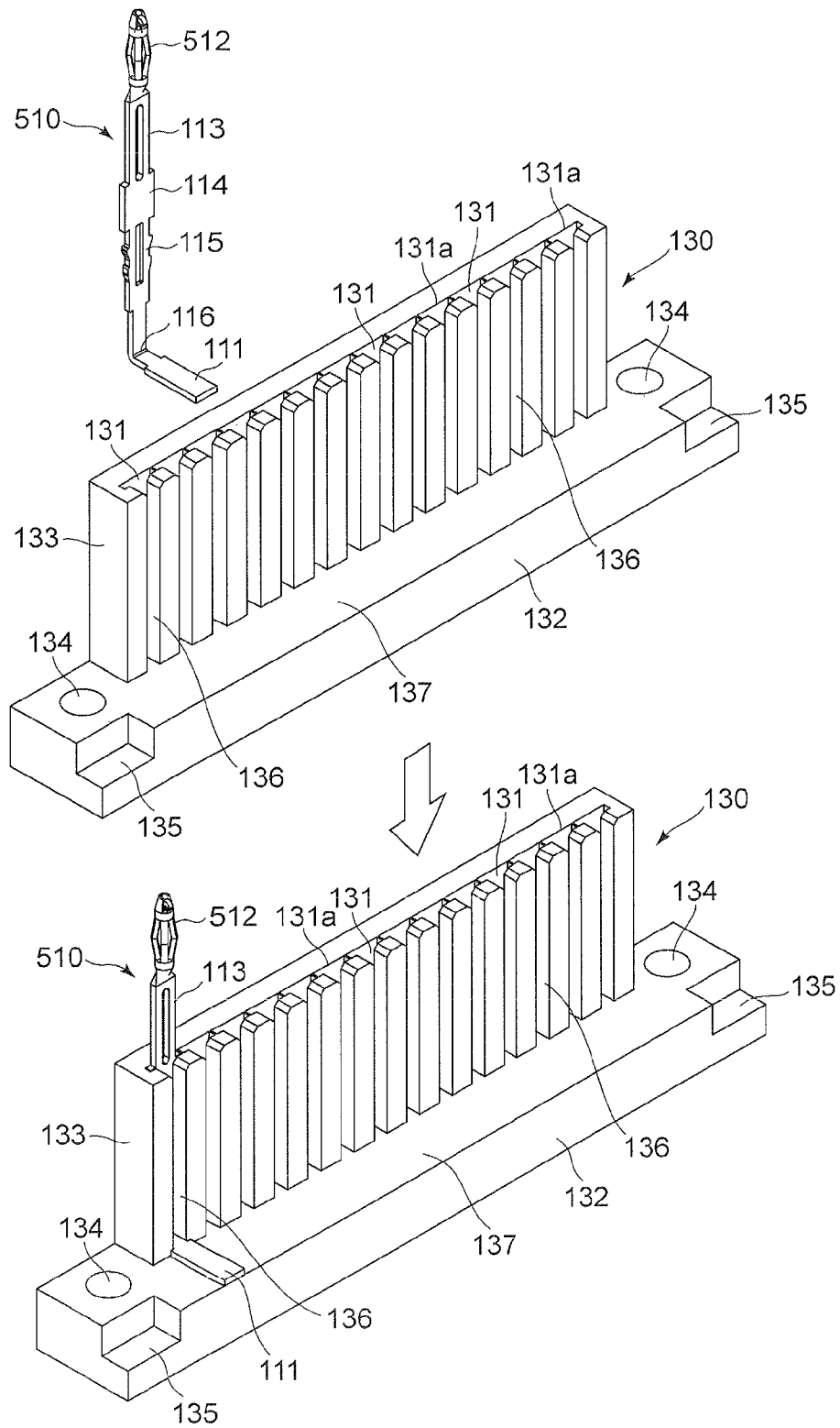
FIG. 36 shows steps of assembling the terminal module illustrated in FIG. 34.
Figure 37:
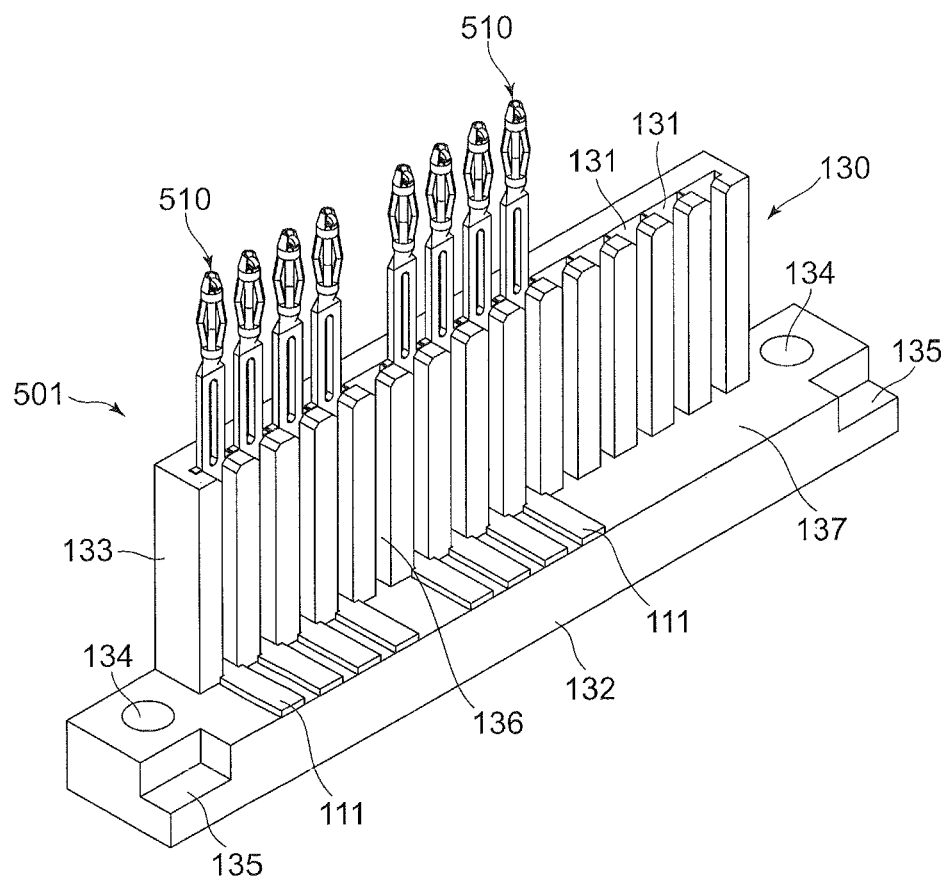
FIG. 37 is a perspective view of a terminal module including electrically conductive modules arranged in a different manner from that of the terminal module illustrated in FIG. 34.
Figure 38:
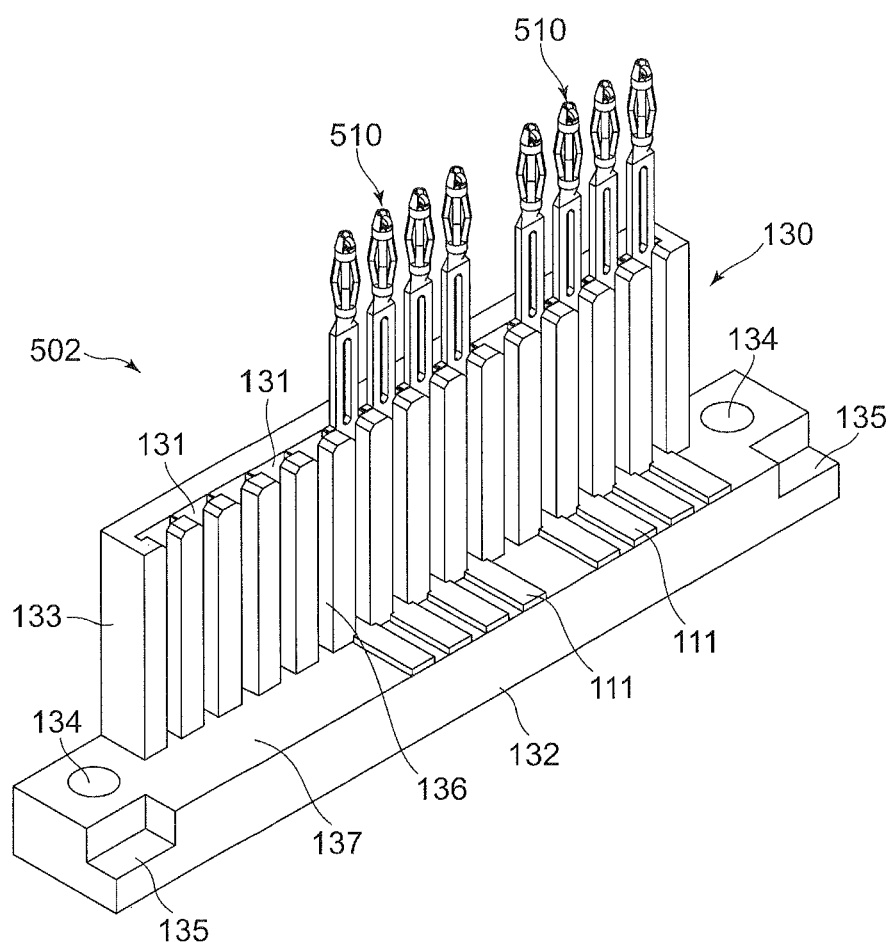
FIG. 38 is a perspective view of a terminal module including electrically conductive modules arranged in a different manner from that of the terminal module illustrated in FIG. 34.

As illustrated in FIG. 36, the terminal module 500 illustrated in FIG. 34 is fabricated by inserting the electrically conductive terminals 510 into the paths 131 vertically extending through the holder portion 133 of the base 130. After the electrically conductive terminal 510 has been inserted fully into the path 131, the contact part 512 and the flexible part 113 upwardly protrude through the upper open end 131a of the path 131, and the connection part 111 contacts at a lower surface thereof with the flat portion 137 of the basement portion 132.

A number and a position of the electrically conductive terminal(s) 510 to be inserted into the paths 131 of the base 130 can be determined in dependence on a structure and/or arrangement of the electric elements 20 (see FIG. 6). Accordingly, there may be fabricated a terminal module 501 illustrated in FIG. 37 or a terminal module 502 illustrated in FIG. 38, apart from the terminal module 500 illustrated in FIG. 34, by changing a number of the electrically conductive terminals 510 and/or a position at which each of the electrically conductive terminals 510 is inserted into the holder portion 133, in dependence on a design specification of a terminal module.

Figure 39:
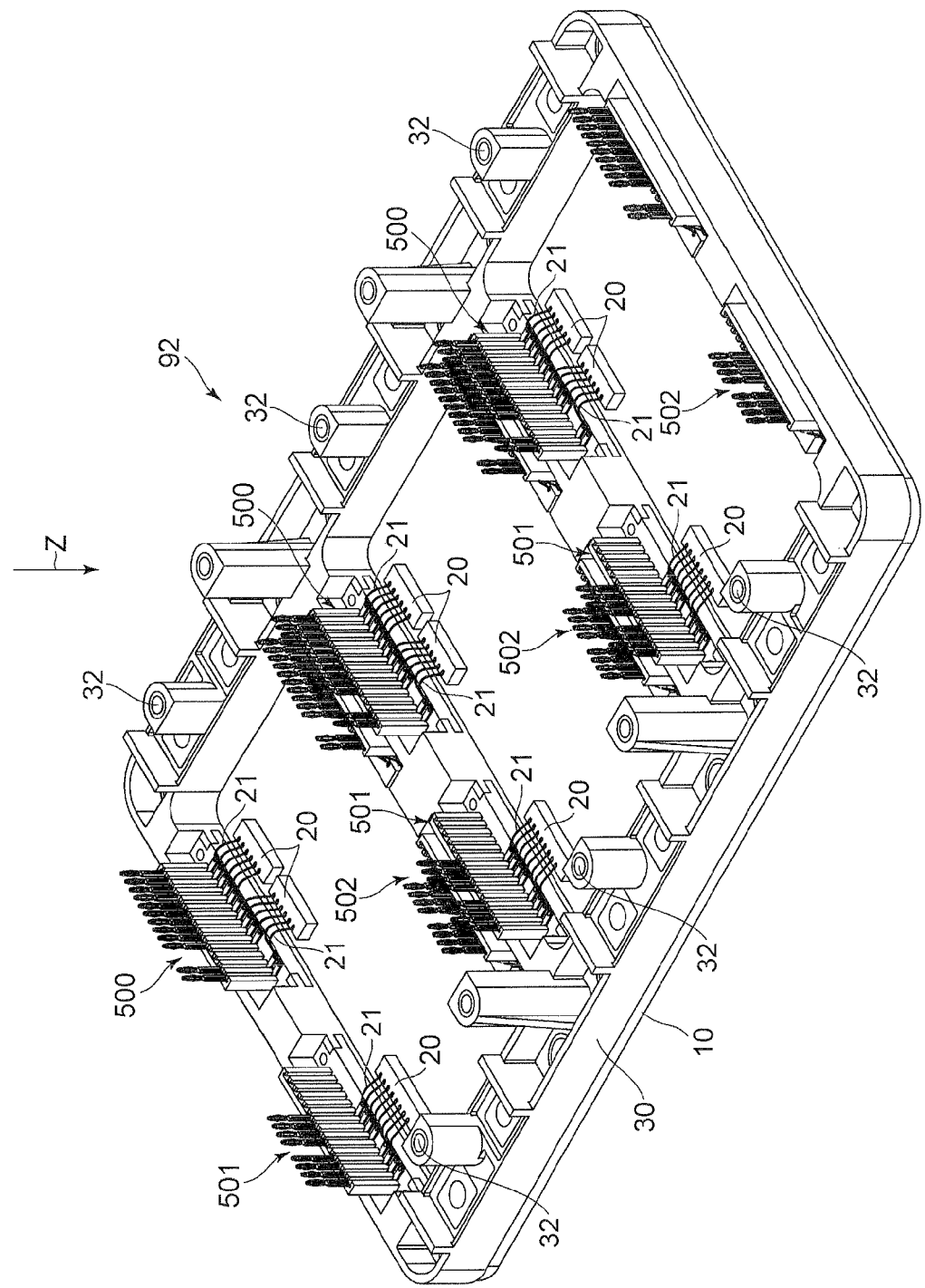
FIG. 39 is a perspective view of a part unit including a heat radiation board into which electric elements, a frame, and the terminal modules are assembled.
Figure 40:
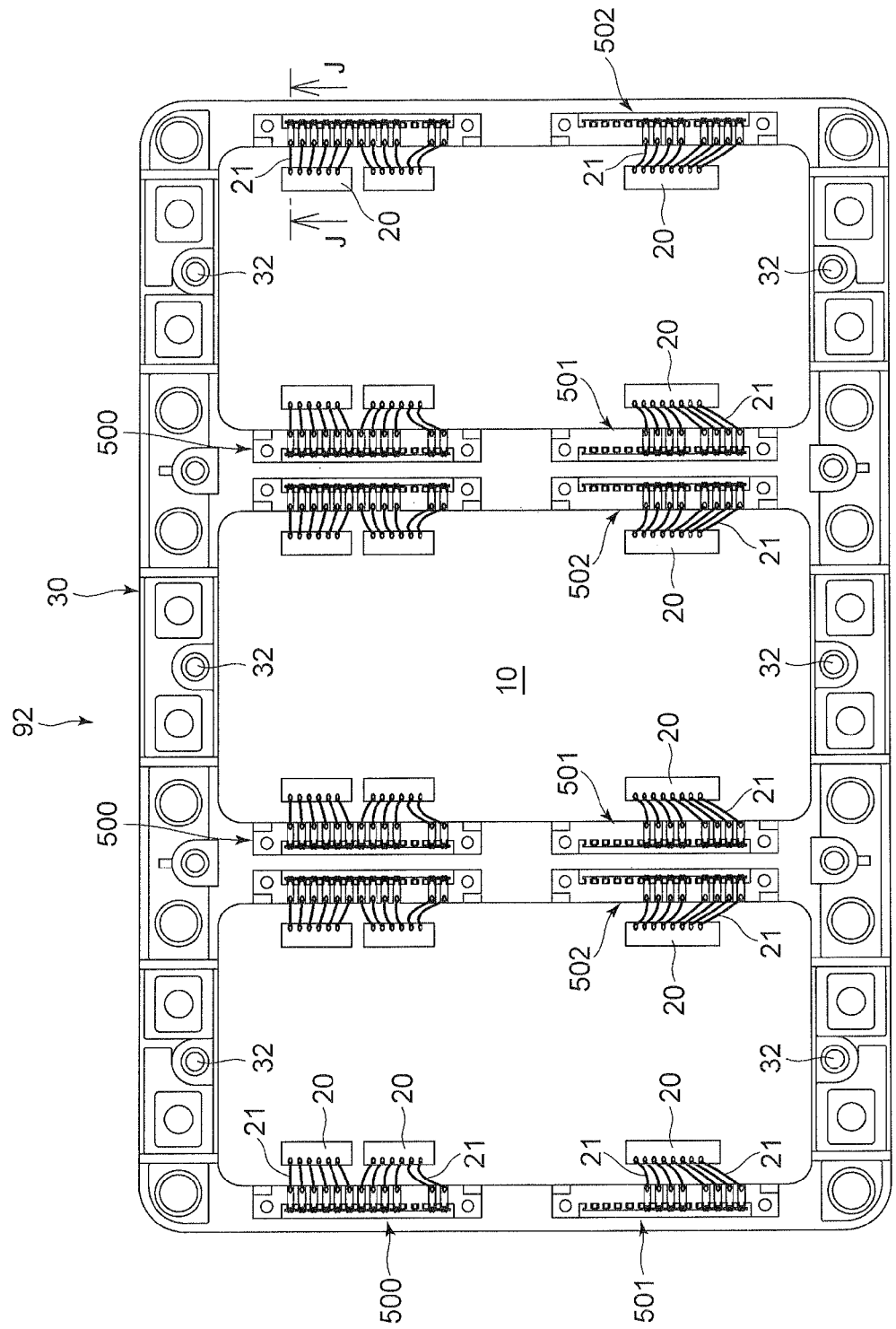
FIG. 40 is a plan view as seen in a direction Z indicated in FIG. 39.

A part unit 92 including the terminal module 500, 501 or 502 is explained hereinbelow with reference to FIGS. 39 to 41. After the frame 30 formed integral with a predetermined number of the terminal modules 500, 501 or 502 was fixed by means of an adhesive onto the heat radiation board 10 on which the electric elements 20 are mounted, the connection parts 111 of the electrically conductive terminals 510 in the terminal modules 500, 501 or 502 are electrically connected to the electric elements 20 through bonding wires 21. Thus, there is completed the part unit 92 illustrated in FIGS. 39 and 40.

As illustrated in FIGS. 34, 35 and 41, the distal end portion 512e of the contact part 512 in each of the electrically conductive terminals 510 is tapered towards a summit thereof, and the bending portion 512f having a smooth arcuate surface protruding towards a summit is located in the cut-out formed at the distal end portion 512e, ensuring that the contact part 512 can be readily inserted into the through-hole 41 of the circuit board 40. Furthermore, since each of the contact pieces 512a defining the contact part 512 has a press-fit function of being elastically expandable and shrinkable in the through-hole 41, the contact part 512 can reliably contact with the through-hole 41 of the circuit board 40.

In addition, since each of the electrically conductive terminals 510 is designed to include the flexible part 113 having a floating function, even if the electrically conductive terminal 510 and the through-hole 41 of the circuit board 40 axially slightly deviate from each other, the flexible part 113 is deformed to thereby absorb the axial deviation thereinto, and hence, the electrically conductive terminal 510 can be inserted into the through-hole 41.

Sixth Embodiment

A terminal module 600 or 601 according to the sixth embodiment of the present invention is explained hereinbelow with reference to FIGS. 42 to 44.

Parts or elements in the terminal module 600 or 601 that correspond to those of the terminal modules 200 and 500 illustrated in FIGS. 16 to 18 and 34 to 41, respectively, have been provided with the same reference numerals, operate in the same manner as corresponding parts or elements in the terminal modules 200 and 500, unless explicitly explained hereinbelow, and are not explained hereinbelow.

Figure 42:
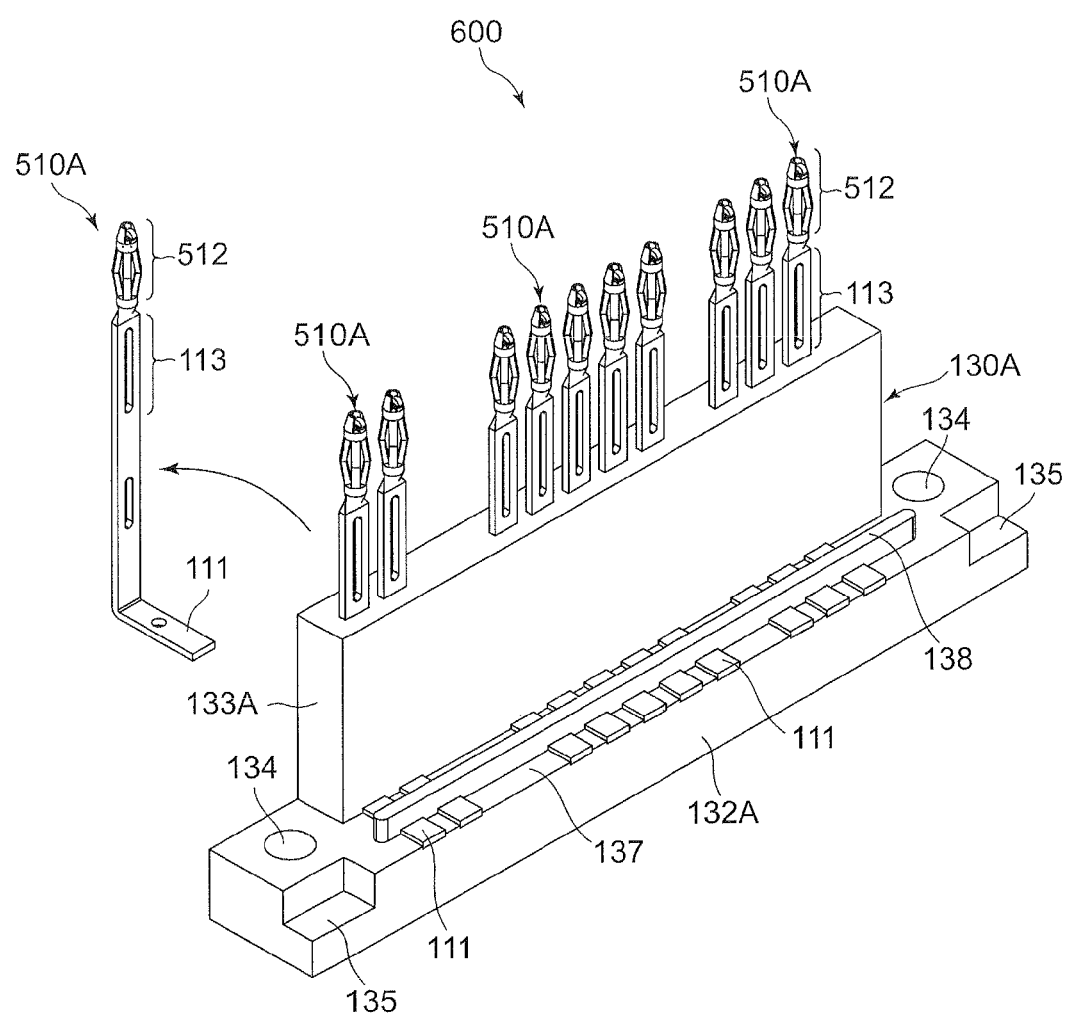
FIG. 42 is a perspective view of the terminal module according to the sixth embodiment of the present invention.
Figure 43:
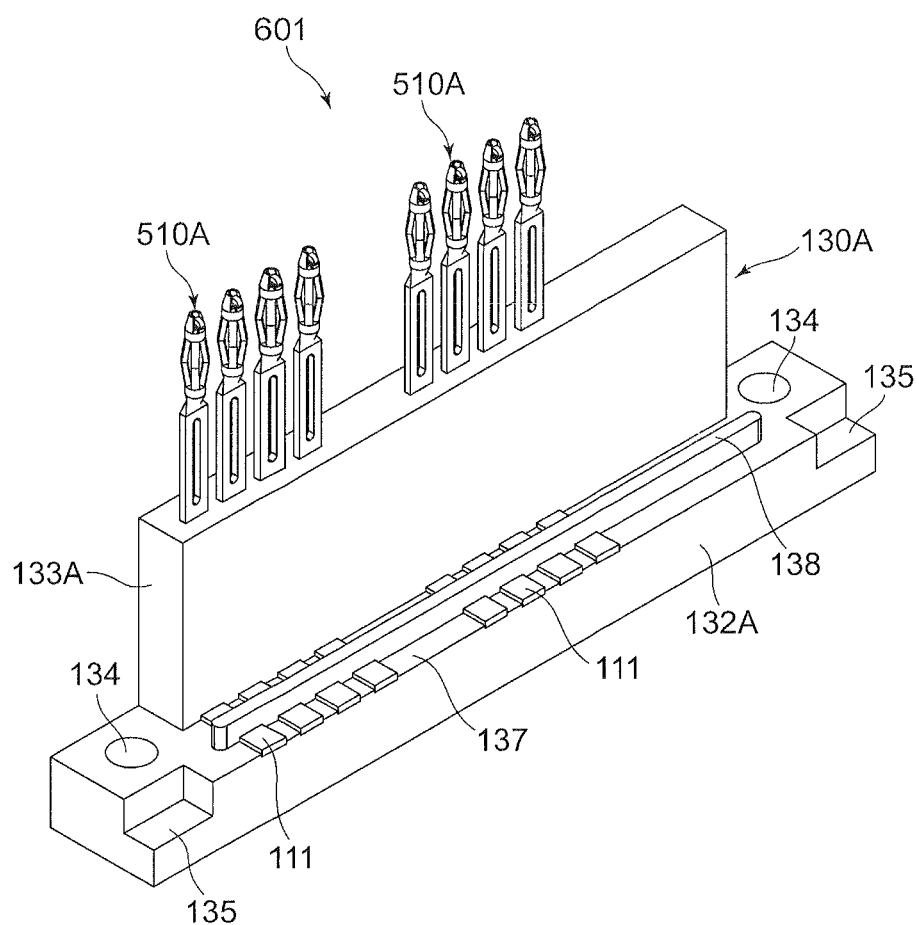
FIG. 43 is a perspective view of a terminal module including electrically conductive modules arranged in a different manner from that of the terminal module illustrated in FIG. 42.

As illustrated in FIG. 42, a plurality of electrically conductive terminals 510A is integrally fixed to a base 130A by an insertion molding process in the terminal module 600. The base 130A is formed integrally with a rib 138 extending in the direction S (see FIG. 1) to overlap a part of the connection part 111 of each of the electrically conductive terminals 510A.

Figure 44:
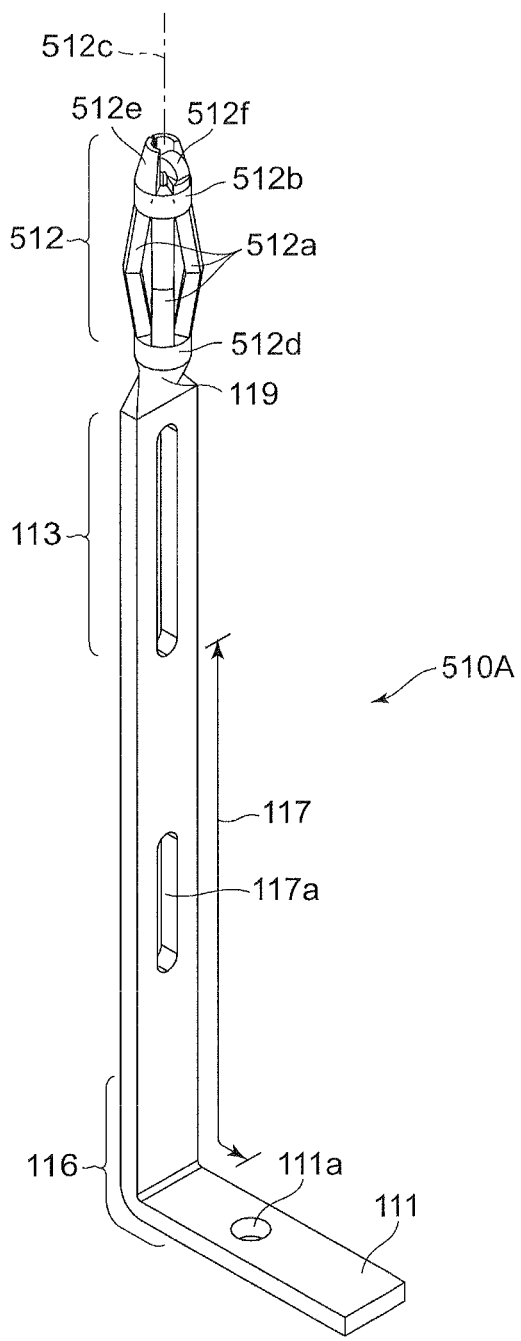
FIG. 44 is a perspective view of the electrically conductive terminal as a part of the terminal module illustrated in FIG. 42.

As illustrated in FIG. 44, each of the electrically conductive terminals 510A includes, similarly to the electrically conductive terminal 510 illustrated in FIG. 35, a contact part 512, a flexible part 113, an elbow part 116, and a connection part 111. The flexible part 313, the elbow part 116, and the connection part 111 have a constant width. An area 117 situated between the flexible part 113 and the connection part 111 is embedded in a holder portion 133A of the base 130A. The area 117 is formed with an elongate through-hole 117a, and the connection part 111 is formed with a circular through-hole 111a.

A number and a position of the electrically conductive terminals 510A can be determined in dependence on a structure and/or arrangement of the electric elements 20 (see FIG. 6). Accordingly, there may be fabricated a terminal module 601 illustrated in FIG. 43 or other terminal modules having different arrangement of the electrically conductive terminals 510A, for instance, apart from the terminal module 600 illustrated in FIG. 42. Similarly to the terminal module 500 illustrated in FIG. 34, the terminal module 600 or 601 is fabricated and used integrally with the frame 30 (see FIG. 6) by a secondary molding process.

Seventh Embodiment

A terminal module 700 according to the seventh embodiment of the present invention is explained hereinbelow with reference to FIGS. 45 to 52.

Parts or elements in the terminal module 700 that correspond to those of the above-mentioned terminal module 500 illustrated in FIGS. 34 to 41 have been provided with the same reference numerals, operate in the same manner as corresponding parts or elements in the terminal module 500, unless explicitly explained hereinbelow, and are not explained hereinbelow.

Figure 45:
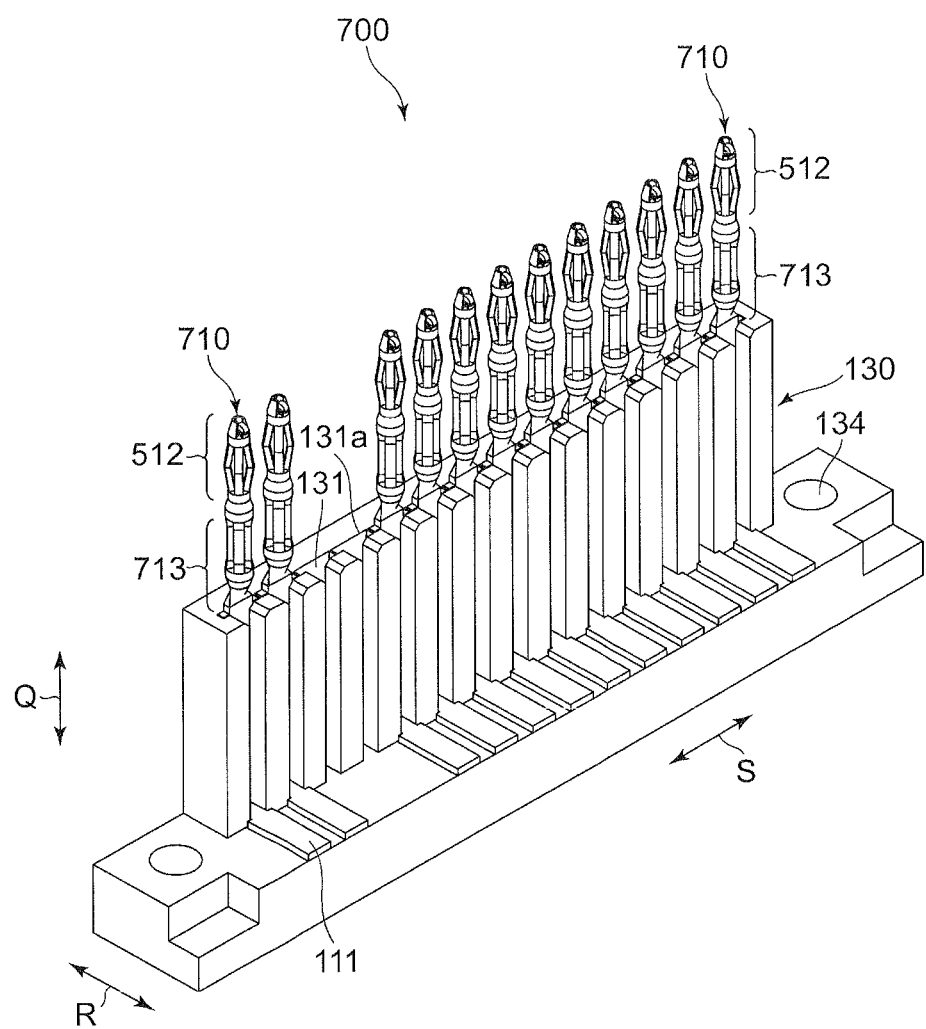
FIG. 45 is a perspective view of the terminal module according to the seventh embodiment of the present invention.
Figure 46:
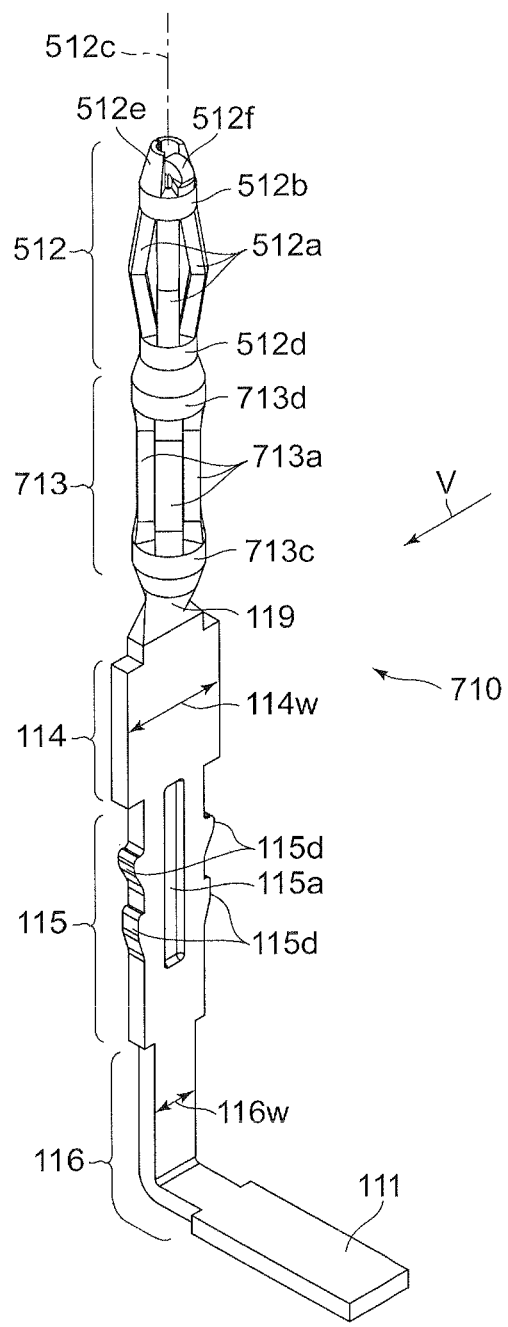
FIG. 46 is a perspective view of the electrically conductive terminal as a part of the terminal module illustrated in FIG. 45.

As illustrated in FIGS. 45 and 46, the terminal module 700 includes a plurality of electrically conductive terminals 710, and an electrically insulative base 130. Each of the electrically conductive terminals 710 includes a connection part 111 through which the electrically conductive terminal 710 is electrically connected to the electric element 20, and a contact part 512 to be inserted into the through-hole 41 of the circuit board 40. The base 130 holds a part of each of the electrically conductive terminals 710 to keep the electrically conductive terminals 710 in a constant posture. Each of the electrically conductive terminals 710 further includes a flexible part 713 located below the contact part 512. When each of the electrically conductive terminals 710 is inserted into the base 130, the contact part 512 and the flexible part 713 upwardly protrude from the base, as illustrated in FIG. 45.

Figure 47:
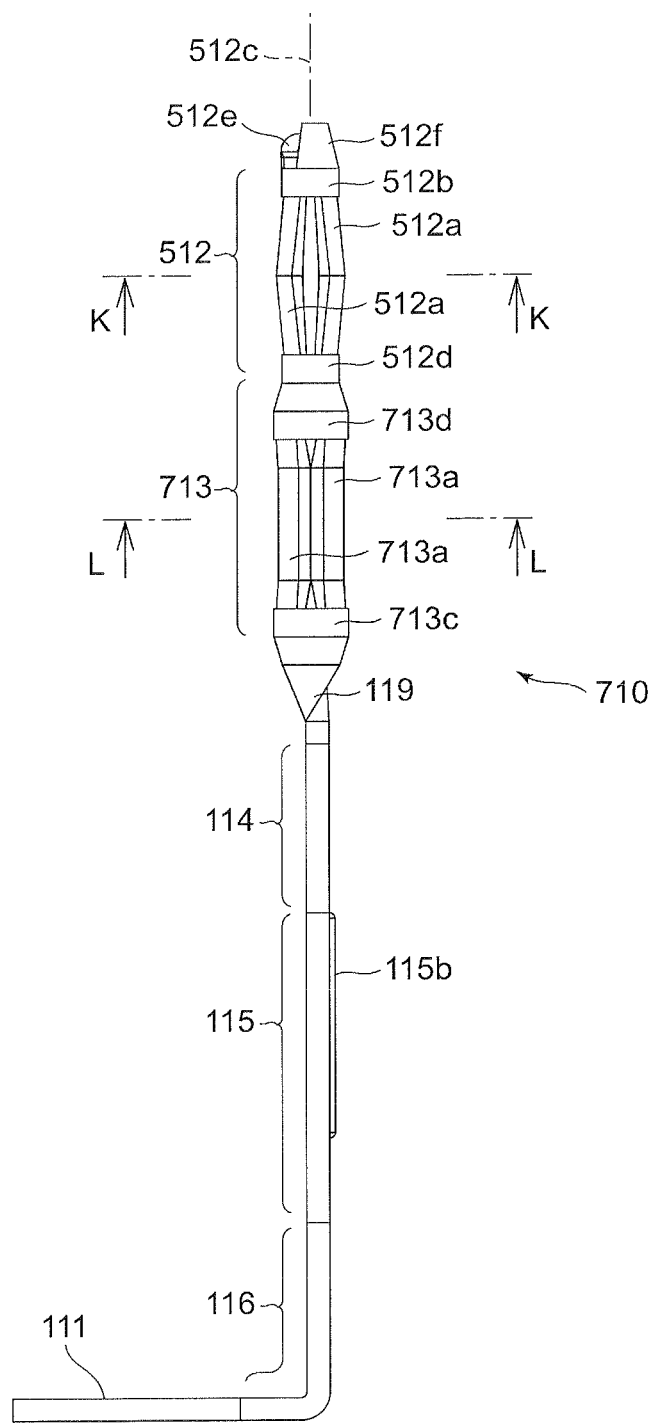
FIG. 47 is a plan view as seen in a direction V indicated in FIG. 46.
Figure 48:
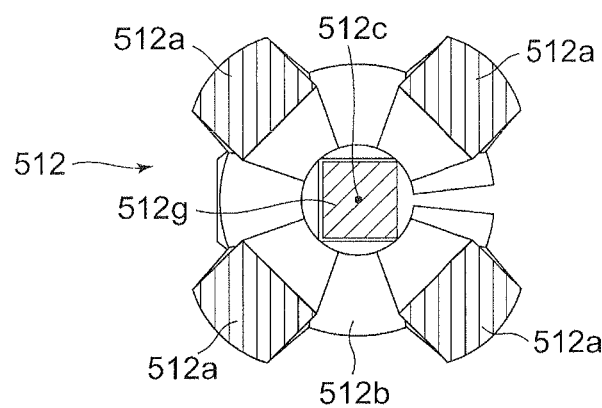
FIG. 48 is a cross-sectional view taken along the line K-K shown in FIG. 47.

As illustrated in FIGS. 46 to 49, each of the electrically conductive terminals 710 can be fabricated of an electrically conductive and elastic metal sheet through pressing and bending processes. Each of the electrically conductive terminals 710 is shaped substantially in an L-shape at its entirety. Each of the electrically conductive terminals 710 has a contact part 512 at an upper end of a vertical portion of the L-shape, and a connection part 111 at a distal end of a horizontal portion of the L-shape. Each of the electrically conductive terminals 710 includes a flexible part 713, a holding part 114, an engagement part 115, and an elbow part 116 in this order from the contact part 512 to the connection part 111. The contact part 512, the holding part 114, the engagement part 115, the elbow part 116, and the connection part 111 are identical in both a shape and a function with those of the electrically conductive terminal 510 illustrated in FIG. 35. As illustrated in FIG. 47, the engagement part 115 is formed with a projection 115b on a reverse side of the recess 115a.

Figure 49:
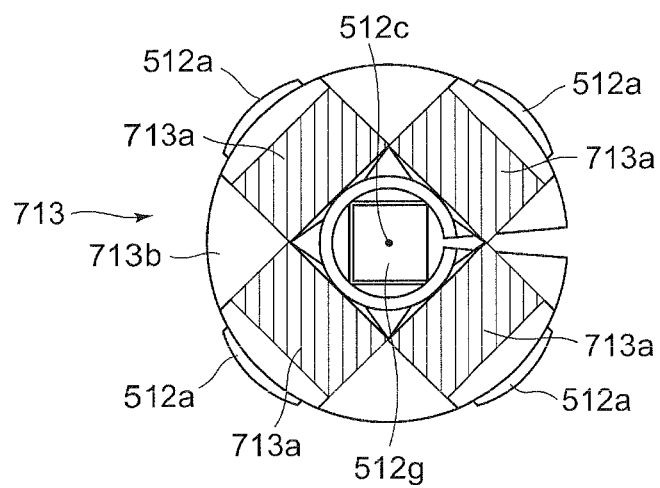
FIG. 49 is a cross-sectional view taken along the line L-L shown in FIG. 47.

As illustrated in FIGS. 46, 47 and 49, the flexible part 713 is constituted of a plurality of flexible pieces 713a each having a shape of a square pole and circumferentially equally spaced away from one another around an imaginary axis 512c. The flexible pieces 713a are bound at upper and lower ends thereof with C-shaped binders 713d and 713c. The upper binder 713d is tapered towards the contact part 512 and is continuous to the lower binder 512d of the contact part 512. The lower binder 713c is tapered towards the holding part 114 and is continuous to the twisted portion 119.

The flexible pieces 713a defining the flexible part 713 are designed to be elastically more deformable than the rest of the electrically conductive terminal 710, and accordingly, the flexible part 713 is firstly deformed when an external force is exerted on the contact part 512 in a direction intersecting with the imaginary axis 512c. Thus, the flexible part 713 defines a floating system.

Figure 50:
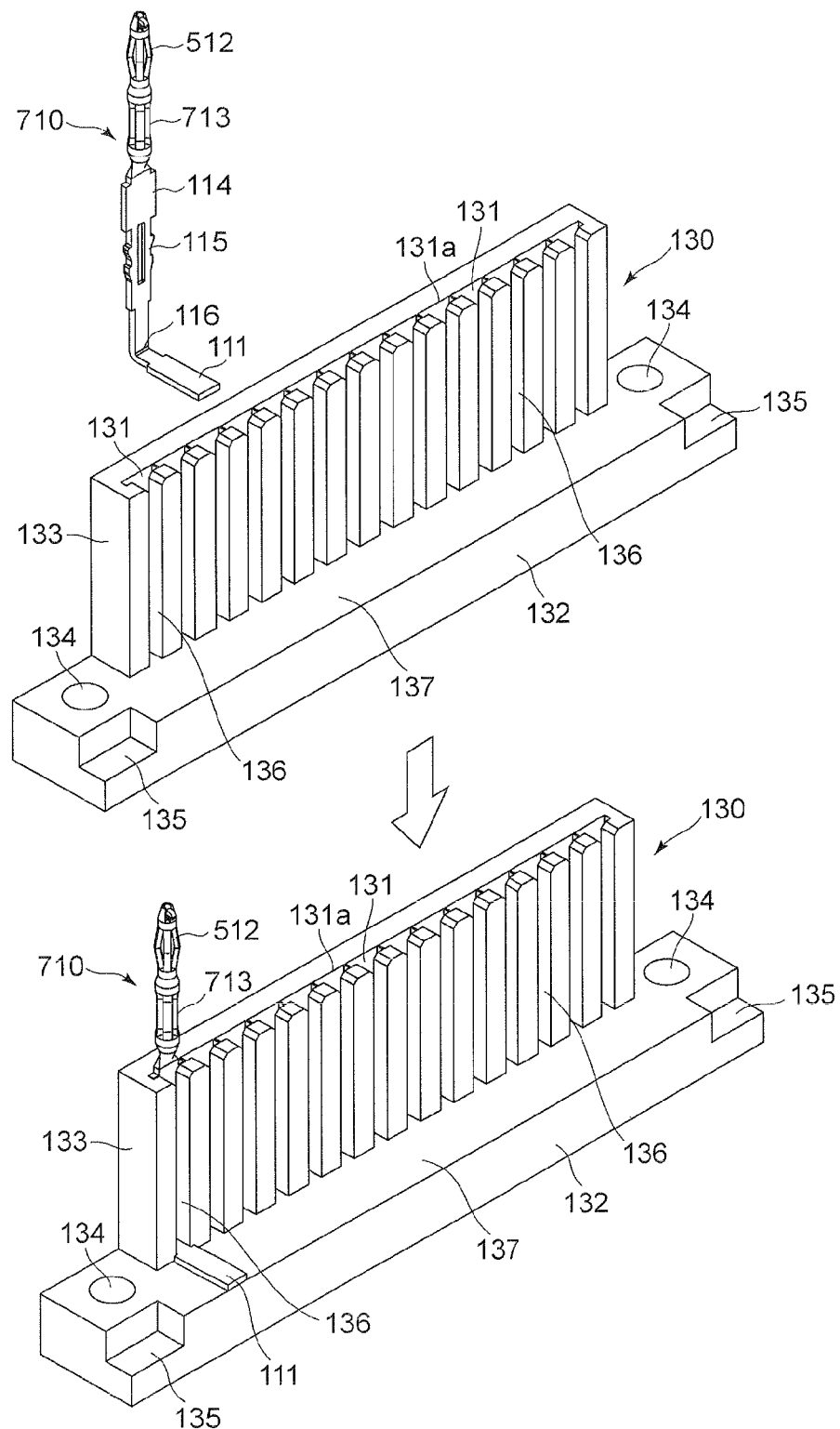
FIG. 50 shows steps of assembling the terminal module illustrated in FIG. 45.

As illustrated in FIG. 50, the terminal module 700 illustrated in FIG. 45 is fabricated by inserting the electrically conductive terminals 710 into the paths 131 vertically extending through the holder portion 133 of the base 130. After the electrically conductive terminal 710 has been inserted fully into the path 131, the contact part 512 and the flexible part 713 upwardly protrude beyond the base 130 through the upper open end 131a of the path 131, and the connection part 111 contacts at a lower surface thereof with the flat portion 137 of the basement portion 132.

Figure 51:
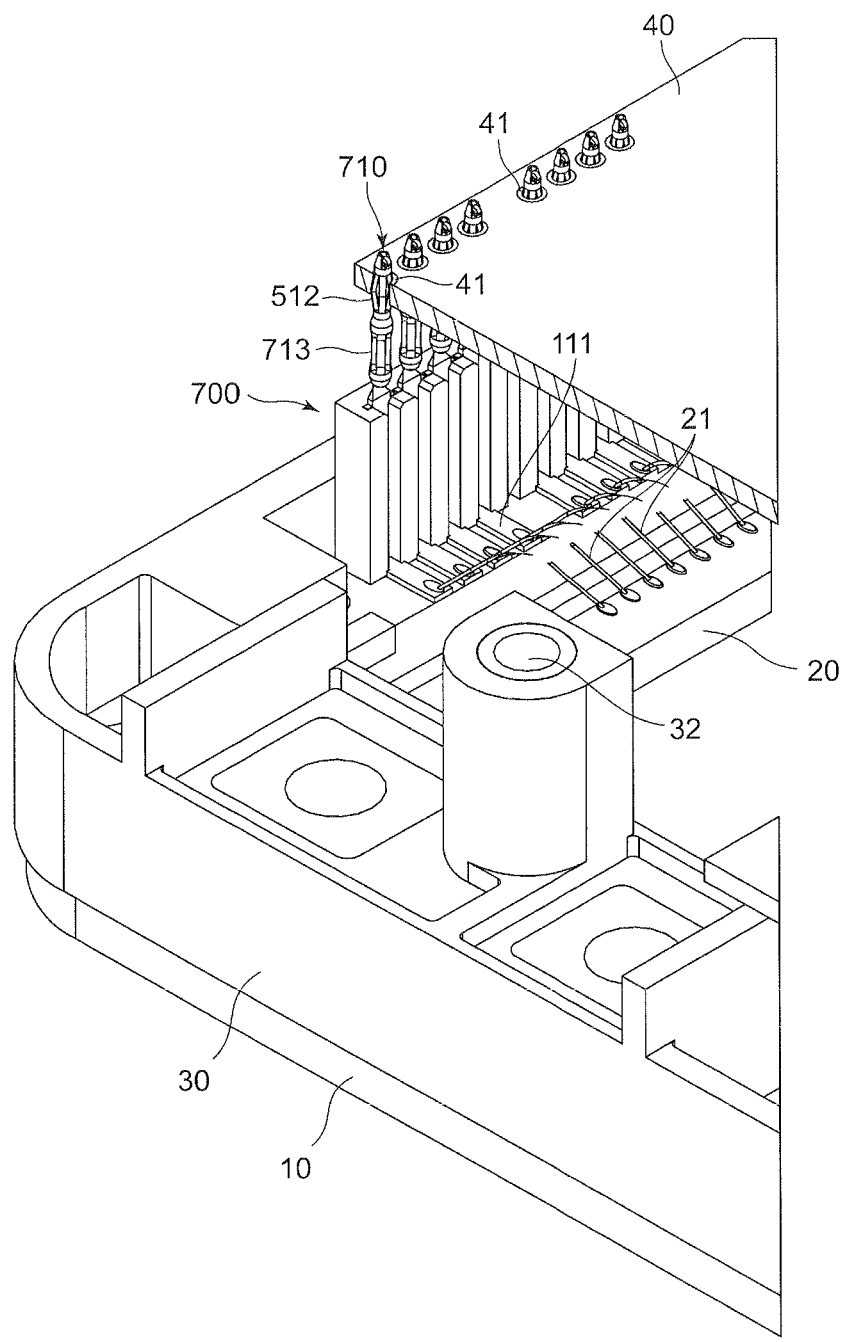
FIG. 51 is a perspective view illustrating the terminal module illustrated in FIG. 45 to be assembled into a partially illustrated frame.

As illustrated in FIG. 51, the frame 30 with which the terminal module 700 is formed integral by a secondary molding process is adhered to the heat radiation board 10 on which the electric elements 20 are mounted, and then, the connection parts 111 of the electrically conductive terminals 710 and the electric elements 20 are electrically connected to each other through bonding wires 21. Thereafter, the circuit board 40 is joined to the frame 30 such that the circuit board 40 is situated above the frame 30. The contact parts 512 of the electrically conductive terminals 710 are inserted into the through-holes 41 of the circuit board 40. Since the contact part 512 has the press-fit function, the contact part 512 reliably contacts with an inner surface of the through-hole 41.

Figure 52:
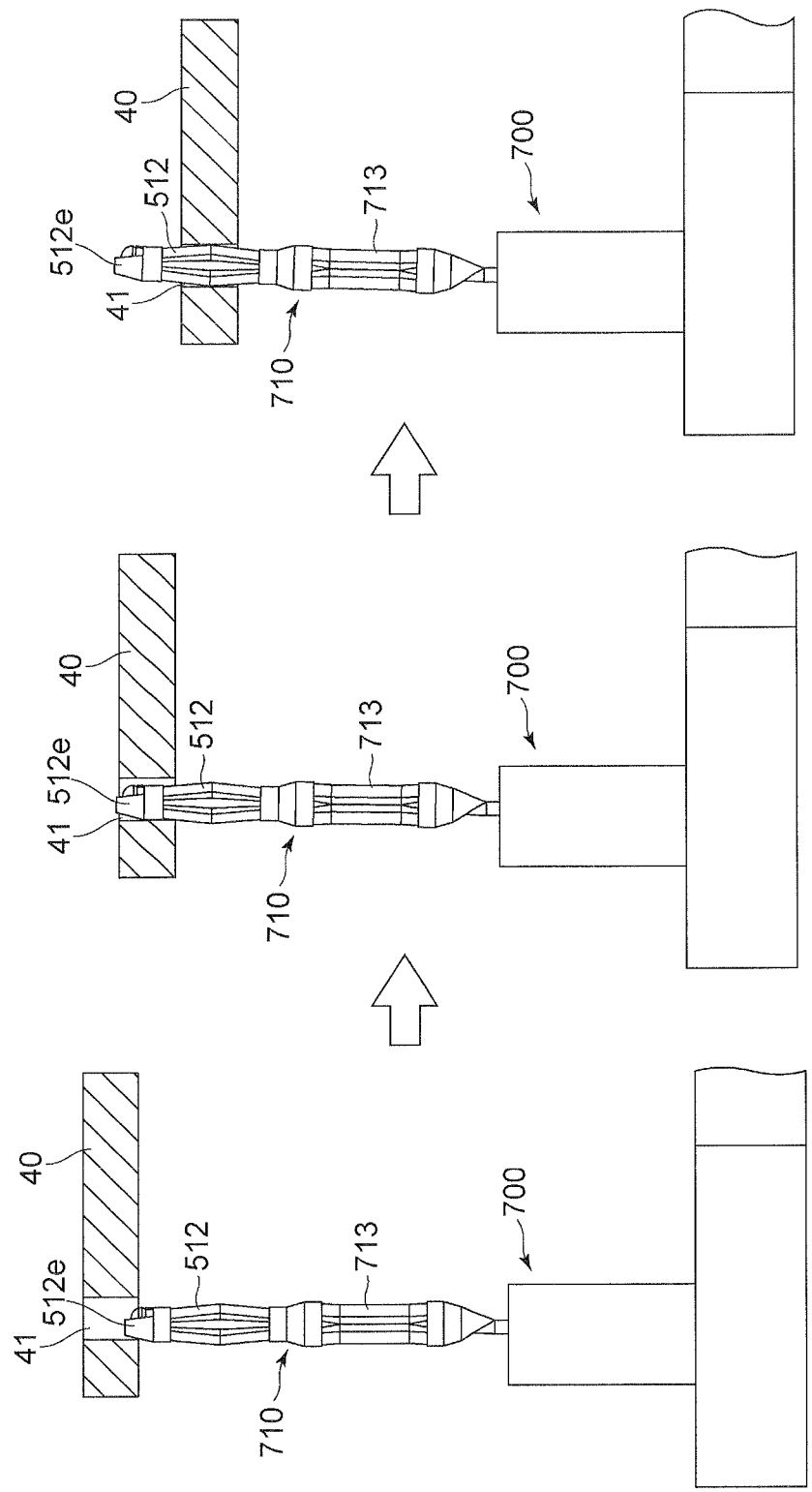
FIG. 52 shows steps of inserting the electrically conductive terminal used in the terminal module according to the seventh embodiment, into a through-hole of a circuit board.

Since the flexible part 713 of the electrically conductive terminal 710 has a function of floating, as illustrated in FIG. 52, even if the electrically conductive terminal 710 and the through-hole 41 axially deviate from each other, the flexible part 713 can absorb the axial deviation, and hence, the electrically conductive terminal 710 can be surely fit into the through-hole 41. Specifically, since the distal end portion 512e of the contact part 512 in each of the electrically conductive terminals 710 is designed to be tapered, the distal end portion 512e is able to contact with an inner surface of the through-hole 41 axially deviating from the electrically conductive terminal 710, and thus, the contact part 512 can be smoothly inserted into the through-hole 41. While the insertion of the distal end portion 512e into the through-hole 41, the flexible part 713 is elastically deformed by a compressive force exerted onto the contact part 512 from the through-hole 41, and hence, the flexible part 713 can absorb the axial deviation.

Eighth Embodiment

A terminal module 701 or 702 according to the eighth embodiment of the present invention is explained hereinbelow with reference to FIGS. 53 to 55.

Parts or elements in the terminal module 701 or 702 that correspond to those of the terminal modules 600 and 700 illustrated in FIGS. 42 to 44 and 45 to 47, respectively, have been provided with the same reference numerals, operate in the same manner as corresponding parts or elements in the terminal modules 600 and 700, unless explicitly explained hereinbelow, and are not explained hereinbelow.

Figure 53:
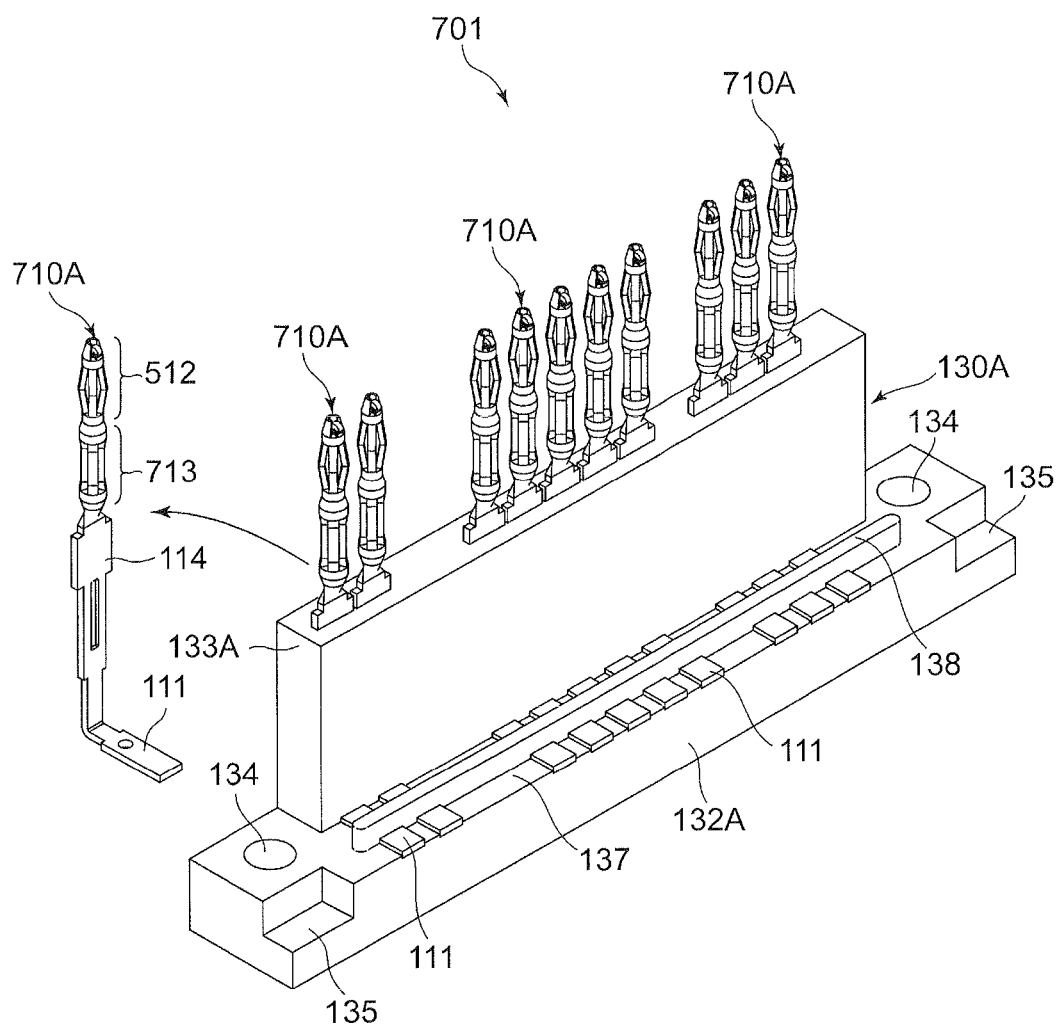
FIG. 53 is a perspective view of the terminal module according to the eighth embodiment of the present invention.
Figure 54:
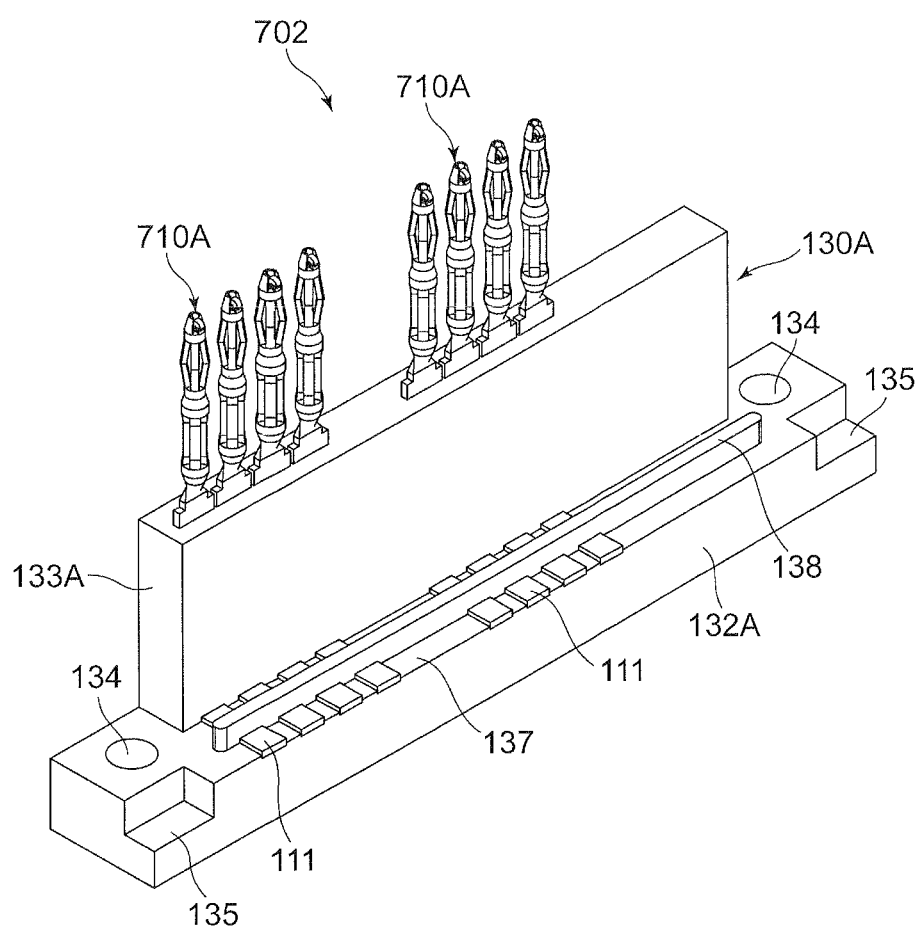
FIG. 54 is a perspective view of a terminal module including electrically conductive modules arranged in a different manner from that of the terminal module illustrated in FIG. 54.

As illustrated in FIG. 53, a plurality of electrically conductive terminals 710A is integrally fixed to a base 130A by an insertion molding process in the terminal module 701. The base 130A is formed integrally with a rib 138 extending in the direction S (see FIG. 1) to overlap a part of the connection part 111 of each of the electrically conductive terminals 710A.

Figure 55:
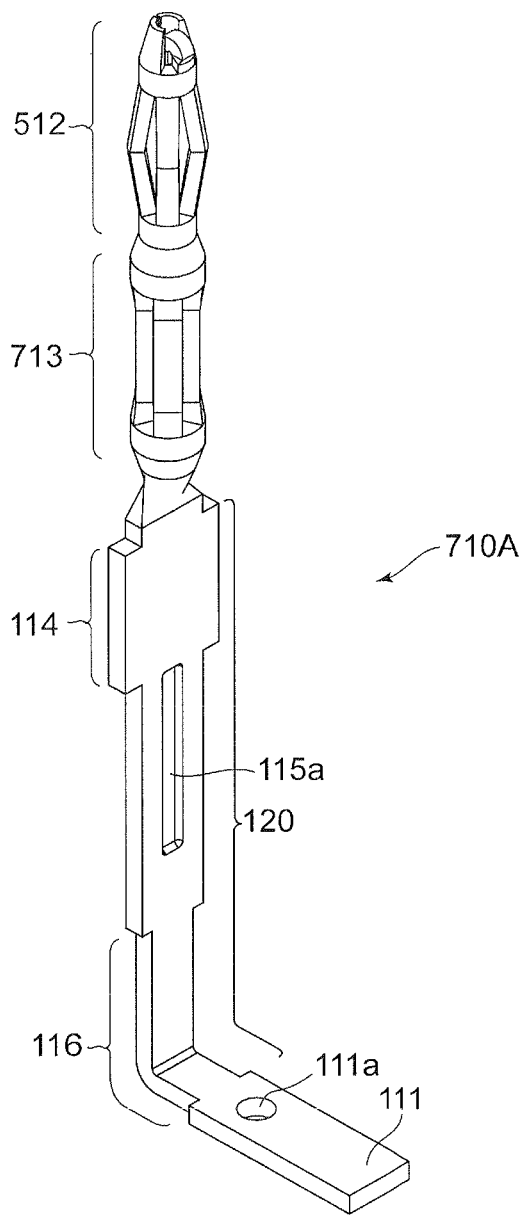
FIG. 55 is a perspective view of the electrically conductive terminal as a part of the terminal module illustrated in FIG. 53.

As illustrated in FIG. 55, each of the electrically conductive terminals 710A includes, similarly to the electrically conductive terminal 710 illustrated in FIG. 46, a contact part 512, a flexible part 713, an elbow part 116, and a connection part 111. An area 120 extending from an upper end of the holding part 114 to a lower end of the elbow part 116 is embedded in a holder portion 133A of the base 130A. The area 120 is formed with an elongate recess 115a.

A number and a position of the electrically conductive terminals 710A can be determined in dependence on a structure and/or arrangement of the electric elements 20 (see FIG. 6). Accordingly, there may be fabricated a terminal module 702 illustrated in FIG. 54 or other terminal modules having different arrangement of the electrically conductive terminals 710A, for instance, apart from the terminal module 701 illustrated in FIG. 53. Similarly to the terminal module 700 illustrated in FIG. 45, the terminal module 701 or 702 is fabricated and used integrally with the frame 30 (see FIG. 6) by a secondary molding process.

Ninth Embodiment

A terminal module 800 according to the ninth embodiment of the present invention is explained hereinbelow with reference to FIGS. 56 to 60.

Parts or elements in the terminal module 800 illustrated in FIGS. 56 to 60 that correspond to those of the terminal module 500 illustrated in FIG. 34 have been provided with the same reference numerals, operate in the same manner as corresponding parts or elements in the terminal module 500, unless explicitly explained hereinbelow, and are not explained hereinbelow.

Figure 56:
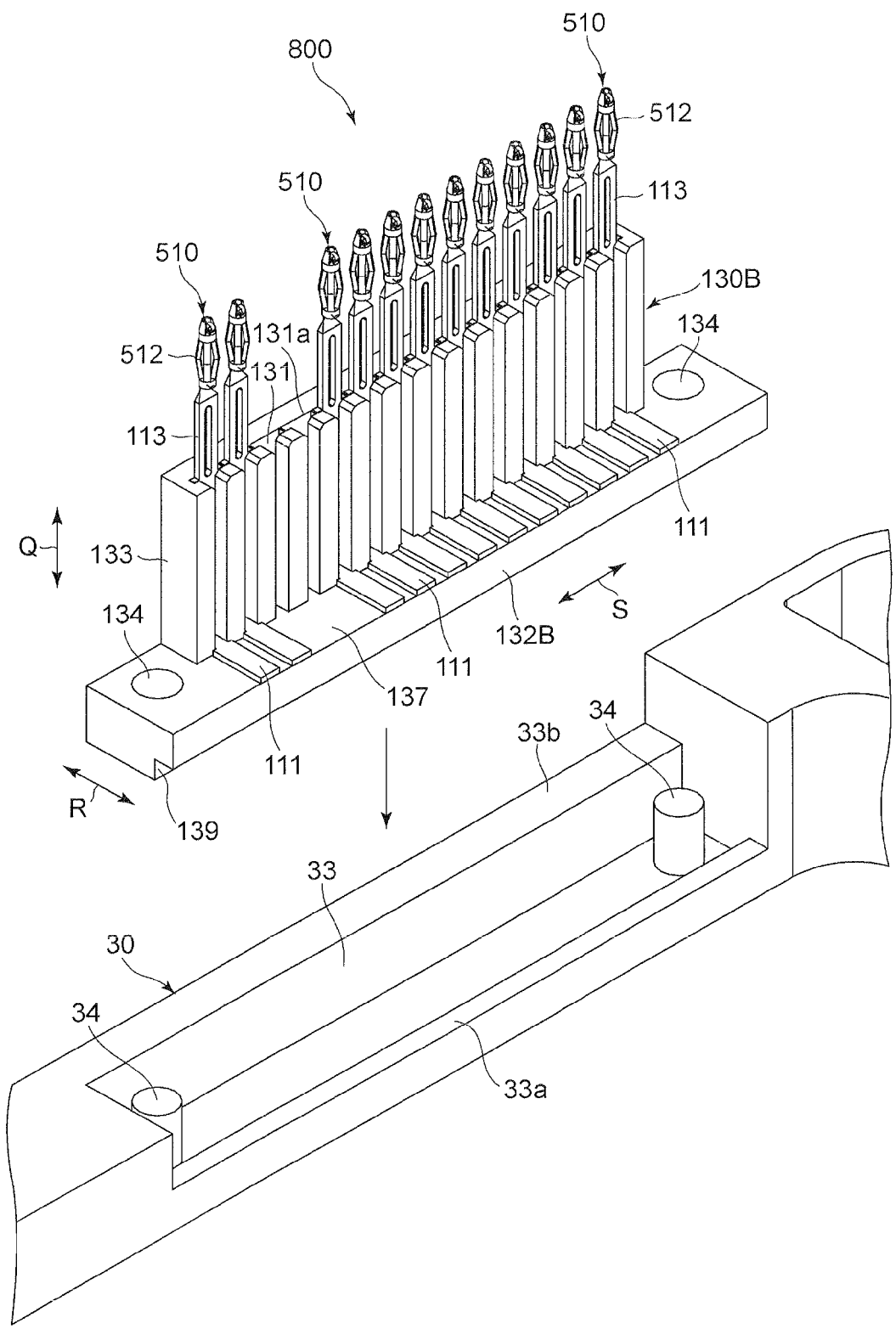
FIG. 56 is a perspective view illustrating the terminal module according to the ninth embodiment of the present invention, to be assembled into a partially illustrated frame.
Figure 57:
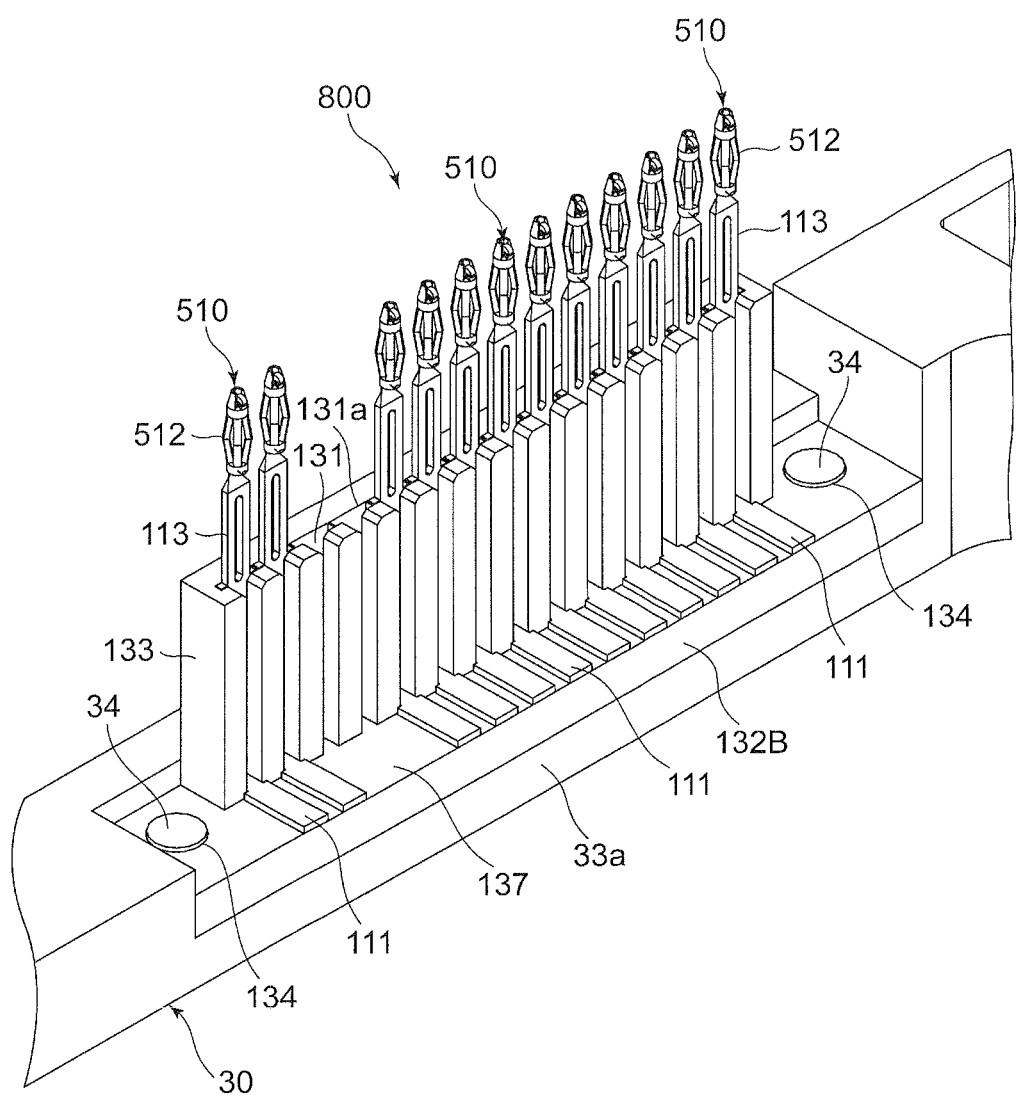
FIG. 57 is a perspective view illustrating the terminal module illustrated in FIG. 56 having been assembled into a partially illustrated frame.

As illustrated in FIGS. 56 and 57, the terminal module 800 is fixedly welded to the frame 30. A basement portion 132B of a base 130B is formed at a lower surface thereof and at a front thereof with a stepped portion 139 extending in the direction S (see FIG. 1). The stepped portion 139 is recessed toward a rear from a front of the basement portion 132B.

As illustrated in FIG. 56, the frame 30 is formed with a space 33 into which the basement portion 132B of the terminal module 800 can be fit. The space 33 has a front wall 33a lower than a rear wall 33b, and is formed on a bottom thereof with a pair of cylindrical projections 34 in the vicinity of opposite ends thereof in the direction S.

As illustrated in FIG. 57, when the basement portion 132B of the terminal module 800 is fit into the space 33, the projections 34 are fit into the through-holes 134 of the basement portion 132B, and the front wall 33a is fit into the stepped portion 139. Thereafter, a portion of each of the projections 34 upwardly protruding beyond the flat portion 137 is welded and collapsed to thereby integrally fix the terminal module 800 to the frame 30.

Figure 58:
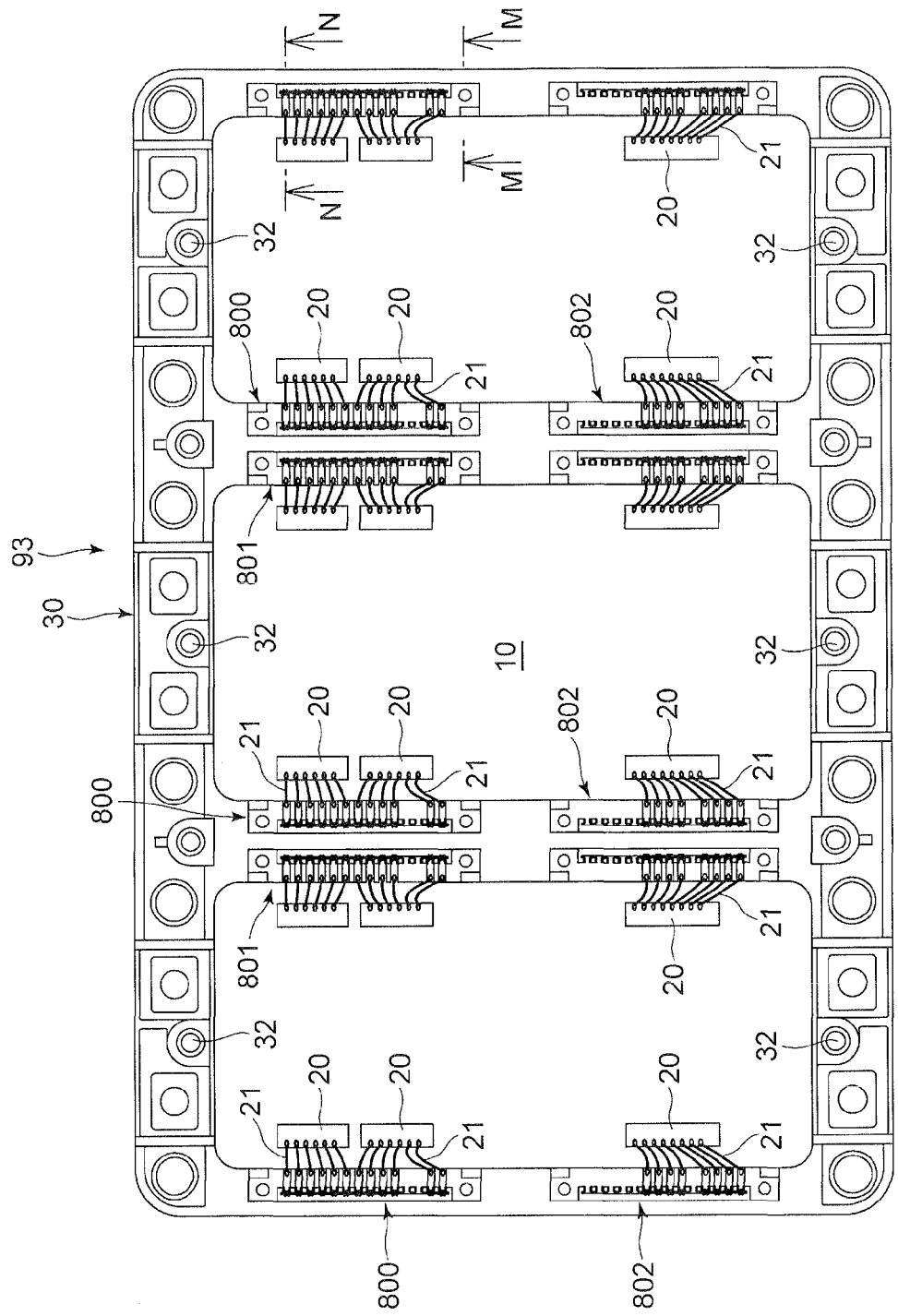
FIG. 58 is a plan view illustrating the part unit having been completed through the steps shown in FIG. 56.
Figure 59:
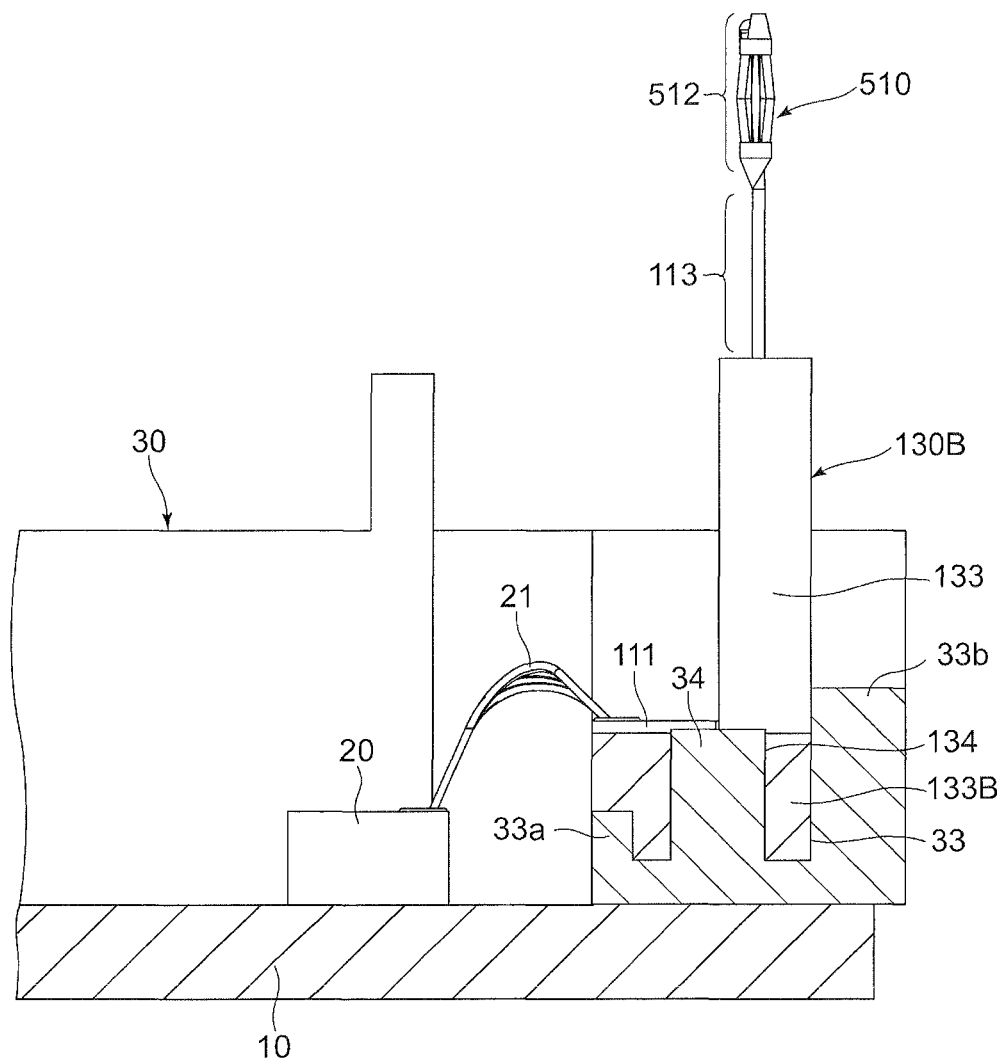
FIG. 59 is a cross-sectional view taken along the line M-M shown in FIG. 58.
Figure 60:
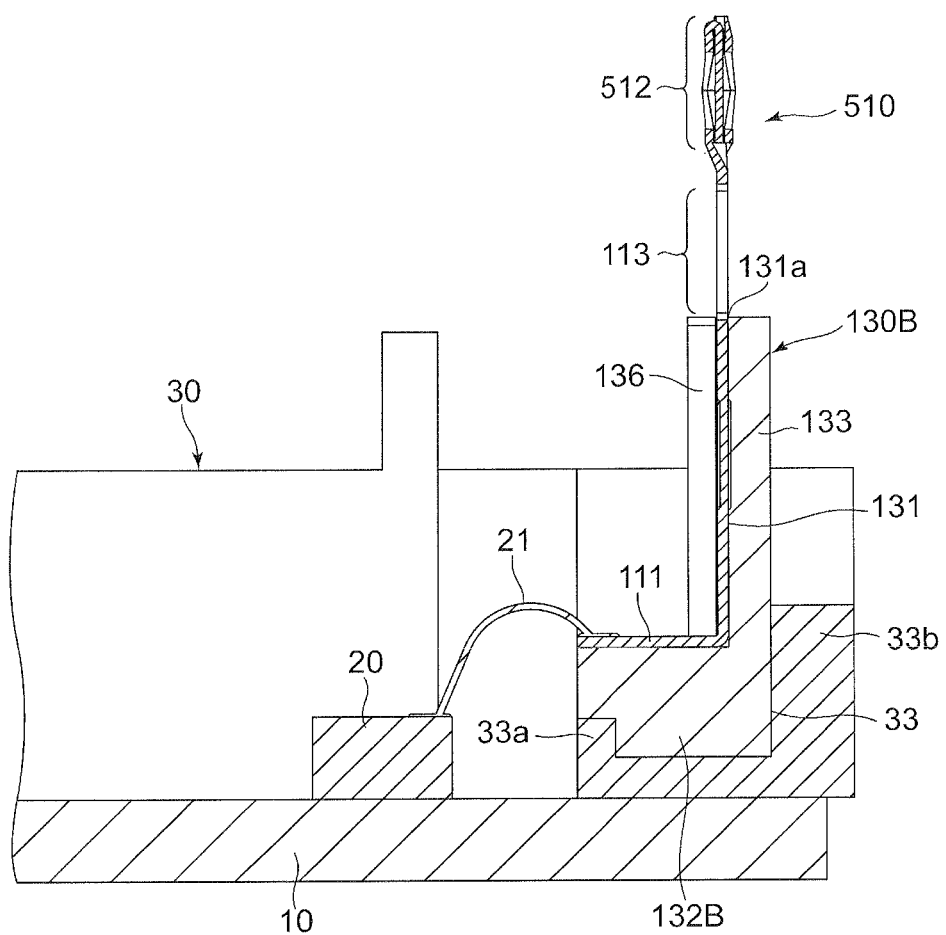
FIG. 60 is a cross-sectional view taken along the line N-N shown in FIG. 58.

As illustrated in FIG. 58, the frame 30 to which the terminal module 800 or a terminal module 801 having a different arrangement of the electrically conductive terminals 510 from the same of the terminal module 800 is welded and fixed is fixed to the heat radiation board 10 by means of an adhesive, and then, the electric elements 20 mounted on the heat radiation board 10 and the connection parts 111 of the electrically conductive terminals 510 are electrically connected to each other through the bonding wires 21. Thus, there is completed a part unit 93.

Tenth Embodiment

A terminal module 850 according to the tenth embodiment of the present invention is explained hereinbelow with reference to FIGS. 61 to 67.

Parts or elements in the terminal module 850 illustrated in FIGS. 61 to 67 that correspond to those of the terminal module 800 illustrated in FIGS. 56 and 57 have been provided with the same reference numerals, operate in the same manner as corresponding parts or elements in the terminal module 800, unless explicitly explained hereinbelow, and are not explained hereinbelow.

Figure 61:
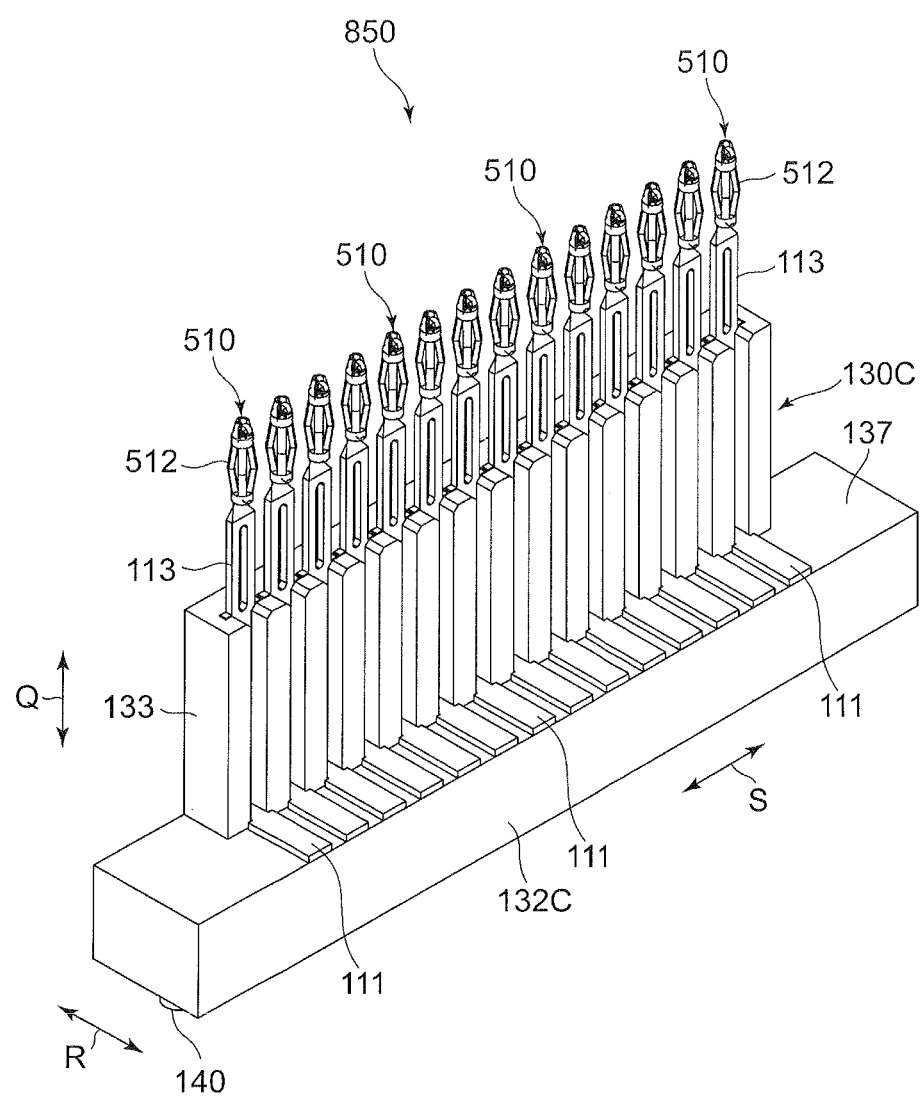
FIG. 61 is a perspective view of the terminal module according to the tenth embodiment of the present invention.
Figure 62:
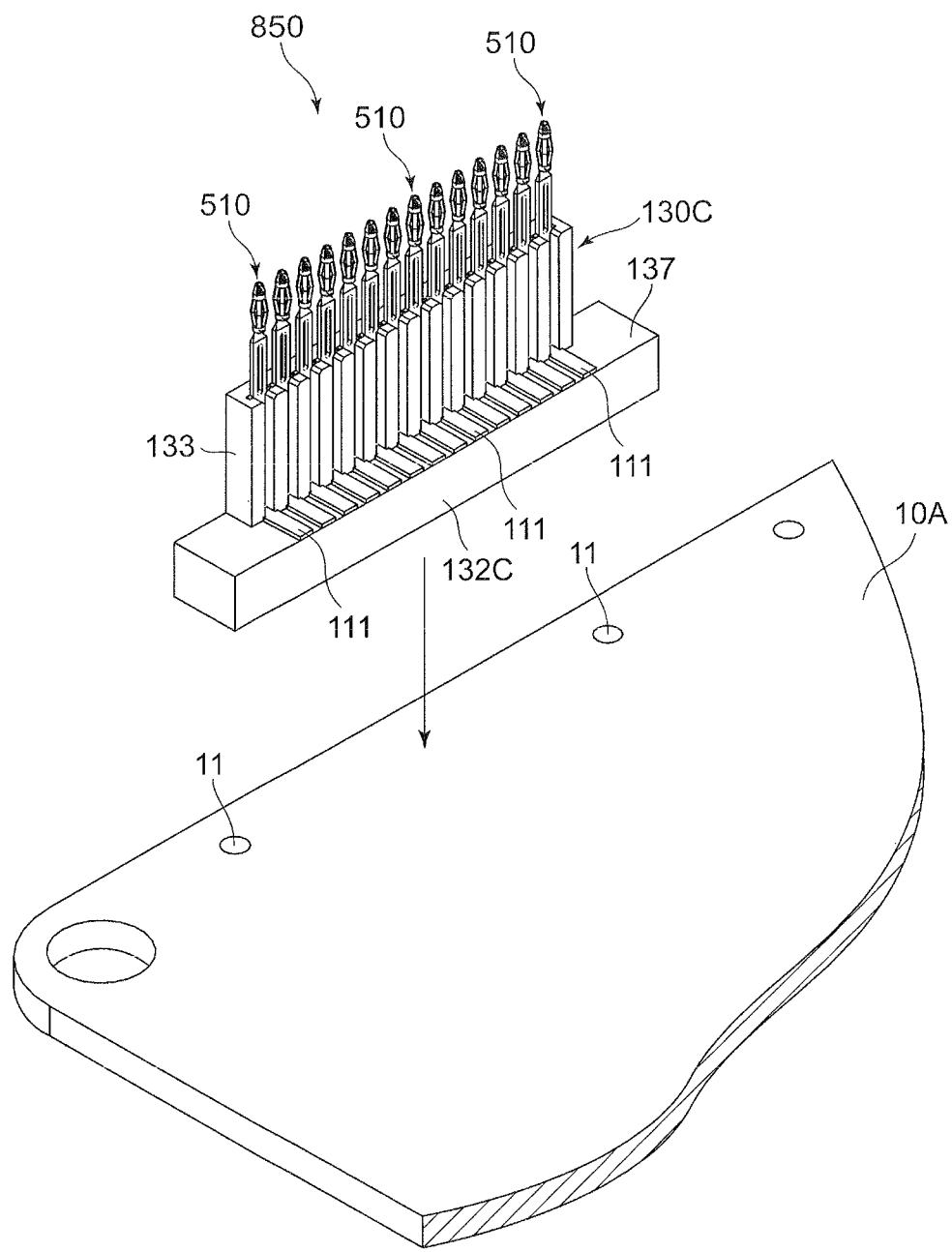
FIG. 62 is a partial perspective view showing a step of fixing the terminal module illustrated in FIG. 61 onto a heat radiation board.

As illustrated in FIGS. 61 and 62, the terminal module 850 is fixed onto a heat radiation board 10A by means of an adhesive. A basement portion 132C of a base 130C is formed on a lower surface and in the vicinity of opposite ends thereof in the direction S (see FIG. 1) with a pair of projections 140 having a shape of a truncated cone (see FIG. 67).

Figure 67:
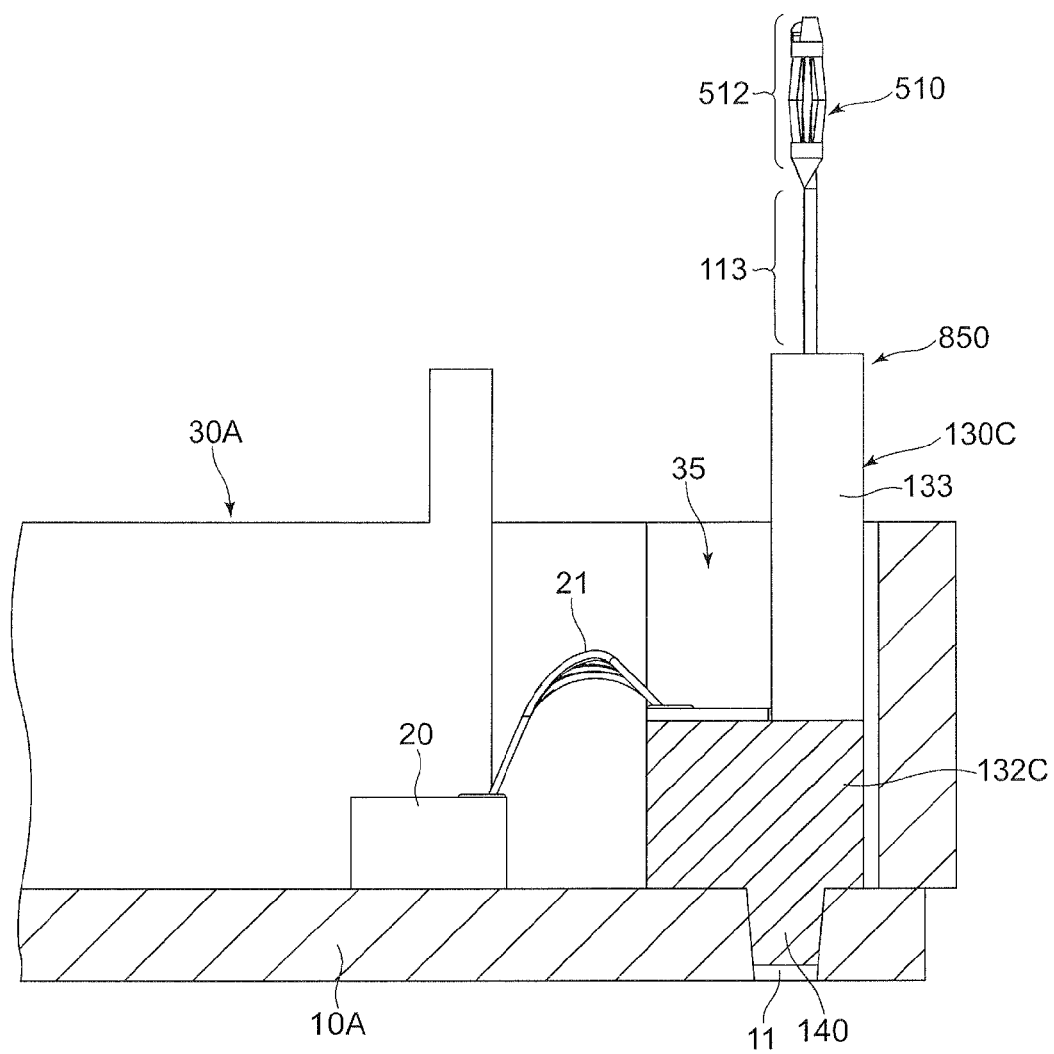
FIG. 67 is a cross-sectional view taken along the line P-P shown in FIG. 66.

As illustrated in FIG. 62, the heat radiation board 10A is formed with a pair of through-holes 11 for positioning the terminal module 850. The projections 140 formed at a lower surface of the basement portion 132C are fit-able into the through-hole 11. As illustrated in FIG. 67, each of the through-holes 11 has a trapezoidal cross-section having a diameter reducing towards a bottom. Thus, when the projections 140 having a shape of a truncated cone are fit into the through-holes 11, the projections 140 can closely contact at an outer surface thereof with an inner surface of the through-holes 11.

Figure 63:
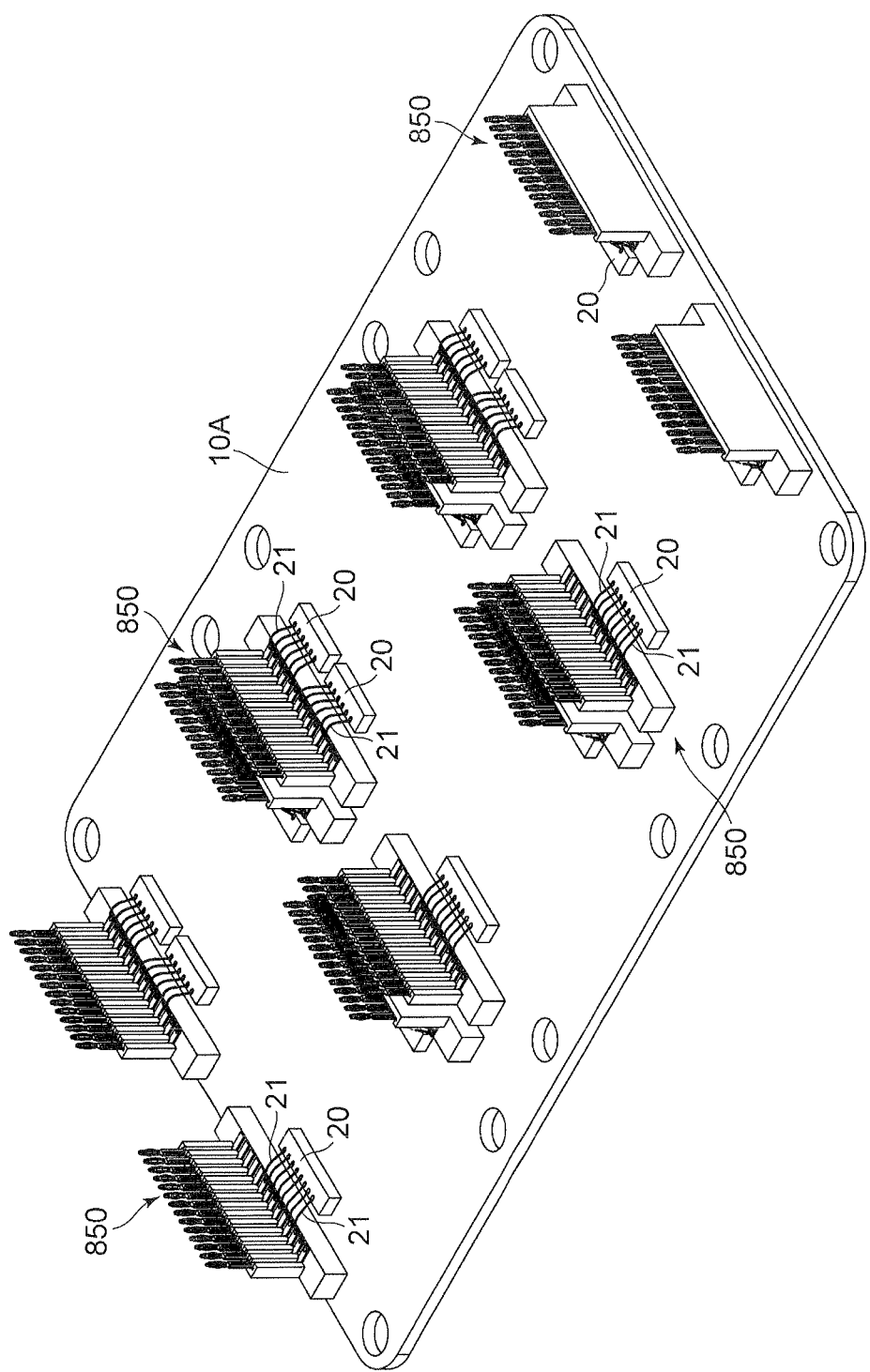
FIG. 63 is a perspective view of a heat radiation board on which electric elements and the terminal modules are mounted.
Figure 65:
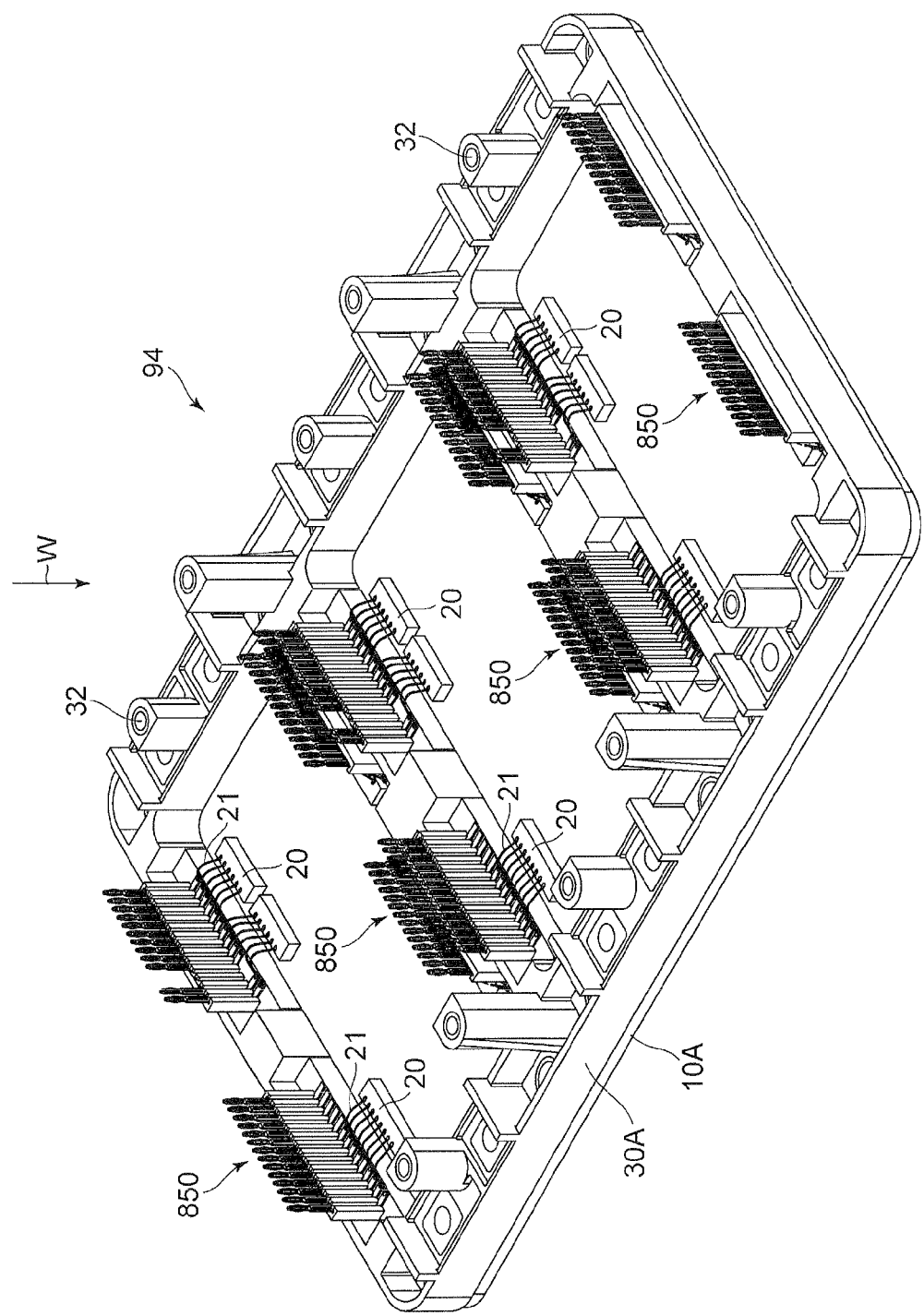
FIG. 65 is a perspective view of the part unit including a heat radiation board, electric elements, the terminal module, and a frame.
Figure 66:
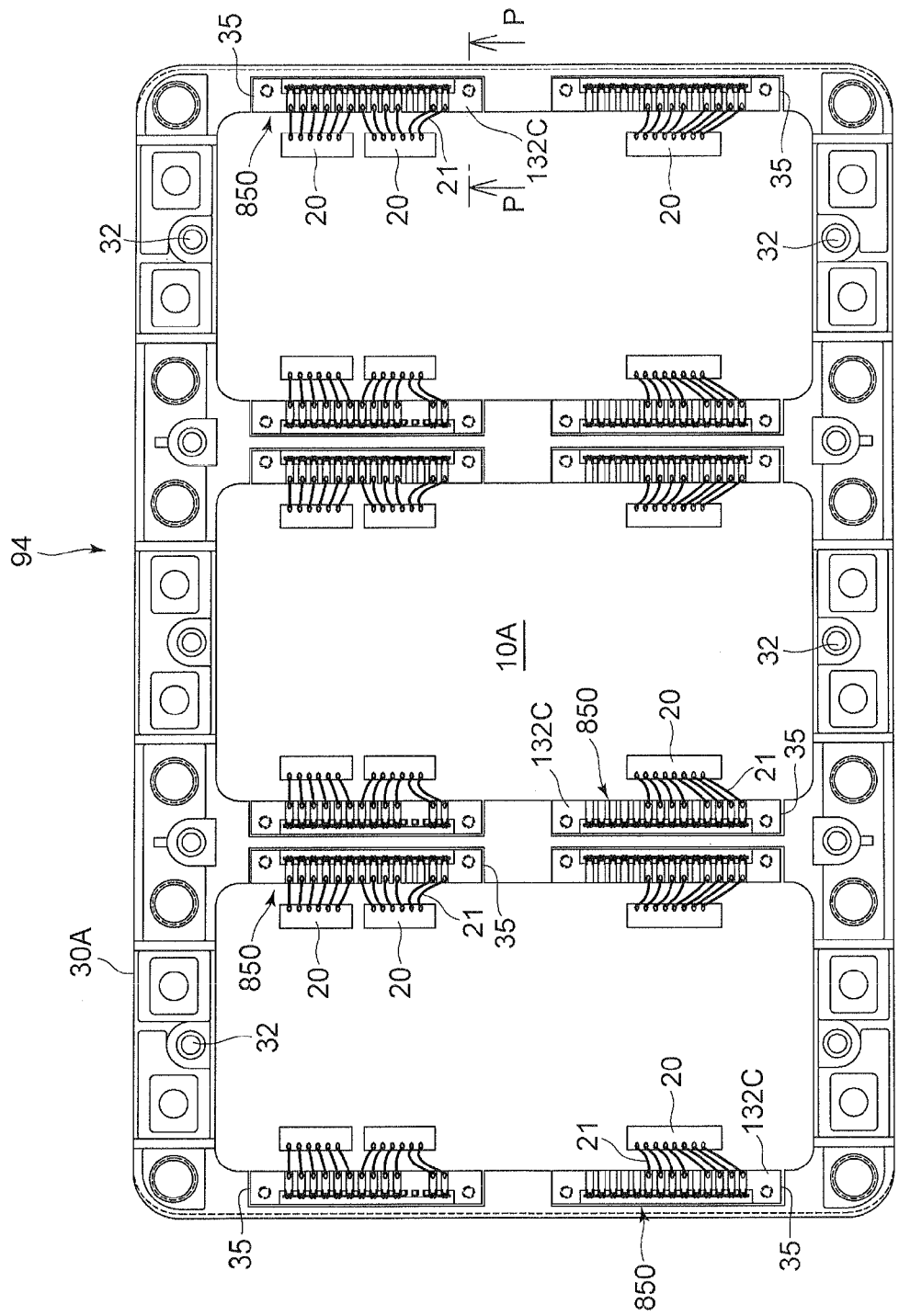
FIG. 66 is a plan view as seen in a direction W indicated in FIG. 65.

As illustrated in FIGS. 62 and 63, the frame 30 is fixed onto the heat radiation board 10A illustrated in FIG. 63 by means of an adhesive, resulting in that there is completed a part unit 94 illustrated in FIGS. 65 and 66.

Figure 64:
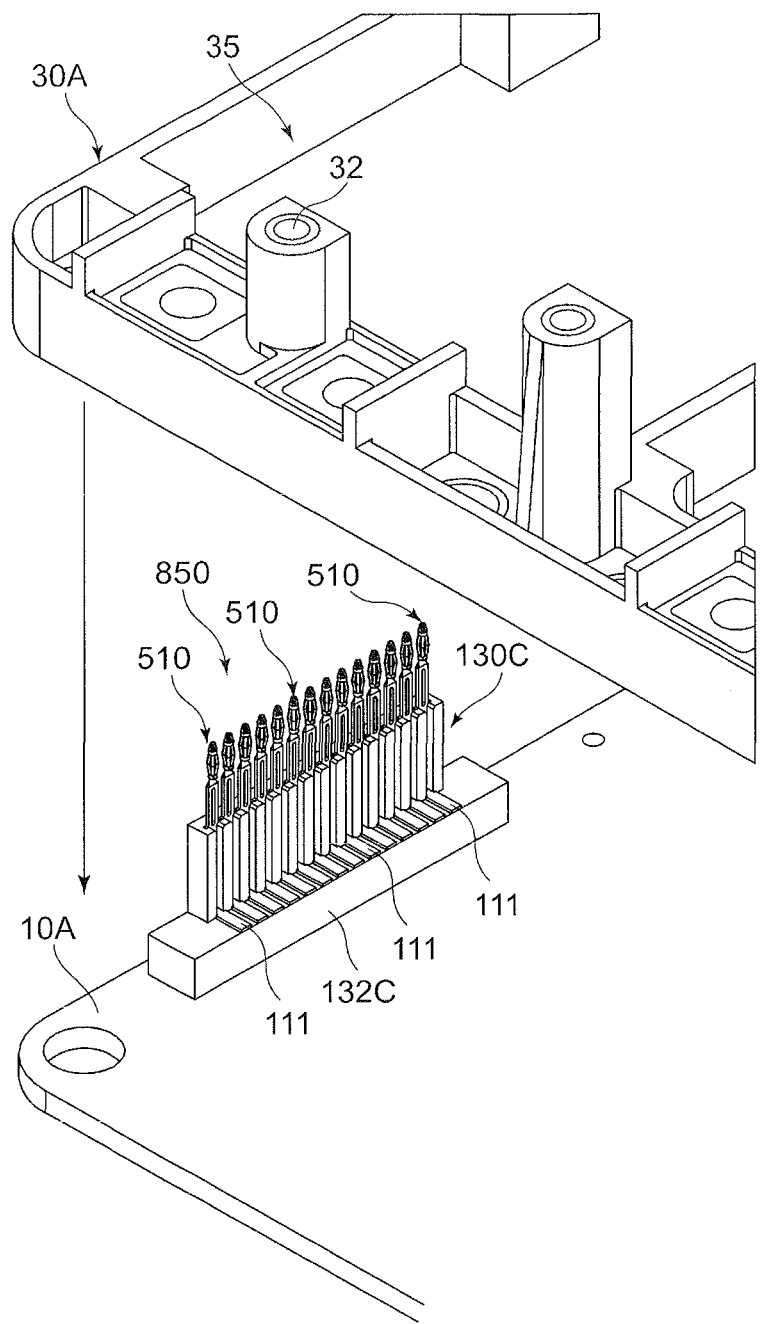
FIG. 64 is a partial perspective view showing a step of assembling a frame to a heat radiation board on which the terminal module has been mounted.

As illustrated in FIG. 64, a frame 30A is formed with a recess 35 for positioning the terminal module 850. The basement portion 132C of the terminal module 850 is fit-able into the recess 35. Thus, as illustrated in FIGS. 65 and 66, when the frame 30A is fixed onto the heat radiation board 10A, the basement portion 132C and the frame 30A are on the same level, that is, on the heat radiation board 10A.

The terminal modules 100, 200, 300, 400, 500, 600, 700, 800 and 850 having been explained with reference to FIGS. 1 to 67 are just examples of the present invention. The scope of the terminal module according to the present invention is not to be limited to the terminal modules 100, 200, 300, 400, 500, 600, 700, 800 and 850.

INDUSTRIAL APPLICABILITY

The terminal module according to the present invention can be employed broadly in fields such as an automobile industry and an electric/electronic device industry, as a part of a power module such as an engine control unit (ECU) and a power control unit (PCU).

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2014-247175 filed on Dec. 5, 2014 including specification, claims, drawings and summary is incorporated herein by reference in its entirety.

What is claimed is:

1. A terminal module for electrically connecting an electric element mounted on a first board to a second board opposing to the first board, a through-hole being opened in the second board, the terminal module comprising:
  an electrically conductive terminal including at each of opposite ends thereof:
  a connection part through which the terminal module is electrically connected to the electric element; and
  a contact part to be inserted into the through-hole; and
  an electrically insulative base holding a part of the electrically conductive terminal to keep the electrically conductive terminal in a constant posture,
  wherein the terminal module is mounted onto the first board keeping fixed thereto, the electrically conductive terminal further includes a flexible part located adjacent to the contact part, the flexible part being more elastically deformable than other portions of the electrically conductive terminal,
the flexible part includes:
a first flexible piece extending in a length-wise direction of the electrically conductive terminal; and
a second flexible piece spaced away from the first flexible piece through a through-hole,
the second flexible piece extending in parallel with the first flexible piece,
the first and second flexible pieces being equal in length to each other.

2. The terminal module as defined in claim 1, wherein the terminal module is mounted directly onto the first board.

3. The terminal module as defined in claim 1, further comprising a frame formed integrally with the first board, wherein the terminal module is mounted onto the first board via the frame.

4. The terminal module as defined in claim 1, wherein at least a part of the contact part is constituted of a press-fit terminal elastically expanding/contracting in a radial direction of the through-hole.

5. The terminal module as defined in claim 4, wherein the press-fit terminal is further constituted of a plurality of contact pieces elastically expanding/contracting in a radial direction of the through-hole.

6. The terminal module as defined in claim 1, wherein:
the contact part includes:
a first piece bending such that the first piece outwardly protrudes in a first direction; and
a second piece bending such that the second piece outwardly protrudes in a second direction opposite to the first direction,
the first and second pieces are elastic and connected at opposite ends thereof to each other.

7. The terminal module as defined in claim 1, wherein the electrically conductive terminal is fixed onto the base.

8. A terminal module for electrically connecting an electric element mounted on a first board to a second board opposing to the first board, a through-hole being opened in the second board, the terminal module comprising:
an electrically conductive terminal including at each of opposite ends thereof:
a connection part through which the terminal module is electrically connected to the electric element;
a contact part to be inserted into the through-hole; and
an electrically insulative base holding a part of the electrically conductive terminal to keep the electrically conductive terminal in a constant posture,
wherein the terminal module is mounted onto the first board keeping fixed thereto,
the electrically conductive terminal further includes a flexible part located adjacent to the contact part,
the flexible part being more elastically deformable than other portions of the electrically conductive terminal,
the flexible part including a plurality of flexible pieces being equally spaced away from one another around a longitudinal central axis of the terminal module, the flexible pieces each being in the shape of a square pole.

* * * * *